US 8,717,533 B2

(12) United States Patent
Nagasaka et al.

(10) Patent No.: US 8,717,533 B2
(45) Date of Patent: *May 6, 2014

(54) EXPOSURE APPARATUS, EXPOSURE METHOD, AND METHOD FOR PRODUCING DEVICE

(75) Inventors: Hiroyuki Nagasaka, Kumagaya (JP); Takeshi Okuyama, Yokohama (JP)

(73) Assignees: Nikon Corporation, Tokyo (JP); Nikon Engineering Co., Ltd., Yokohama-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/802,060

(22) Filed: May 18, 2007

(65) Prior Publication Data

US 2007/0222957 A1    Sep. 27, 2007

Related U.S. Application Data

(62) Division of application No. 11/597,745, filed as application No. PCT/JP2005/010576 on Jun. 9, 2005.

(30) Foreign Application Priority Data

| Jun. 10, 2004 | (JP) | 2004-172569 |
| Aug. 25, 2004 | (JP) | 2004-245260 |
| Nov. 15, 2004 | (JP) | 2004-330582 |

(51) Int. Cl.
 *G03B 27/42* (2006.01)
 *G03B 27/52* (2006.01)
(52) U.S. Cl.
 USPC ............................................. 355/53; 355/30

(58) Field of Classification Search
 USPC ......... 355/53, 67, 71, 77, 30; 250/492.1, 548; 378/34, 35
 See application file for complete search history.

(56) References Cited

U.S. PATENT DOCUMENTS

| 3,314,219 | A | 4/1967 | Griffin III et al. |
| 3,675,395 | A | 7/1972 | Baranowski |
| 4,315,760 | A | 2/1982 | bij de Leij |
| 4,346,164 | A | 8/1982 | Tabarelli et al. |
| 4,466,253 | A | 8/1984 | Jaster |
| 4,480,910 | A | 11/1984 | Takanashi et al. |
| 4,696,684 | A | 9/1987 | Shen |
| 4,704,140 | A | 11/1987 | Kujala |
| 4,730,634 | A | 3/1988 | Russell |

(Continued)

FOREIGN PATENT DOCUMENTS

| CN | 1501173 A | 6/2004 |
| DE | A-221563 | 4/1985 |

(Continued)

OTHER PUBLICATIONS

Oct. 4, 2005 International Search Report from PCT/JP2005/010576.

(Continued)

*Primary Examiner* — Peter B Kim
(74) *Attorney, Agent, or Firm* — Oliff PLC

(57) ABSTRACT

A lithographic projection projects a pattern from a patterning device onto a substrate through a liquid confined to a space adjacent the substrate. The space is smaller in plan than the substrate. The apparatus includes a plate substantially parallel to the substrate to divide the space into two parts, the plate having an aperture to allow transmission of the pattern onto the substrate.

13 Claims, 27 Drawing Sheets

(56) References Cited

U.S. PATENT DOCUMENTS

| | | | |
|---|---|---|---|
| 5,312,552 A | 5/1994 | Norman | |
| 5,528,118 A | 6/1996 | Lee | |
| 5,545,072 A * | 8/1996 | Arad et al. | 446/268 |
| 5,610,683 A | 3/1997 | Takahashi | |
| 5,623,853 A | 4/1997 | Novak et al. | |
| 5,715,039 A | 2/1998 | Fukuda et al. | |
| 5,825,043 A | 10/1998 | Suwa | |
| 5,874,820 A | 2/1999 | Lee | |
| 5,969,441 A | 10/1999 | Loopstra et al. | |
| 6,208,407 B1 | 3/2001 | Loopstra | |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,674,510 B1 | 1/2004 | Jasper et al. | |
| 6,716,268 B2 | 4/2004 | Molyneux et al. | |
| 6,778,257 B2 | 8/2004 | Bleeker et al. | |
| 6,809,794 B1 * | 10/2004 | Sewell | 355/30 |
| 6,867,844 B2 | 3/2005 | Vogel et al. | |
| 6,980,277 B2 | 12/2005 | Sewell | |
| 7,053,983 B2 | 5/2006 | Tokita | |
| 7,125,438 B2 | 10/2006 | Skoglund et al. | |
| 7,292,313 B2 | 11/2007 | Poon et al. | |
| 7,589,821 B2 | 9/2009 | Hirukawa | |
| 2002/0020821 A1 | 2/2002 | Van Santen et al. | |
| 2004/0075895 A1 | 4/2004 | Lin | |
| 2004/0114117 A1 * | 6/2004 | Bleeker | 355/53 |
| 2004/0136494 A1 | 7/2004 | Lof et al. | |
| 2004/0154641 A1 | 8/2004 | Montierth | |
| 2004/0160582 A1 * | 8/2004 | Lof et al. | 355/30 |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2005/0007569 A1 | 1/2005 | Streefkerk et al. | |
| 2005/0048692 A1 * | 3/2005 | Hanada et al. | 438/106 |
| 2005/0073670 A1 | 4/2005 | Carroll | |
| 2005/0219488 A1 | 10/2005 | Nei et al. | |
| 2005/0225734 A1 | 10/2005 | De Smit et al. | |
| 2005/0237501 A1 | 10/2005 | Furukawa et al. | |
| 2005/0259234 A1 | 11/2005 | Hirukawa et al. | |
| 2005/0263068 A1 | 12/2005 | Hoogendam et al. | |
| 2005/0264778 A1 | 12/2005 | Lof et al. | |
| 2005/0280791 A1 | 12/2005 | Nagasaka et al. | |
| 2005/0282405 A1 | 12/2005 | Harpham et al. | |
| 2005/0286030 A1 * | 12/2005 | Shih et al. | 355/30 |
| 2006/0038968 A1 | 2/2006 | Kemper et al. | |
| 2006/0082746 A1 | 4/2006 | Mertens et al. | |
| 2006/0103817 A1 | 5/2006 | Ten Kate et al. | |
| 2006/0119807 A1 * | 6/2006 | Baselmans et al. | 355/30 |
| 2006/0158628 A1 | 7/2006 | Maria Liebregts et al. | |
| 2006/0176456 A1 | 8/2006 | Nagasaka et al. | |
| 2006/0231206 A1 | 10/2006 | Nagasaka et al. | |
| 2007/0146663 A1 | 6/2007 | Nagasaka | |
| 2008/0018866 A1 | 1/2008 | Nagasaka et al. | |
| 2009/0086181 A1 | 4/2009 | Donders et al. | |

FOREIGN PATENT DOCUMENTS

| | | |
|---|---|---|
| DE | A1-224448 | 7/1985 |
| EP | 1 420 298 A2 | 5/2004 |
| EP | 1 420 299 A2 | 5/2004 |
| EP | 1-486-827 A2 | 12/2004 |
| EP | 1-489-462 A2 | 12/2004 |
| EP | 1-491-957 A2 | 12/2004 |
| EP | 1-528-433 A2 | 5/2005 |
| EP | 1 571 695 A1 | 9/2005 |
| EP | 1 571 697 A1 | 9/2005 |
| EP | 1 598 855 A1 | 11/2005 |
| EP | 1 646 075 A1 | 4/2006 |
| EP | 1 653 501 A1 | 5/2006 |
| EP | 1 703 548 A1 | 9/2006 |
| EP | 1 753 016 A1 | 2/2007 |
| EP | 1 768 169 A1 | 3/2007 |
| JP | A-58-202448 | 11/1983 |
| JP | A-59-019912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-062877 | 3/1993 |
| JP | A-6-53120 | 2/1994 |
| JP | A-6-124873 | 5/1994 |
| JP | A-6-188169 | 7/1994 |
| JP | A-7-220990 | 8/1995 |
| JP | A-8-166475 | 6/1996 |
| JP | A-8-316125 | 11/1996 |
| JP | A-8-330224 | 12/1996 |
| JP | A-10-163099 | 6/1998 |
| JP | A-10-214783 | 8/1998 |
| JP | A-10-303114 | 11/1998 |
| JP | A-10-340846 | 12/1998 |
| JP | A-11-135400 | 5/1999 |
| JP | 11-176727 | 7/1999 |
| JP | A-2000-58436 | 2/2000 |
| JP | A-2000-505958 | 5/2000 |
| JP | A-2004-320016 | 11/2004 |
| JP | A-2004-320017 | 11/2004 |
| JP | A-2005-005713 | 1/2005 |
| JP | A-2005-12228 | 1/2005 |
| JP | A-2005-020013 | 1/2005 |
| JP | 2005-175176 | 6/2005 |
| JP | A-2005-167211 | 6/2005 |
| JP | A-2005-175176 | 6/2005 |
| TW | 200502720 | 1/2005 |
| WO | WO 98/28665 | 7/1998 |
| WO | WO-99/49504 | 9/1999 |
| WO | WO 01/35168 A1 | 5/2001 |
| WO | WO-A2-2004/019128 | 3/2004 |
| WO | WO 2004/053953 A1 | 6/2004 |
| WO | WO 2004/053955 A1 | 6/2004 |
| WO | WO 2004/055803 A1 | 7/2004 |
| WO | WO 2004/057589 A1 | 7/2004 |
| WO | WO 2004/086468 A1 | 10/2004 |
| WO | WO 2004/090634 A2 | 10/2004 |
| WO | WO 2004/092833 A2 | 12/2004 |
| WO | WO 2005/006415 A1 | 1/2005 |
| WO | WO 2005/024517 A2 | 3/2005 |
| WO | WO 2005/029559 A1 | 3/2005 |
| WO | WO 2005/067013 A1 | 7/2005 |
| WO | WO 2005/104195 A1 | 11/2005 |
| WO | WO 2005/111722 A2 | 11/2005 |
| WO | WO 2004/057590 A1 | 7/2007 |

OTHER PUBLICATIONS

First Official Letter issued in Chinese Application No. 200580015635.8 (and English translation).
Second Official Letter issued in Chinese Application No. 200580015638.8 (and English translation).
Feb. 4, 2010 Office Action in U.S. Appl. No. 11/785,722.
Nov. 12, 2009 Office Action in U.S. Appl. No. 11/597,745.
Oct. 1, 2008 Office Action in U.S. Appl. No. 11/642,626.
Apr. 17, 2008 Office Action in U.S. Appl. No. 11/785,722.
Oct. 14, 2008 Office Action in U.S. Appl. No. 11/785,722.
Jul. 14, 2009 Office Action in U.S. Appl. No. 11/785,722.
Jul. 22, 2010 Office Action issued in U.S. Appl. No. 11/597,745.
Oct. 25, 2010 Office Action issued in U.S. Appl. No. 11/785,722.
May 26, 2011 Office Action issued in U.S. Appl. No. 11/785,722.
Apr. 1, 2011 Office Action issued in U.S. Appl. No. 11/597,745.
Feb. 15, 2011 Office Action issued in U.S. Appl. No. 11/878,075.
Dec. 13, 2011 Office Action issued in U.S. Appl. No. 11/597,745.
Jan. 6, 2012 Office Action issued in U.S. Appl. No. 11/878,075.
Jun. 19, 2012 Office Action cited in Korean Patent Application No. 2012-7006833 (with translation).
Jul. 18, 2012 Office Action issued in U.S. Appl. No. 11/597,745.
Oct. 19, 2012 Office Action issued in U.S. Appl. No. 12/662,171.
Final Office Action issued Sep. 10, 2012 in U.S. Appl. No. 11/878,075.
Nov. 6, 2012 Office Action issued in Japanese Patent Application No. 2010-087342 (with translation).

(56) References Cited

OTHER PUBLICATIONS

Aug. 21, 2013 Search Report issued in European Patent Application No. 13153430.7.
Aug. 29, 2013 Search Report issued in European Patent Application No. 13153431.5.
Aug. 30, 2013 Office Action issued in European Patent Application No. 05748898.3.
May 18, 2010 Supplementary European Search Report issued in European Patent Application No. 05748898.3.
Mar. 13, 2009 Examination Report issued in Singapore Patent Application No. 200608453-7.
Jun. 30, 2008 Written Opinion issued in Singapore Patent Application No. 200608453-7.
Mar. 19, 2012 Search and Examination Report issued in Singapore Patent Application No. 200905998-1.
Oct. 4, 2005 Written Opinion issued in International Patent Application No. PCT/JP2005/010576 (with translation).
Feb. 2, 2010 Office Action issued in Japanese Patent Application No. 2005-169549 (with translation).
May 6, 2010 Notice of Allowance issued in Japanese Patent Application No. 2005-169549 (with translation).
Feb. 11, 2011 Office Action issued in Chinese Patent Application No. 2009-10163695.4 (with translation).
Jan. 24, 2011 Office Action issued in European Patent Application No. 05748898.3.
Aug. 24, 2010 Office Action issued in Israeli Patent Application No. 179787 (with translation).
Sep. 15, 2011 Office Action issued in Korean Patent Application No. Oct. 2006-7022688 (with translation).
May 24, 2010 Office Action issued in U.S. Appl. No. 11/878,075.
May 7, 2013 Office Action issued in Indian Patent Application No. 3821/KOLNP/2006.
Feb. 27, 2013 Office Action issued in Taiwanese Patent Application No. 094119279 w/translation.
Mar. 5, 2013 Office Action issued in Japanese Patent Application No. 2010-087342 w/translation.
May 24, 2013 Office Action issued in U.S. Appl. No. 12/662,171.

\* cited by examiner

Fig. 7
(a)
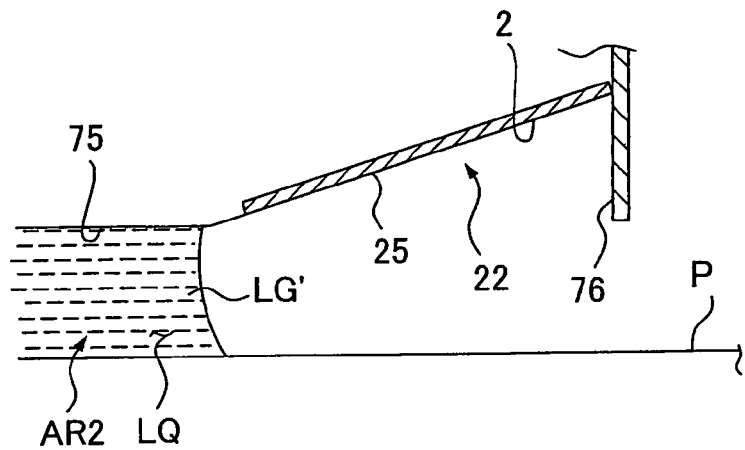
(b)
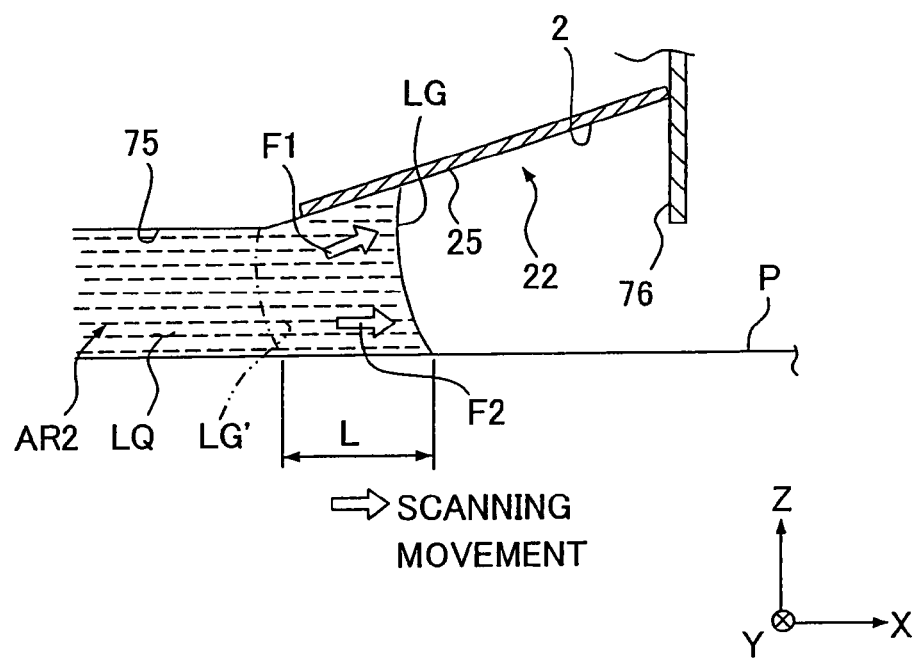

Fig. 8
(a)
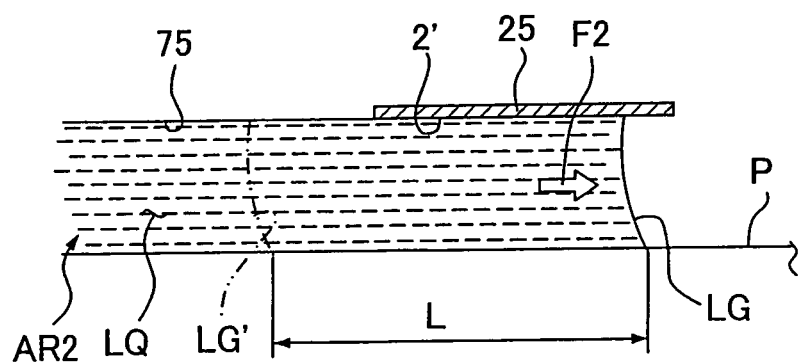
(b)
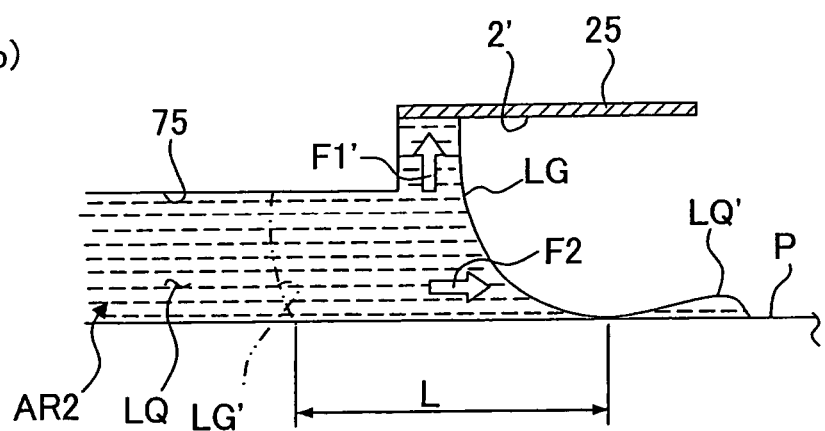
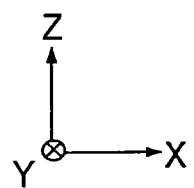

EXPOSURE APPARATUS, EXPOSURE METHOD, AND METHOD FOR PRODUCING DEVICE

This is a Division of U.S. patent application Ser. No. 11/597,745, which is the U.S. National Stage of PCT/JP2005/010576 filed Jun. 9, 2005. The disclosure of each of the prior applications is hereby incorporated by reference herein in its entirety.

TECHNICAL FIELD

The present invention relates to an exposure apparatus and an exposure method in which a substrate is exposed through a liquid, and a method for producing a device.

BACKGROUND ART

Semiconductor devices and liquid crystal display devices are produced by the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the focus margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

As disclosed in International Publication No. 99/49504 as described above, a scanning type exposure apparatus is known, in which the substrate is exposed with a pattern formed on the mask while synchronously moving the mask and the substrate in the scanning direction. In the case of the scanning type exposure apparatus, it is required to realize the high scanning velocity (velocity of scanning) in order to improve, for example, the productivity of device production. However, if the scanning velocity is increased to be high, then it is difficult to maintain the desired state, for example, for the condition (for example, the size) of the liquid immersion area, and the exposure accuracy and the measurement accuracy, which are to be obtained through the liquid, are consequently deteriorated. Therefore, it is required that the liquid immersion area of the liquid is maintained to be in the desired state even when the scanning velocity is increased to be high.

For example, if the liquid immersion area cannot be maintained in the desired state, and any bubble and/or any void (gap) is formed in the liquid, then the exposure light beam, which passes through the liquid, does not arrive at the surface of the substrate satisfactorily due to the bubble and/or the void, and an inconvenience arises, for example, such that any defect appears in the pattern to be formed on the substrate. When the liquid immersion area is locally formed on a part of the substrate while supplying and recovering the liquid, there is such a possibility that it is difficult to sufficiently recover the liquid of the liquid immersion area as the scanning velocity is increased to be high. If the liquid cannot be recovered sufficiently, the adhesion trace (so-called water mark, the adhesion trace of the liquid will be hereinafter referred to as "water mark" as well when the liquid is not water) is formed, for example, due to the vaporization or evaporation of the liquid remaining on the substrate. There is such a possibility that the water mark exerts any influence on the photoresist on the substrate, and there is such a possibility that the performance of the device to be produced is deteriorated by the influence. There is also such a possibility that it is difficult that the liquid immersion area is maintained to have a desired size as the scanning velocity is increased to be high. There is also such a possibility that the liquid of the liquid immersion area outflows as the scanning velocity is increased to be high.

DISCLOSURE OF THE INVENTION

Problem to be Solved by the Invention:

The present invention has been made taking the foregoing circumstances into consideration, an object of which is to provide an exposure apparatus, an exposure method, and a method for producing a device based on the use of the exposure apparatus, wherein the exposure process can be performed satisfactorily while maintaining the liquid immersion area to be in a desired state.

Means for Solving the Problem and Effect of the Invention:

In order to achieve the object as described above, the present invention adopts the following constructions.

According to a first aspect of the present invention, there is provided an exposure apparatus which exposes a substrate by radiating an exposure light beam onto the substrate through a liquid; the exposure apparatus comprising a projection optical system; and a liquid immersion mechanism which supplies the liquid and which recovers the liquid; wherein the liquid immersion mechanism has an inclined surface which is opposite to a surface of the substrate and which is inclined with respect to the surface of the substrate, and a liquid recovery port of the liquid immersion mechanism is formed on the inclined surface.

According to the first aspect of the present invention, the liquid recovery port of the liquid immersion mechanism is formed on the inclined surface which is opposed to the surface of the substrate. Therefore, even when the substrate and the liquid immersion area formed on the side of the image plane of the projection optical system are relatively moved, it is possible to suppress any large change of the shape of the interface as well, while suppressing the amount of movement of the interface (gas-liquid interface) between the liquid of the liquid immersion area and the space disposed at the outside thereof. Therefore, it is possible to maintain a desired state for the condition (for example, the size) of the liquid immersion area. Further, it is possible to suppress the spread or expansion of the liquid immersion area.

According to a second aspect of the present invention, there is provided an exposure apparatus which exposes a substrate by radiating an exposure light beam onto the substrate through a liquid; the exposure apparatus comprising a projection optical system; and a liquid immersion mechanism which supplies the liquid and which recovers the liquid; wherein the liquid immersion mechanism has a flat portion which is formed opposite to a surface of the substrate and which is formed to be substantially in parallel to the surface of the substrate; the flat portion of the liquid immersion mechanism is arranged to surround a projection area onto which the exposure light beam is radiated, between the substrate and an end surface on a side of an image plane of the projection optical system; and a liquid supply port of the liquid immersion mechanism is arranged outside the flat portion with respect to the projection area onto which the exposure light beam is radiated.

According to the second aspect of the present invention, the small gap, which is formed between the substrate surface and the flat portion, can be formed in the vicinity of the projection area to surround the projection area. Therefore, it is possible to maintain the small liquid immersion area which is necessary and sufficient to cover the projection area. Additionally, the liquid, which forms the liquid immersion area, is prevented from the entrance and mixing of any gas into the liquid, because the liquid supply port is provided outside the flat portion. Thus, it is possible to continuously fill the optical path for the exposure light beam with the liquid.

According to a third aspect of the present invention, there is provided an exposure apparatus which exposes a substrate by radiating an exposure light beam onto the substrate through a liquid; the exposure apparatus comprising a projection optical system; and a liquid immersion mechanism which supplies the liquid and which recovers the liquid; wherein the liquid immersion mechanism includes a liquid supply port which is provided at a first position disposed outside an optical path space for the exposure light beam and which supplies the liquid; and a guide member which guides the liquid so that the liquid, supplied from the liquid supply port, flows toward a second position via the optical path space, the second position being different from the first position disposed outside the optical path space.

According to the third aspect of the present invention, the liquid, supplied from the liquid supply port provided at the first position disposed outside the optical path space for the exposure light beam, is allowed to flow, by the guide member, to the second position which is different from the first position as disposed outside the optical path space. Therefore, it is possible to suppress the occurrence of any inconvenience which would be otherwise caused, for example, such that any gas portion (bubble) is formed in the liquid with which the optical path space for the exposure light beam is filled. It is possible to maintain the desired state for the liquid.

According to a fourth aspect of the present invention, there is provided an exposure apparatus which exposes a substrate by radiating an exposure light beam onto the substrate through a liquid; the exposure apparatus comprising an optical system which has an end surface opposite to the substrate and through which the exposure light beam to be radiated onto the substrate passes; and a liquid immersion mechanism which supplies the liquid and which recovers the liquid; wherein the liquid immersion mechanism includes a plate member which is arranged opposite and in parallel to the substrate between the substrate and the end surface of the optical system and which has a flat surface arranged to surround an optical path for the exposure light beam; and the liquid is supplied, to a space between the plate member and the end surface of the optical system, from a supply port which is provided in the vicinity of the end surface of the optical system, and the liquid is recovered from a recovery port which is arranged opposite to the substrate at a position separated farther from the optical path for the exposure light beam than the flat surface of the plate member.

According to the exposure apparatus of the fourth aspect of the present invention, the minute gap is formed between the substrate and the flat surface of the plate member to surround the exposure light beam. Further, the recovery port for the liquid is arranged outside the flat surface. Therefore, the liquid immersion area, which is stable in a desired state, can be maintained on the substrate. Further, the liquid is supplied to the space between the plate member and the end surface of the optical system. Therefore, the bubble and the void (gap) are hardly formed in the liquid immersion area formed on the optical path for the exposure light beam.

According to a fifth aspect of the present invention, there is provided an exposure apparatus which exposes a substrate by radiating an exposure light beam onto the substrate through a liquid; the exposure apparatus comprising an optical member which has an end surface making contact with the liquid and through which the exposure light beam passes; and a liquid immersion mechanism which supplies the liquid and which recovers the liquid; wherein the liquid immersion mechanism includes a flat surface which is arranged opposite and in parallel to the substrate to surround an optical path for the exposure light beam, and an inclined surface which is inclined with respect to the flat surface and is disposed outside the flat surface with respect to the optical path for the exposure light beam.

According to the exposure apparatus of the fifth aspect of the present invention, the minute gap is formed between the substrate and the flat surface of the plate member to surround the exposure light beam. Therefore, the liquid immersion area, which is stable in a desired state, can be maintained on the substrate. Further, the inclined surface is formed outside the flat surface. Therefore, the liquid is suppressed from any spread, and it is possible to avoid, for example, any leakage of the liquid.

According to a sixth aspect of the present invention, there is provided an exposure method for exposing a substrate by radiating an exposure light beam onto the substrate via an optical member and a liquid; the exposure method comprising arranging the substrate so that the substrate is opposite to an end surface of the optical member; supplying the liquid to a space between the end surface of the optical member and one surface of a plate member arranged to surround an optical path for the exposure light beam between the substrate and the end surface of the optical member so as to fill, with the liquid, a space between the substrate and the end surface of the optical member and a space between the substrate and the other surface of the plate member; forming a liquid immersion area on a part of the substrate by recovering the liquid from a recovery port arranged opposite to the substrate concurrently with supply of the liquid; and exposing the substrate by radiating the exposure light beam onto the substrate through the liquid with which the liquid immersion area is formed on the part of the substrate.

According to the exposure method of the sixth aspect of the present invention, the minute gap is formed between the substrate and the flat surface of the plate member to surround the exposure light beam. Therefore, the desired liquid immersion area, which is stable, can be maintained on the substrate. Further, the liquid is supplied to the space between the plate member and the end surface of the optical member. Therefore, it is possible to suppress the formation of the bubble and the void in the liquid disposed in the optical path for the exposure light beam.

According to a seventh aspect of the present invention, there is provided a method for producing a device, comprising using the exposure apparatus as defined in any one of the aspects described above.

According to the seventh aspect of the present invention, the exposure process can be performed satisfactorily in a state in which the liquid immersion area of the liquid is maintained in a desired condition, even when the scanning velocity is increased to be high. Therefore, the device having the desired performance can be produced at a high production efficiency.

BRIEF DESCRIPTION OF THE DRAWINGS

FIGS. 7(a) and 7(b) schematically illustrate the liquid recovery operation according to the first embodiment.

FIGS. 8(a) and 8(b) schematically illustrate comparative examples of the liquid recovery operation.

LEGENDS OF REFERENCE NUMERALS

BEST MODE FOR CARRYING OUT THE INVENTION

Embodiments of the present invention will be explained below with reference to the drawings. However, the present invention is not limited thereto.

First Embodiment

Figure 1:
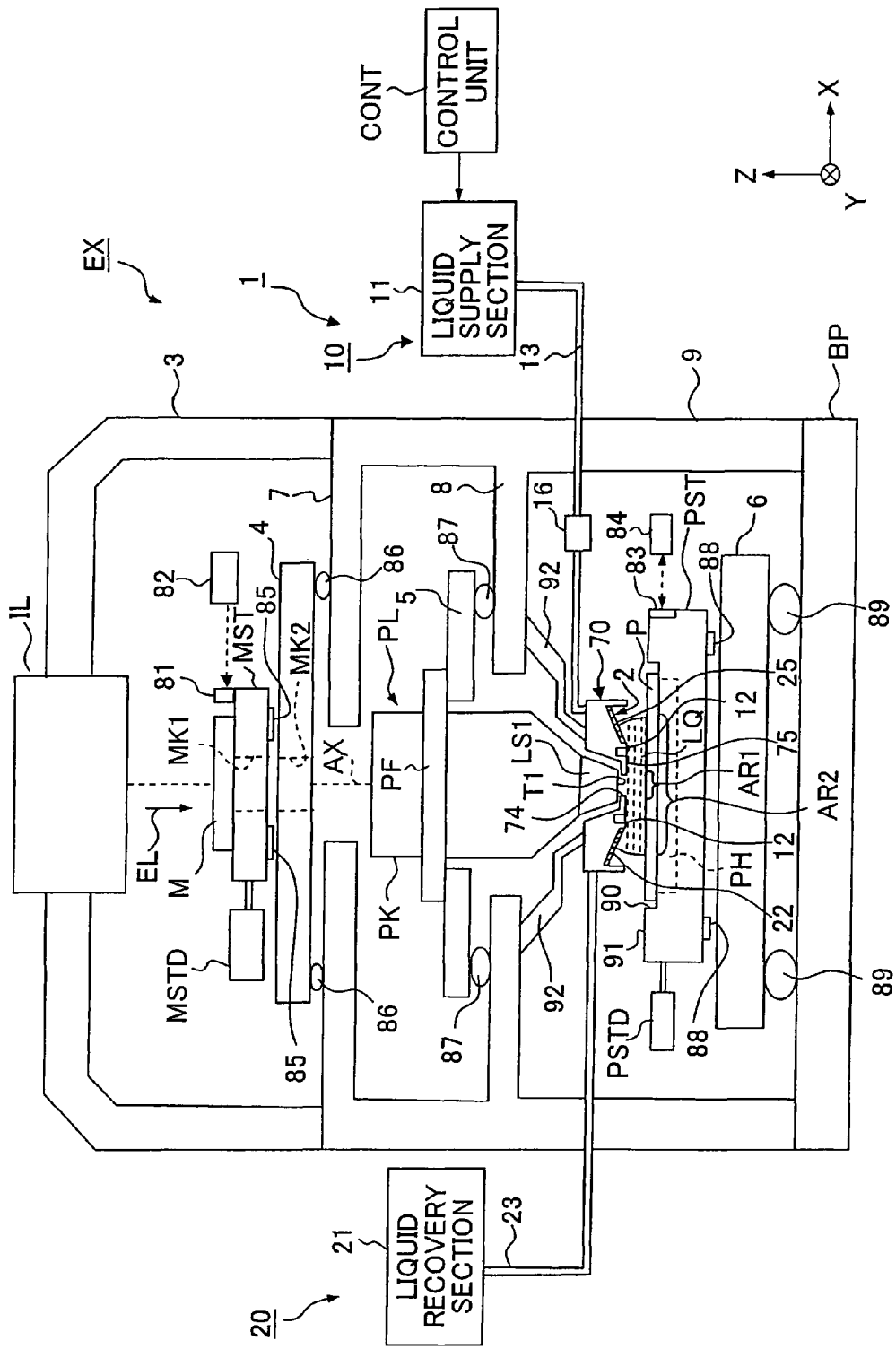
FIG. 1 shows a schematic arrangement illustrating a first embodiment of the exposure apparatus of the present invention.

FIG. 1 shows a schematic arrangement illustrating a first embodiment of the exposure apparatus according to the present invention. With reference to FIG. 1, the exposure apparatus EX includes a mask stage MST which is movable while holding a mask M, a substrate stage PST which is movable while holding a substrate P, an illumination optical system IL which illuminates, with an exposure light beam EL, the mask M held by the mask stage MST, a projection optical system PL which projects an image of a pattern of the mask M illuminated with the exposure light beam EL onto the substrate P held by the substrate stage PST to perform the exposure, and a control unit CONT which integrally controls the operation of the entire exposure apparatus EX.

The exposure apparatus EX of the embodiment of the present invention is the liquid immersion exposure apparatus in which the liquid immersion method is applied in order that the exposure wavelength is substantially shortened to improve the resolution and the depth of focus is substantially widened. The exposure apparatus EX includes a liquid immersion mechanism 1 which supplies the liquid LQ and which recovers the liquid LQ. The liquid immersion mechanism 1 includes a liquid supply mechanism 10 which supplies the liquid LQ to the side of the image plane of the projection optical system PL, and a liquid recovery mechanism 20 which recovers the liquid LQ supplied by the liquid supply mechanism 10. The exposure apparatus EX forms a liquid immersion area AR2 locally on at least a part of the substrate P including a projection area AR1 of the projection optical system PL by the liquid LQ supplied from the liquid supply mechanism 10 at least during the period in which the image of the pattern of the mask M is being transferred onto the substrate P, the liquid immersion area AR2 being larger than the projection area AR1 and smaller than the substrate P. Specifically, the exposure apparatus EX adopts the local liquid immersion system in which the space between an optical element LS1 disposed at the end portion on the side of the image plane of the projection optical system PL and the substrate P arranged on the side of the image plane is filled with the liquid LQ. The substrate P is subjected to the projection exposure with the pattern of the mask M by radiating the exposure light beam EL allowed to pass through the mask M, via the projection optical system PL and the liquid LQ disposed between the projection optical system PL and the substrate P. The control unit CONT forms the liquid immersion area AR2 of the liquid LQ locally on the substrate P by supplying a predetermined amount of the liquid LQ onto the substrate P by using the liquid supply mechanism 10 and recovering a predetermined amount of the liquid LQ disposed on the substrate P by using the liquid recovery mechanism 20.

A nozzle member 70 is arranged as described in detail later on, in the vicinity of the image plane of the projection optical system PL, specifically in the vicinity of the optical element LS1 disposed at the end on the side of the image plane of the projection optical system PL. The nozzle member 70 is an annular member which is provided to surround the optical element LS1 over or at a position above the substrate P (substrate stage PST). In the embodiment of the present invention, the nozzle member 70 constructs a part of the liquid immersion mechanism 1.

The embodiment of the present invention will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions (predetermined directions). In the following explanation, the Z axis direction is the direction which is coincident with the optical axis AX of the projection optical system PL, the X axis direction is the synchronous movement direction (scanning direction) for the mask M and the substrate P in the plane perpendicular to the Z axis direction, and the Y axis direction (non-scanning direction) is the direction which is perpendicular to the Z axis direction and the X axis direction. The directions of rotation (inclination) about the X axis, the Y axis, and the Z axis are designated as θX, θY, and θZ directions respectively.

The exposure apparatus EX includes a base BP which is provided on the floor surface, and a main column 9 which is installed on the base BP. The main column 9 is provided with an upper stepped portion 7 and a lower stepped portion 8 which protrude inwardly. The illumination optical system IL is provided so that the mask M, which is supported on the mask stage MST, is illuminated with the exposure light beam EL. The illumination optical system IL is supported by a support frame 3 which is fixed to an upper portion of the main column 9.

The illumination optical system IL includes, for example, an exposure light source, an optical integrator which uniformizes the illuminance of the light flux radiated from the exposure light source, a condenser lens which collects the exposure light beam EL emitted from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

In this embodiment, pure or purified water is used as the liquid LQ. Not only the ArF excimer laser but also the emission line (g-ray, h-ray, i-ray) radiated, for example, from a mercury lamp and the far ultraviolet light beam (DUV light beam) such as the KrF excimer laser beam (wavelength: 248 nm) are also transmissive through pure water.

The mask stage MST is movable while holding the mask M. The mask stage MST holds the mask M by the vacuum attraction (or the electrostatic attraction). A plurality of gas bearings (air bearings) 85, which are non-contact bearings, are provided on the lower surface of the mask stage MST. The mask stage MST is supported in a non-contact manner with respect to the upper surface (guide surface) of a mask surface plate 4 by the air bearings 85. Openings MK1, MK2, through which the image of the pattern of the mask M is allowed to pass, are formed at central portions of the mask stage MST and the mask surface plate 4 respectively. The mask surface plate 4 is supported by the upper stepped portion 7 of the main column 9 by the aid of an anti-vibration unit 86. That is, the mask stage MST is supported by the main column 9 (upper stepped portion 7) by the aid of the anti-vibration unit 86 and the mask surface plate 4. The mask surface plate 4 and the main column 9 are isolated from each other in terms of the vibration by the anti-vibration unit 86 so that the vibration of the main column 9 is not transmitted to the mask surface plate 4 which supports the mask stage MST.

The mask stage MST is two-dimensionally movable in the plane perpendicular to the optical axis AX of the projection optical system PL, i.e., in the XY plane, and it is finely rotatable in the θZ direction on the mask surface plate 4 in a state in which the mask M is held, in accordance with the driving operation of the mask stage-driving unit MSTD including, for example, a linear motor controlled by the control unit CONT. The mask stage MST is movable at a designated scanning velocity in the X axis direction. The mask stage MST has a movement stroke in the X axis direction to such an extent that the entire surface of the mask M traverses at least the optical axis AX of the projection optical system PL.

A movement mirror 81, which is movable together with the mask stage MST, is provided on the mask stage MST. A laser interferometer 82 is provided at a position opposed to the movement mirror 81. The position in the two-dimensional direction and the angle of rotation in the θZ direction (including angles of rotation in the θX and θY directions in some cases) of the mask M on the mask stage MST are measured in real-time by the laser interferometer 82. The result of the measurement of the laser interferometer 82 is outputted to the control unit CONT. The control unit CONT drives the mask stage-driving unit MSTD on the basis of the result of the measurement obtained by the laser interferometer 82 to thereby control the position of the mask M held by the mask stage MST.

The projection optical system PL projects the pattern of the mask M onto the substrate P at a predetermined projection magnification β to perform the exposure. The projection optical system PL includes a plurality of optical elements including the optical element LS1 provided at the end portion on the side of the substrate P. The optical elements are supported by a barrel PK. In this embodiment, the projection optical system PL is based on the reduction system in which the projection magnification β is, for example, ¼, ⅕, or ⅛. The projection optical system PL may be any one of the 1× magnification system and the magnifying system. The projection optical system PL may be any one of the catadioptric system including dioptric and catoptric elements, the dioptric system including no catoptric element, and the catoptric system including no dioptric element. The optical element LS1, which is disposed at the end portion of the projection optical system PL of this embodiment, is exposed from the barrel PK. The liquid LQ of the liquid immersion area AR2 makes contact with the optical element LS1.

A flange PF is provided on the outer circumference of the barrel PK which holds the projection optical system PL. The projection optical system PL is supported by a barrel surface plate 5 by the aid of the flange PF. The barrel surface plate 5 is supported by the lower stepped portion 8 of the main column 9 by the aid of an anti-vibration unit 87. That is, the projection optical system PL is supported by the main column 9 (lower stepped portion 8) by the aid of the anti-vibration unit 87 and the barrel surface plate 5. The barrel surface plate 5 is isolated from the main column 9 in terms of vibration by the anti-vibration unit 87 so that the vibration of the main column 9 is not transmitted to the barrel surface plate 5 which supports the projection optical system PL.

The substrate stage PST is movable while supporting the substrate holder PH which holds the substrate P. The substrate holder PH holds the substrate P, for example, by the vacuum attraction. A plurality of gas bearings (air bearings) 88, which are the non-contact bearings, are provided on the lower surface of the substrate stage PST. The substrate stage PST is supported in a non-contact manner by the air bearings 88 with respect to the upper surface (guide surface) of the substrate surface plate 6. The substrate surface plate 6 is supported on the base BP by the aid of an anti-vibration unit 89. The substrate surface plate 6 is isolated from the main column 9 and the base BP (floor surface) in terms of vibration by the anti-vibration unit 89 so that the vibrations of the base BP (floor surface) and the main column 9 are not transmitted to the substrate surface plate 6 which supports the substrate stage PST.

The substrate stage PST is two-dimensionally movable in the XY plane, and it is finely rotatable in the θZ direction on the substrate surface plate 6 in a state in which the substrate P is held by the aid of the substrate holder PH, in accordance with the driving operation of the substrate stage-driving unit PSTD including, for example, the linear motor which is controlled by the control unit CONT. Further, the substrate stage PST is also movable in the Z axis direction, the θX direction, and the θY direction.

A movement mirror 83, which is movable together with the substrate stage PST with respect to the projection optical system PL, is provided on the substrate stage PST. A laser interferometer 84 is provided at a position opposed to the movement mirror 83. The angle of rotation and the position in the two-dimensional direction of the substrate P on the substrate stage PST are measured in real-time by the laser interferometer 84. Although not shown, the exposure apparatus EX is provided with a focus/leveling-detecting system which detects the position information about the surface of the substrate P supported by the substrate stage PST. Those adoptable as the focus/leveling-detecting system include, for example, those based on the oblique incidence system in which the detecting light beam is radiated in an oblique direction onto the surface of the substrate P, and the system which uses an electrostatic capacity type sensor. The focus/leveling-detecting system detects the position information in the Z axis direction about the surface of the substrate P, and the information about the inclination in the θX and θY directions of the substrate P through the liquid LQ or not through the liquid LQ. In the case of the focus/leveling-detecting system in which the surface information about the surface of the substrate P is detected not through the liquid LQ, the surface information about the surface of the substrate P may be detected at a position separated or away from the projection optical system PL. An exposure apparatus, in which the surface information about the surface of the substrate P is detected at the position separated or away from the projection optical system PL, is disclosed, for example, U.S. Pat. No. 6,674,510, contents of which are incorporated herein by reference within a range of permission of the domestic laws and ordinances of the state designated or selected in this international application.

The result of the measurement performed by the laser interferometer 84 is outputted to the control unit CONT. The result of the measurement performed by the focus/leveling-detecting system is also outputted to the control unit CONT. The control unit CONT drives the substrate stage-driving unit PSTD on the basis of the detection result of the focus/leveling-detecting system to control the angle of inclination and the focus position of the substrate P so that the surface of the substrate P is adjusted to match the image plane of the projection optical system PL. Further, the control unit CONT controls the position of the substrate P in the X axis direction and the Y axis direction on the basis of the measurement result of the laser interferometer 84.

A recess 90 is provided on the substrate stage PST. The substrate holder PH for holding the substrate P is arranged in the recess 90. The upper surface 91 other than the recess 90 of the substrate stage PST forms a flat surface (flat portion) which has approximately the same height as that of (is flush with) the surface of the substrate P held by the substrate holder PH. Further, in this embodiment, the upper surface of the movement mirror 83 is also provided to be substantially flush with the upper surface 91 of the substrate stage PST.

The liquid immersion area AR2 can be satisfactorily formed while retaining the liquid LQ on the side of the image plane of the projection optical system PL, because the upper surface 91, which is substantially flush with the surface of the substrate P, is provided around the substrate P, and hence any difference in height is absent outside the edge portion of the substrate P, even when the edge area of the substrate P is subjected to the liquid immersion exposure. A gap of about 0.1 to 2 mm is formed between the edge portion of the substrate P and the flat surface (upper surface) 91 provided around the substrate P. However, the liquid LQ hardly flows into the gap owing to the surface tension of the liquid LQ. The liquid LQ can be retained under or below the projection optical system PL by the aid of the upper surface 91 even when the portion, which is disposed in the vicinity of the circumferential edge of the substrate P, is subjected to the exposure.

The liquid supply mechanism 10 of the liquid immersion mechanism 1 supplies the liquid LQ to the image plane side of the projection optical system PL. The liquid supply mechanism 10 includes a liquid supply section 11 which is capable of feeding the liquid LQ, and a supply tube 13 which has one end connected to the liquid supply section 11. The other end of the supply tube 13 is connected to the nozzle member 70. In this embodiment, the liquid supply mechanism 10 supplies pure water. The liquid supply section 11 includes, for example, a pure water-producing unit, and a temperature-adjusting unit which adjusts the temperature of the liquid (pure water) LQ to be supplied. On condition that a predetermined water quality condition is satisfied, a pure water-producing apparatus (utility power), which is provided in a factory for arranging the exposure apparatus EX therein, may be used instead of providing the pure water-producing unit for the exposure apparatus EX. Any equipment of the factory or the like may be substitutively used instead of providing the temperature-adjusting unit for adjusting the temperature of the liquid (pure water) LQ for the exposure apparatus EX as well. The operation of the liquid supply mechanism 10 (liquid supply section 11) is controlled by the control unit CONT. In order to form the liquid immersion area AR2 on the substrate P, the liquid supply mechanism 10 supplies a predetermined amount of the liquid LQ onto the substrate P arranged on the side of the image plane of the projection optical system PL under or below the control of the control unit CONT.

A flow rate controller 16 called "mass flow controller", which controls the amount of the liquid per unit time to be fed from the liquid supply section 11 and supplied to the image plane side of the projection optical system PL, is provided at an intermediate position of the supply tube 13. The control of the liquid supply amount based on the use of the flow rate controller 16 is performed under an instruction signal of the control unit CONT.

The liquid recovery mechanism 20 of the liquid immersion mechanism 1 is provided to recover the liquid LQ on the side of the image plane of the projection optical system PL. The liquid recovery mechanism 20 includes a liquid recovery section 21 which is capable of recovering the liquid LQ, and a recovery tube 23 which has one end connected to the liquid recovery section 21. The other end of the recovery tube 23 is connected to the nozzle member 70. The liquid recovery section 21 includes, for example, a vacuum system (suction unit) such as a vacuum pump, a gas/liquid separator for separating the gas and the recovered liquid LQ from each other, a tank for accommodating the recovered liquid LQ, and the like. It is also allowable to use, for example, the equipment of the factory in which the exposure apparatus EX is installed, instead of providing at least a part or parts of, for example, the vacuum system, the gas/liquid separator, the tank for the exposure apparatus EX, and the like. The operation of the liquid recovery mechanism 20 (liquid recovery section 21) is controlled by the control unit CONT. In order to form the liquid immersion area AR2 on the substrate P, the liquid recovery mechanism 20 recovers a predetermined amount of the liquid LQ on the substrate P supplied from the liquid supply mechanism 10 under the control of the control unit CONT.

The nozzle member 70 is held by a nozzle holder 92. The nozzle holder 92 is connected to the lower stepped portion 8 of the main column 9. The main column 9, which supports the nozzle member 70 by the aid of the nozzle holder 92, is isolated in terms of vibration by the anti-vibration unit 87 from the barrel surface plate 5 which supports the barrel PK of the projection optical system PL by the aid of the flange PF. Therefore, the vibration, which is generated on the nozzle member 70, is prevented from being transmitted to the projection optical system PL. The main column 9, which supports the nozzle member 70 by the aid of the nozzle holder 92, is isolated in terms of vibration by the anti-vibration unit 89 from the substrate surface plate 6 which supports the substrate stage PST. Therefore, the vibration, which is generated on the nozzle member 70, is prevented from being transmitted to the substrate stage PST via the main column 9 and the base BP. Further, the main column 9, which supports the nozzle member 70 by the aid of the nozzle holder 92, is isolated in terms of vibration by the anti-vibration unit 86 from the mask surface plate 4 which supports the mask stage MST. Therefore, the vibration, which is generated on the nozzle member 70, is prevented from being transmitted to the mask stage MST via the main column 9.

Figure 2:
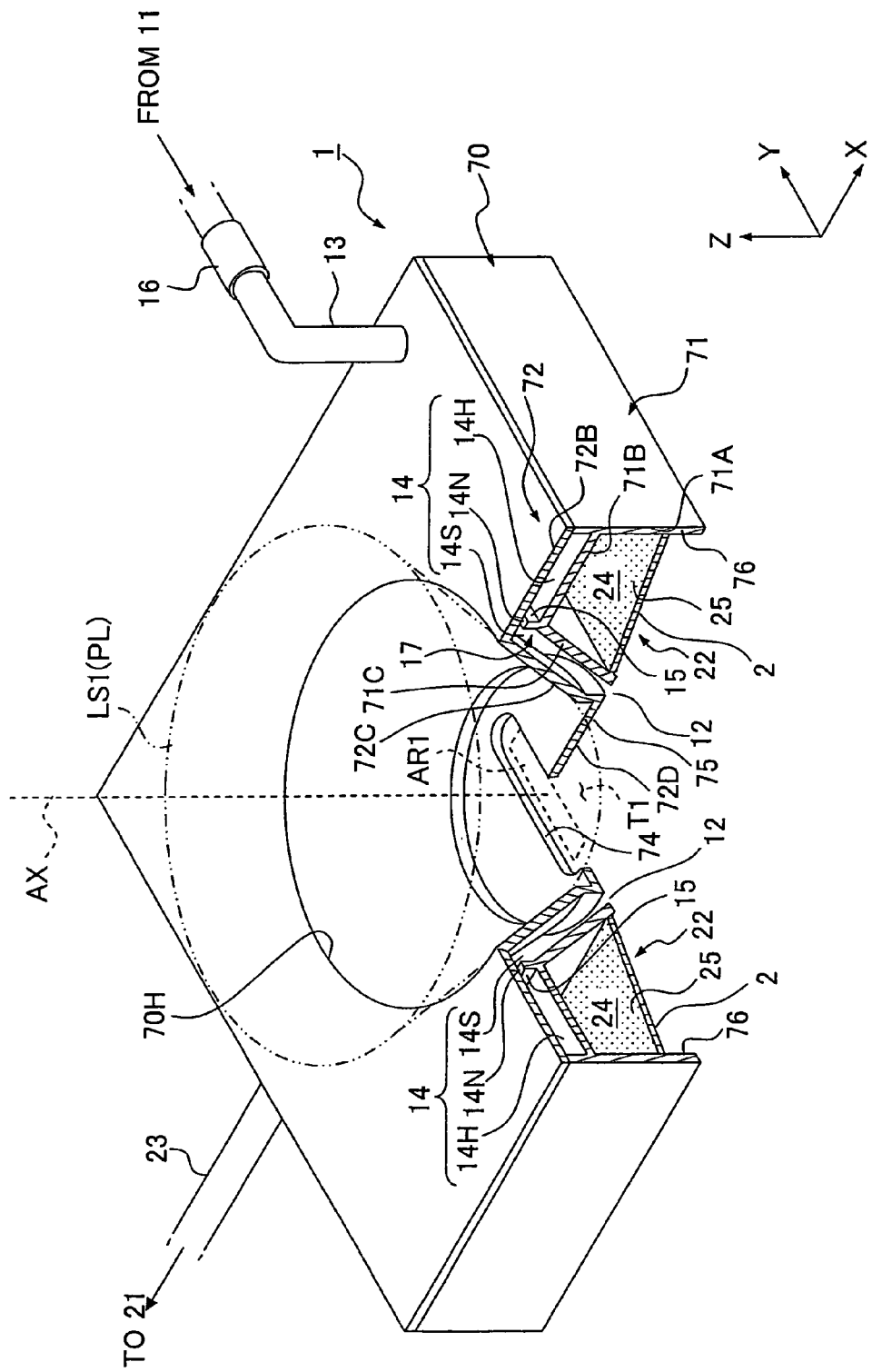
FIG. 2 shows a schematic perspective view illustrating those disposed in the vicinity of a nozzle member according to the first embodiment.
Figure 3:
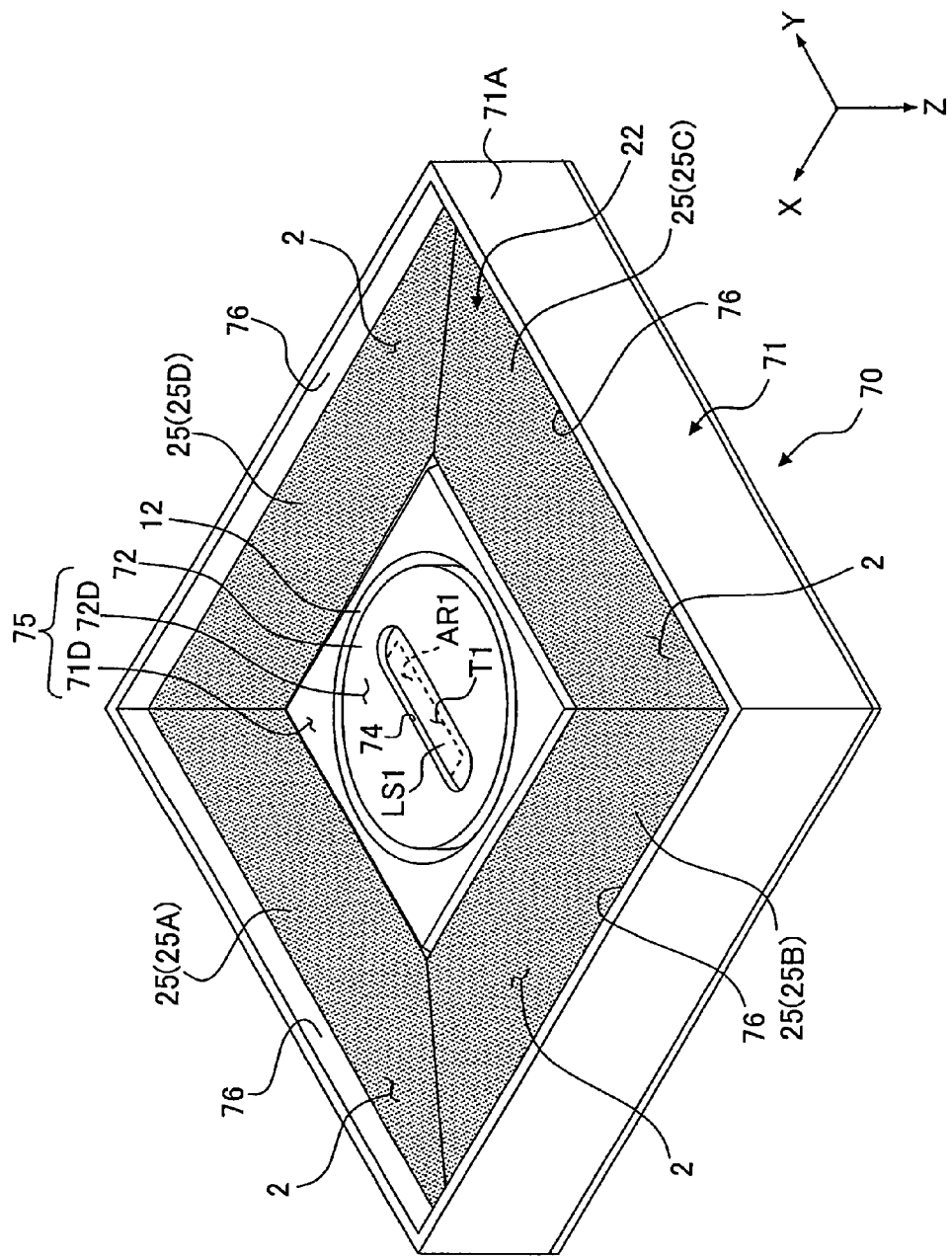
FIG. 3 shows a perspective view illustrating the nozzle member according to the first embodiment as viewed from the lower side.
Figure 4:
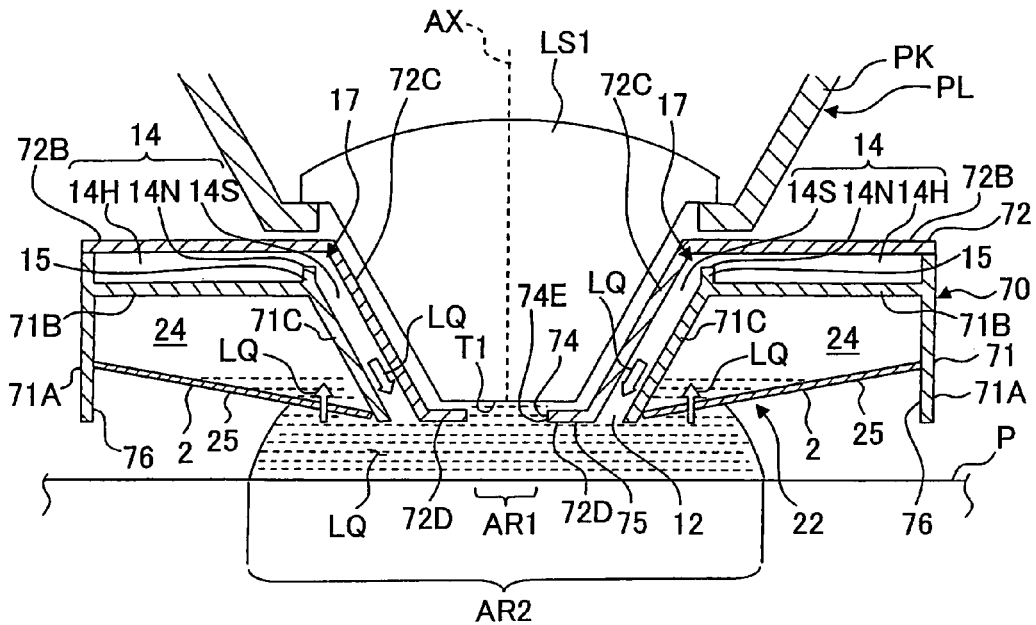
FIG. 4 shows a side sectional view illustrating those disposed in the vicinity of the nozzle member according to the first embodiment.

Next, an explanation will be made with reference to FIGS. 2, 3, and 4 about the liquid immersion mechanism 1 and the nozzle member 70 which constructs a part of the liquid immersion mechanism 1. FIG. 2 shows, with partially broken illustration, a schematic perspective view illustrating those disposed in the vicinity of the nozzle member 70. FIG. 3 shows a perspective view illustrating the nozzle member 70 as viewed from the lower side. FIG. 4 shows a side sectional view of the nozzle member 70.

The nozzle member 70 is arranged in the vicinity of the optical element LS1 disposed at the end portion on the side of the image plane of the projection optical system PL. The nozzle member 70 is the annular member which is provided to surround the optical element LS1 over or above the substrate P (substrate stage PST). The nozzle member 70 has a hole 70H which is disposed at a central portion thereof and in which the projection optical system PL (optical element LS1) can be arranged. A gap is provided between the inner side surface of the hole 70H of the nozzle member 70 and the side surface of the optical element LS1 of the projection optical system PL. The gap is formed in order that the optical element LS1 of the projection optical system PL is isolated in terms of vibration from the nozzle member 70. Accordingly, the vibration, which is generated on the nozzle member 70, is prevented from being directly transmitted to the projection optical system PL (optical element LS1).

The inner side surface of the hole 70H of the nozzle member 70 is liquid-repellent (water-repellent) with respect to the liquid LQ, which suppresses the inflow of the liquid LQ into the gap between the side surface of the projection optical system PL and the inner side surface of the nozzle member 70.

Those formed on the lower surface of the nozzle member 70 include a liquid supply port 12 for supplying the liquid LQ and a liquid recovery port 22 for recovering the liquid LQ. A supply flow passage 14 connected to the liquid supply port 12 and a recovery flow passage 24 connected to the liquid recovery port 22 are formed in the nozzle member 70. The other end of the supply tube 13 is connected to the supply flow passage 14, and the other end of the recovery tube 23 is connected to the recovery flow passage 24. The liquid supply port 12, the supply flow passage 14, and the supply tube 13 construct parts of the liquid supply mechanism 10. The liquid recovery port 22, the recovery flow passage 24, and the recovery tube 23 construct parts of the liquid recovery mechanism 20.

The liquid supply port 12 is provided opposite to the surface of the substrate P over the substrate P supported by the substrate stage PST. The liquid supply port 12 is separated from the surface of the substrate P by a predetermined distance. The liquid supply port 12 is arranged to surround the projection area AR1 of the projection optical system PL onto which the exposure light beam EL is radiated. In this embodiment, the liquid supply port 12 is formed to have an annular slit-shaped form on the lower surface of the nozzle member 70 so that the projection area AR1 is surrounded thereby. In this embodiment, the projection area AR1 is set to have a rectangular shape in which the Y axis direction (non-scanning direction) is the longitudinal direction.

The supply flow passage 14 includes a buffer flow passage portion 14H which has a part or portion connected to the other end of the supply tube 13, and an inclined flow passage portion 14S which has an upper end connected to the buffer flow passage portion 14H and which has a lower end connected to the liquid supply port 12. The inclined flow passage portion 14S has a shape corresponding to the liquid supply port 12. The inclined flow passage portion 14S has a cross section which is taken along the XY plane and which is formed to have an annular slit-shaped form to surround the optical element LS1. The inclined flow passage portion 14S has an angle of inclination corresponding to the side surface of the optical element LS1 arranged at the inside thereof. The inclined flow passage portion 14S is formed so that the distance from the surface of the substrate P is increased at positions separated farther from the optical axis AX of the projection optical system PL (optical element LS1) as viewed in a side sectional view.

The buffer flow passage portion 14H is provided outside the inclined flow passage portion 14S to surround the upper end of the inclined flow passage portion 14S. The buffer flow passage portion 14H is the space portion which is formed to expand in the XY direction (horizontal direction). The inner side of the buffer flow passage portion 14H (on the side of the optical axis AX) is connected to the upper end of the inclined flow passage portion 14S. A connecting portion therebetween forms a bent corner portion 17. A bank 15, which is formed to surround the upper end of the inclined flow passage portion 14S, is provided in the vicinity of the connecting portion (bent corner portion) 17, specifically in an area disposed at the inside of the buffer flow passage portion 14H (on the side of the optical axis AX). The bank 15 is provided to protrude in the +Z direction from the bottom surface of the buffer flow passage portion 14H. A narrow flow passage portion 14N, which is narrower than the buffer flow passage portion 14H, is formed by the bank 15.

In this embodiment, the nozzle member 70 is formed by combining a first member 71 and a second member 72. Each of the first and second members 71, 72 can be formed of, for example, aluminum, titanium, stainless steel, duralumin, or any alloy containing at least two of them.

The first member 71 includes a side plate portion 71A, a ceiling plate portion 71B which has an outer end connected to an upper predetermined position of the side plate portion 71A, an inclined plate portion 71C which has an upper end connected to an inner end of the ceiling plate portion 71B, and a bottom plate portion 71D which is connected to a lower end of the inclined plate portion 71C (see FIG. 3). The respective plate portions are joined to one another and formed as an integrated body. The second member 72 includes a ceiling plate portion 72B which has an outer end connected to an upper end of the first member 71, an inclined plate portion 72C which has an upper end connected to an inner end of the ceiling plate portion 72B, and a bottom plate portion 72D which is connected to a lower end of the inclined plate portion 72C. The respective plate portions are joined to one another and formed as an integrated body. The bottom surface of the buffer flow passage portion 14H is formed by the ceiling plate portion 71B of the first member 71. The ceiling surface of the buffer flow passage portion 14H is formed by the lower surface of the ceiling plate portion 72B of the second member 72. The bottom surface of the inclined flow passage portion 14S is formed by the upper surface (surface directed to the side of the optical element LS1) of the inclined plate portion 71C of the first member 71. The ceiling surface of the inclined flow passage portion 14S is formed by the lower surface (surface directed to the side opposite to the optical element LS1) of the inclined plate portion 72C of the second member 72. Each of the inclined plate portion 71C of the first member 71 and the inclined plate portion 72C of the second member 72 is formed to have a mortar-shaped form. The slit-shaped supply flow passage 14 is formed by combining the first and second members 71, 72. The outer side of the buffer flow passage portion 14H is closed by the upper area of the side plate portion 71A of the first member 71. The upper surface of the inclined plate portion 72C of the second member 72 is opposed to the side surface of the optical element LS1.

The liquid recovery port 22 is provided opposite to the surface of the substrate P over or above the substrate P supported by the substrate stage PST. The liquid recovery port 22 is separated from the surface of the substrate P by predetermined distances. The liquid recovery port 22 is provided outside the liquid supply port 12 with respect to the projection area AR1 of the projection optical system PL, while the liquid recovery port 22 is separated farther from the projection area AR1 than the liquid supply port 12. The liquid recovery port 22 is formed to surround the liquid supply port 12 and the projection area AR1. Specifically, a space 24, which is open downwardly, is formed by the side plate portion 71A, the ceiling plate portion 71B, and the inclined plate portion 71C of the first member 71. The liquid recovery port 22 is formed by the opening of the space 24. The recovery flow passage 24 is formed by the space 24. The other end of the recovery tube 23 is connected to a part of the recovery flow passage (space) 24.

A porous member 25, which has a plurality of holes, is arranged for the liquid recovery port 22 to cover the liquid recovery port 22 therewith. The porous member 25 is formed of a mesh member having a plurality of holes. The porous member 25 may be formed of, for example, a mesh member formed with a honeycomb pattern including a plurality of substantially hexagonal holes. The porous member 25 is formed to have a thin plate-shaped form. The porous member 25 has, for example, a thickness of about 100 μm.

The porous member 25 can be formed, for example, such that the punching or boring processing is performed for a plate member as a base material for the porous member made of, for example, stainless steel (for example, SUS 316). A plurality of thin plate-shaped porous members 25 may be arranged while being stuck in the liquid recovery port 22. It is also allowable to perform, for the porous member 25, a surface treatment to suppress the elution of any impurity to the liquid LQ or a surface treatment to enhance the liquid-attractive property. Such a surface treatment is exemplified by a treatment to adhere chromium oxide to the porous member 25, including, for example, the "GOLDEP" treatment or the "GOLDEP WHITE" treatment available from Kobelco Eco-Solutions Co., Ltd. When the surface treatment is performed as described above, it is possible to avoid the inconvenience which would be otherwise caused, for example, such that the impurity is eluted from the porous member 25 to the liquid LQ. The surface treatment as described above may be also performed for the nozzle member 70 (first and second members 71, 72). The porous member 25 may be formed of a material (for example, titanium) in which the impurity is scarcely eluted to the liquid LQ.

The nozzle member 70 is rectangular as viewed in a plan view. As shown in FIG. 3, the liquid recovery port 22 is formed to be frame-shaped (having a shape of " " (rectangle) or square frame-shaped) as viewed in a plan view to surround the projection area AR1 and the liquid supply port 12 on the lower surface of the nozzle member 70. The thin plate-shaped porous member 25 is arranged in the liquid recovery port 22. The bottom plate portion 71D of the first member 71 is arranged between the liquid recovery port 22 (porous members 25) and the liquid supply port 12. The liquid supply port 12 is formed to have an annular slit-shaped form as viewed in a plan view between the bottom plate portion 71D of the first member 71 and the bottom plate portion 72D of the second member 72.

Each of the surfaces (lower surfaces) of the bottom plate portions 71D, 72D of the nozzle member 70, which is opposed to the substrate P, is a flat surface which is parallel to the XY plane. That is, the nozzle member 70 is provided with the bottom plate portions 71D, 72D having the lower surfaces which are formed to be opposed to the surface of the substrate P (XY plane) supported by the substrate stage PST and which are formed to be substantially parallel to the surface of the substrate P. In this embodiment, the lower surface of the bottom plate portion 71D is substantially flush with the lower surface of the bottom plate portion 72D to form a portion at which the gap is the smallest with respect to the surface of the substrate P arranged on the substrate stage PST. Accordingly, it is possible to form the liquid immersion area AR2 by satisfactorily retaining the liquid LQ between the substrate P and the lower surfaces of the bottom plate portions 71D, 72D. In the following description, the lower surfaces (flat portions) of the bottom plate portions 71D, 72D, which are formed to be opposed to the surface of the substrate P and substantially parallel to the surface of the substrate P (XY plane), will be appropriately referred to as "land surface 75" in combination.

The land surface 75 is a surface which is included in the nozzle member 70 and which is arranged at the position nearest to the substrate P supported by the substrate stage PST. In this embodiment, the lower surface of the bottom plate portion 71D is substantially flush with the lower surface of the bottom plate portion 72D. Therefore, the lower surface of the bottom plate portion 71D and the lower surface of the bottom plate portion 72D are referred to as "land surface 75" in combination. However, the porous member 25 may be also arranged on the portion at which the bottom plate portion 71D is arranged to use as the liquid recovery port. In this case, only the lower surface of the bottom plate portion 72D is the land surface 75.

The porous member 25 has lower surfaces 2 which are opposed to the substrate P supported by the substrate stage PST. The porous member 25 is provided in the liquid recovery port 22 so that the lower surfaces 2 are inclined with respect to the surface of the substrate P (i.e., the XY plane) supported by the substrate stage PST. That is, the porous member 25, which is provided in the liquid recovery port 22, have inclined surfaces (lower surfaces) 2 which are opposed to the surface of the substrate P supported by the substrate stage PST. The liquid LQ is recovered via the inclined surfaces 2 of the porous member 25 arranged in the liquid recovery port 22. Therefore, the liquid recovery port 22 is formed on the inclined surfaces 2. In other words, the entire inclined surfaces function as the liquid recovery port 22 in this embodiment. The liquid recovery port 22 is formed to surround the projection area AR1 onto which the exposure light beam EL is radiated. Therefore, the inclined surfaces 2 of the porous member 25 arranged in the liquid recovery port 22 are formed to surround the projection area AR1.

Each of the inclined surface 2 of the porous member 25 opposed to the substrate P is formed such that the distance with respect to the surface of the substrate P is increased at positions separated farther from the optical axis AX of the projection optical system PL (optical element LS1). As shown in FIG. 3, the liquid recovery port 22 is formed to have the shape of " " (rectangle) or square frame-shaped form as viewed in a plan view in this embodiment. The porous member 25 includes four porous members 25A to 25D which are arranged in combination in the liquid recovery port 22. In particular, the porous members 25A, 25C, which are arranged on the both sides, respectively, in the X axis direction (scanning direction) with respect to the projection area AR1, are arranged so that the distances with respect to the surface of the substrate P are increased at positions separated farther from the optical axis AX while the surfaces thereof are perpendicular to the XZ plane. Further, the porous members 25B, 25D, which are arranged on the both sides, respectively, in the Y axis direction with respect to the projection area AR1, are arranged so that the distances with respect to the surface of the substrate P are increased at positions separated farther from the optical axis AX while the surfaces thereof are perpendicular to the YZ plane.

The angle of inclination of the lower surface 2 of the porous member 25 with respect to the XY plane is set between 3 and 20 degrees in consideration of, for example, the viscosity of the liquid LQ and the contact angle of the liquid LQ on the surface of the substrate P. In this embodiment, the angle of inclination is set to 7 degrees.

The lower end of the side plate portion 71A is provided at approximately the same position (height) in the Z axis direction as that of the lower surface of the bottom plate portion 71D connected to the lower end of the inclined plate portion 71C of the first member. The porous member 25 is attached to the liquid recovery port 22 of the nozzle member 70 so that the inner edge portion of the inclined surface 2 has approximately the same height as that of the lower surface (land surface 75) of the bottom plate portion 71D, and the inner edge portion of the inclined surface 2 is continued to the lower surface (land surface 75) of the bottom plate portion 71D. That is, the land surface 75 is formed continuously to the inclined surfaces 2 of the porous members 25. The porous members 25 are arranged so that the distances with respect to the surface of the substrate P are increased at positions separated farther from the optical axis AX. Wall portions 76, which are formed by a partial area of the lower portion of the side plate portion 71A, are provided outside the outer edge of the inclined surface 2 (porous member 25). The wall portions 76 are provided at the circumferential edges of the porous members 25 (inclined surfaces 2) so that the porous members 25 (inclined surfaces 2) are surrounded thereby. The wall portions 76 are provided outside the liquid recovery port 22 with respect to the projection area AR1 in order to suppress the leakage of the liquid LQ.

A portion of the bottom plate portion 72D, which forms the land surface 75, is arranged between the substrate P and the end surface (lower surface) T1 disposed on the side of the image plane of the optical element LS1 of the projection optical system PL in relation to the Z axis direction. That is, a portion of the land surface 75 enters the space disposed under or below the lower surface (end surface) T1 of the optical element LS1 of the projection optical system PL. An opening 74, through which the exposure light beam EL passes, is formed at a central portion of the bottom plate portion 72D which forms the land surface 75. The opening 74 has a shape corresponding to the projection area AR1. In this embodiment, the opening 74 is formed to have an elliptical shape in which the Y axis direction (non-scanning direction) is the longitudinal direction. The opening 74 is formed to be larger than the projection area AR1. The exposure light beam EL, which is allowed to pass via the projection optical system PL, can arrive at the surface of the substrate P without being shielded by the bottom plate portion 72D. That is, at least a portion of the land surface 75 is arranged at the position at which the optical path for the exposure light beam EL is not inhibited so that the optical path for the exposure light beam EL is surrounded and the portion of the land surface 75 enters the space disposed under or below the end surface T1 of the projection optical system PL. In other words, at least a portion of the land surface 75 is arranged to surround the projection area AR1 between the substrate P and the end surface T1 disposed on the side of the image plane of the projection optical system PL. The bottom plate portion 72D is arranged opposite to the surface of the substrate P with the lower surface thereof being the land surface 75. The bottom plate portion 72D is provided to make no contact with the substrate P and the lower surface T1 of the optical element LS1. The edge portion 74E of the opening 74 may be formed to be rectangular, acute angular, or circular arc-shaped Thus, the edge portion 74E of the opening 74 may be formed to be beveled.

The land surface 75 is arranged between the projection area AR1 and the inclined surfaces 2 of the porous member 25 arranged in the liquid recovery port 22. The liquid recovery port 22 is arranged to surround the land surface 75 outside the land surface 75 with respect to the projection area AR1. That is, the liquid recovery port 22 is arranged to surround the land surface at the position separated farther from the optical path for the exposure light beam EL than the land surface 75. The liquid supply port 12 is also arranged outside the land surface 75 with respect to the projection area AR1. The liquid supply port 12 is provided between the liquid recovery port 22 and the projection area AR1 of the projection optical system PL. The liquid LQ, which is fed to form the liquid immersion area AR2, is supplied between the liquid recovery port 22 and the projection area AR1 of the projection optical system PL via the liquid supply port 12. The number, the position, and the shape of each of the liquid supply port 12 and the liquid recovery port 22 are not limited to those described in the embodiment of the present invention. It is enough to adopt such an arrangement that the liquid immersion area AR2 can be maintained in a desired state. For example, the liquid recovery port 22 may be arranged so that the land surface 75 is not surrounded thereby. In this case, it is also allowable that the liquid recovery port 22 is provided in only predetermined areas disposed on the both sides in the scanning direction (X direction) with respect to the projection area AR1, or the liquid recovery port 22 is provided in only predetermined areas disposed on the both sides in the non-scanning direction (Y direction) with respect to the projection area AR1.

As described above, the land surface 75 is arranged between the substrate P and the lower surface T1 of the optical element LS1. The distance between the surface of the substrate P and the lower surface T1 of the optical element LS1 is longer than the distance between the surface of the substrate P and the land surface 75. That is, the lower surface T1 of the optical element LS1 is formed at the position higher than that of the land surface 75 (so that the position is separated farther from the substrate P). In this embodiment, the distance between the substrate P and the lower surface T1 of the optical element LS1 is about 3 mm, and the distance between the land surface 75 and the substrate P is about 1 mm. The liquid LQ of the liquid immersion area AR2 makes contact with the land surface 75, and the liquid LQ of the liquid immersion area AR2 also makes contact with the lower surface T1 of the optical element LS1. That is, the land surface 75 and the lower surface T1 serve as the liquid contact surfaces which make contact with the liquid LQ of the liquid immersion area AR2.

The liquid contact surface T1 of the optical element LS1 of the projection optical system PL has the liquid-attractive property or lyophilicity (water-attractive property or hydrophilicity). In this embodiment, the liquid-attracting treatment is performed for the liquid contact surface T1. The liquid contact surface T1 of the optical element LS1 is liquid-attractive or lyophilic owing to the liquid-attracting treatment. The land surface 75 is also subjected to the liquid-attracting treatment to have the lyophilicity. A portion (for example, the lower surface of the bottom plate portion 71D) of the land surface 75 may be subjected to the liquid-repelling treatment to have the liquid repellence. Of course, as described above, each of the first member 71 and the second member 72 may be formed of a lyophilic material to allow the land surface 75 to have the lyophilicity.

Those adoptable as the liquid-attracting treatment to provide the lyophilicity for the predetermined member such as the liquid contact surface T1 of the optical element LS1 include, for example, a treatment in which a liquid-attractive material such as $MgF_2$, $Al_2O_3$, or $SiO_2$ is adhered. Alternatively, the lyophilicity (hydrophilicity) can be also applied or added by forming a thin film with a substance having a molecular structure with large polarity accompanied with the OH group such as alcohol, as the liquid-attracting treatment (water-attracting treatment), because the liquid LQ in this embodiment is water having the large polarity. When the optical element LS1 is formed of calcium fluorite or silica glass, it is possible to obtain a satisfactory liquid-attractive property even when no liquid-attracting treatment is performed, because the calcium fluorite and the silica glass have the large affinities for water. Thus, it is possible to allow the liquid LQ to make tight contact with the substantially entire surface of the liquid contact surface (end surface) T1 of the optical element LS1.

The liquid-repelling treatment, which is adopted when a portion of the land surface 75 is allowed to have the liquid repellence, includes, for example, a treatment in which a liquid-repellent material including, for example, fluorine-based material such as polytetrafluoroethylene (Teflon (trade name)), acrylic resin material, or silicon-based resin material is adhered. When the upper surface 91 of the substrate stage PST is allowed to have the liquid repellence, then it is possible to suppress the outflow of the liquid LQ to the outside of the substrate P (outside of the upper surface 91) during the liquid immersion exposure, it is possible to smoothly recover the liquid LQ after the liquid immersion exposure as well, and it is possible to avoid the inconvenience which would be otherwise caused such that the liquid LQ remains on the upper surface 91.

In order to supply the liquid LQ onto the substrate P, the control unit CONT drives the liquid supply section 11 to feed the liquid LQ from the liquid supply section 11. The liquid LQ, fed from the liquid supply section 11, is allowed to flow through the supply tube 13, and then the liquid LQ flows into the buffer flow passage portion 14H of the supply flow passage 14 of the nozzle member 70. The buffer flow passage portion 14H is the space portion which is expanded in the horizontal direction. The liquid LQ, which has flown into the buffer flow passage portion 14H, is allowed to flow while being spread in the horizontal direction. The bank 15 is formed in the area disposed on the inner side (side of the optical axis AX) which is the downstream side of the flow passage of the buffer flow passage portion 14H. Therefore, the liquid LQ is spread over the entire region of the buffer flow passage portion 14H, and then the liquid LQ is once stored. After the liquid LQ is stored in not less than a predetermined amount in the buffer flow passage portion 14H (after the liquid level of the liquid LQ is not less than the height of the bank 15), the liquid LQ is allowed to flow into the inclined flow passage portion 14S via the narrow flow passage portion 14N. The liquid LQ, which has flown into the inclined flow passage portion 14S, is allowed to flow downwardly along the inclined flow passage portion 14S. Then, the liquid LQ is supplied from the liquid supply port 12 onto the substrate P which is arranged on the side of the image plane of the projection optical system PL. The liquid supply port 12 supplies the liquid LQ onto the substrate P from the position over or above the substrate P.

When the bank 15 is provided as described above, the liquid LQ, which outflows from the buffer flow passage portion 14H, is supplied onto the substrate P substantially uniformly from the entire region of the liquid supply port 12 which is formed annularly to surround the projection area AR1. In other words, if the bank 15 (narrow flow passage portion 14N) is not formed, the flow rate of the liquid LQ allowed to flow through the inclined flow passage portion 14S is larger in the area disposed in the vicinity of the connecting portion between the supply tube 13 and the buffer flow passage portion 14H than in other areas. Therefore, the amount of the liquid to be supplied to the surface of the substrate P is sometimes nonuniform at respective positions of the liquid supply port 12 which is formed annularly. However, the narrow flow passage portion 14N is provided to form the buffer flow passage portion 14H. The liquid supply is started for the liquid supply port 12 after the liquid LQ of not less than the predetermined amount is stored in the buffer flow passage portion 14H. Therefore, the liquid LQ can be supplied onto the substrate P in a state in which the flow rate distribution and the flow velocity distribution are uniformized at respective positions of the liquid supply port 12. The bubble tends to remain, for example, upon the start of the supply in the vicinity of the bent corner portion 17 of the supply flow passage 14. However, the supply flow passage 14, which is disposed in the vicinity of the bent corner portion 17, is narrowed to form the narrow flow passage portion 14N. Accordingly, the high velocity is realized for the flow rate of the liquid LQ allowed to flow through the narrow flow passage portion 14N. The flow of the liquid LQ allowed to have the high velocity can be used to discharge (purge) the bubble to the outside of the supply flow passage 14 via the liquid supply port 12. When the liquid immersion exposure operation is executed after discharging the bubble, the exposure process can be performed in the state in which no bubble is present in the liquid immersion area AR2. The bank 15 may be provided to protrude in the −Z direction from the ceiling surface of the buffer flow passage 14H. In principle, it is enough that the narrow flow passage portion 14N, which is narrower than the buffer flow passage portion 14H, is provided on the downstream side of the flow passage as compared with the buffer flow passage portion 14H.

The bank 15 may be made partially low (high). When an area, in which the height differs, is partially provided for the bank 15, it is possible to prevent the gas (bubble) from remaining in the liquid for forming the liquid immersion area AR2 when the supply of the liquid LQ is started. The buffer flow passage portion 14H may be divided into a plurality of flow passages so that the liquid LQ can be supplied in different amounts depending on positions at the slit-shaped liquid supply port 12.

In order to recover the liquid LQ on the substrate P, the control unit CONT drives the liquid recovery section 21. When the liquid recovery section 21, which has the vacuum system, is driven, the liquid LQ, which is on the substrate P, is allowed to flow into the recovery flow passage 24 via the liquid recovery port 22 arranged with the porous member 25. When the liquid LQ of the liquid immersion area AR2 is recovered, the lower surfaces (inclined surfaces) 2 of the porous member 25 make contact with the liquid LQ. The liquid recovery port 22 (porous member 25) is provided opposite to the substrate P over or above the substrate P. Therefore, the liquid LQ on the substrate P is recovered from the positions above or over the substrate P. The liquid LQ, which is allowed to flow into the recovery flow passage 24, is allowed to flow through the recovery tube 23, and then the liquid LQ is recovered by the liquid recovery section 21.

Figure 5:
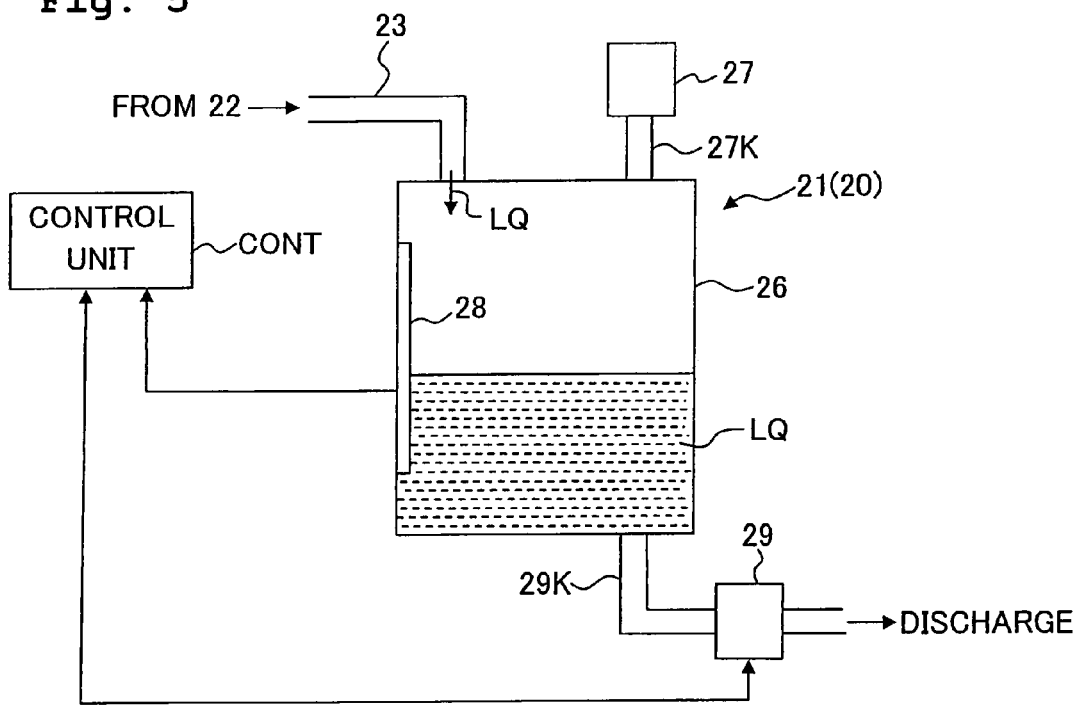
FIG. 5 shows a schematic arrangement illustrating an embodiment of a liquid recovery mechanism.

FIG. 5 shows an example of the liquid recovery section 21. With reference to FIG. 5, the liquid recovery section 21 includes a recovery tank 26 which is connected to one end of the recovery tube 23, a vacuum pump (vacuum system) 27 which is connected to the recovery tank 26 via a piping 27K, a liquid discharge pump (water discharge pump) 29 which is connected to the recovery tank 26 via a piping 29K, and a liquid level sensor (water level sensor) 28 which is provided inside the recovery tank 26. One end of the recovery tube 23 is connected to an upper portion of the recovery tank 26. The piping 27K, which has one end connected to the vacuum pump 27, has the other end connected to an upper portion of the recovery tank 26. The piping 29K, which has one end connected to the liquid discharge pump 29, has the other end connected to a lower portion of the recovery tank 26. When the vacuum pump 27 is driven, then the liquid LQ is recovered via the liquid recovery port 22 of the nozzle member 70, and the liquid LQ is accommodated in the recovery tank 26. When the liquid discharge pump 29 is driven, the liquid LQ, which is accommodated in the recovery tank 26, is discharged to the outside via the piping 29K. The operations of the vacuum pump 26 and the liquid discharge pump 29 are controlled by the control unit CONT. The liquid level sensor 28 measures the liquid level (water level) of the liquid LQ accommodated in the recovery tank 26. The measurement result thereof is outputted to the control unit CONT. The control unit CONT adjusts the suction force (water discharge force) of the liquid discharge pump 29 on the basis of the output of the liquid level sensor 28 so that the liquid level (water level) of the liquid LQ accommodated in the recovery tank 26 is substantially constant. The control unit CONT can maintain a substantially constant liquid level of the liquid LQ accommodated in the recovery tank 26. Therefore, it is possible to stabilize the pressure in the recovery tank 26. Therefore, it is possible to stabilize the recovery force (suction force) for the liquid LQ via the liquid recovery port 22. A liquid discharge valve may be provided in place of the liquid discharge pump 29 in the embodiment shown in FIG. 5. For example, the open/closed state of the liquid discharge valve may be adjusted, or the diameter of the discharge port may be adjusted on the basis of the output of the liquid level sensor 28 so that a substantially constant liquid level of the liquid LQ may be maintained in the recovery tank 26.

An explanation will be made about an example of the recovery method using the liquid recovery mechanism 20 in this embodiment. This recovery method is referred to as "bubble point method" in this embodiment. The liquid recovery mechanism 20 recovers only the liquid LQ from the recovery port 22 by using the bubble point method. Accordingly, it is possible to suppress the occurrence of the vibration which would be otherwise caused by the recovery of the liquid.

An explanation will be made below about the principle of the liquid recovery operation to be performed by the liquid recovery mechanism 20 in this embodiment with reference to FIG. 6. The porous member 25 is arranged in the recovery port 22 of the liquid recovery mechanism 20. For example, a thin plate-shaped mesh member, in which a large number of holes are formed, can be used as the porous member 25. In the bubble point method, only the liquid LQ is recovered from the holes of the porous member 25 by controlling the difference in pressure between the upper surface and the lower surface of the porous member 25 so that a predetermined condition is satisfied as described later on in a state in which the porous member 25 is wet. Parameters concerning the condition of the bubble point include, for example, the pore size of the porous member 25, the contact angle (affinity) of the porous member 25 with respect to the liquid LQ, and the suction force of the liquid recovery section 21 (pressure on the upper surface of the porous member 25).

Figure 6:
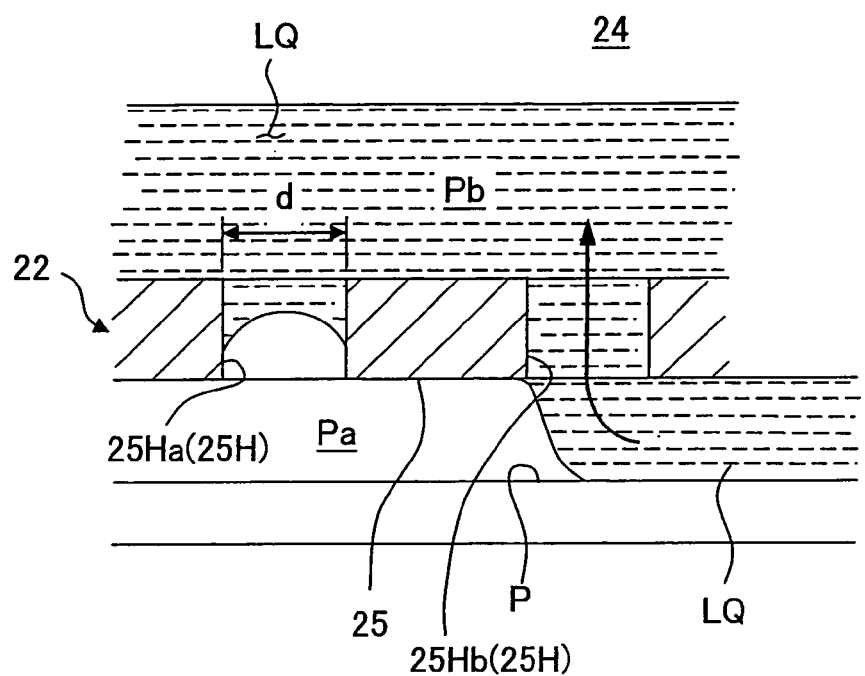
FIG. 6 schematically illustrates the principle of the liquid recovery operation performed by the liquid recovery mechanism.

FIG. 6 shows a magnified view illustrating a partial cross section of the porous member 25, which illustrates a specified example of the liquid recovery performed by the aid of the porous member 25. The substrate P is arranged under or below the porous member 25. The gas space and the liquid space are formed between the porous member 25 and the substrate P. More specifically, the gas space is formed between a first hole 25Ha of the porous member 25 and the substrate P, and the liquid space is formed between a second hole 25Hb of the porous member 25 and the substrate P. Such a situation arises, for example, at the end of the liquid immersion area AR2 shown in FIG. 4. Such a situation may also arise when any liquid void is formed in the liquid LQ of the liquid immersion area AR2. The flow passage space, which forms a part of the recovery flow passage 24, is formed over or above the porous member 25.

With reference to FIG. 6, it is assumed that the following condition holds:

$$(4 \times \gamma \times \cos \theta)/d \geq (Pa-Pb) \quad (1A)$$

wherein Pa represents the pressure in the space between the substrate P and the first hole 25Ha of the porous member 25 (pressure on the lower surface of the porous member 25H), Pb represents the pressure in the flow passage space over or above the porous member 25 (pressure on the upper surface of the porous member 25), d represents the pore size (diameter) of the holes 25Ha, 25Hb, θ represents the contact angle of the porous member 25 (inside the hole 25H) with respect to the liquid LQ, and γ represents the surface tension of the liquid LQ. On this assumption, as shown in FIG. 6, even when the gas space is formed on the lower side (side of the substrate P) of the first hole 25Ha of the porous member 25, it is possible to prevent the gas contained or present in the space disposed under or below the porous member 25 from making the movement (inflow) into the space disposed over or above the porous member 25 via the hole 25Ha. That is, when the contact angle θ, the pore size d, the surface tension γ of the liquid LQ, and the pressures Pa, Pb are optimized so that the condition of the expression (1A) is satisfied, then the interface between the liquid LQ and the gas is maintained in the hole 25Ha of the porous member 25, and it is possible to suppress the inflow of the gas from the first hole 25Ha. On the other hand, the liquid space is formed under (on the side of the substrate P) the second hole 25Hb of the porous member 25. Therefore, it is possible to recover only the liquid LQ via the second hole 25Hb.

The hydrostatic pressure of the liquid LQ on the porous member 25 is not considered in the condition of the expression (1A) in order to simplify the explanation.

In this embodiment, the liquid recovery mechanism 20 adjusts the pressure of the flow passage space over or above the porous member 25 so that the expression (1A) is satisfied by controlling the suction force of the liquid recovery section 21 while the pressure Pa of the space under or below the porous member 25, the diameter d of the hole 25H, the contact angle θ of the porous member 25 (inner surface of the hole 25H) with respect to the liquid LQ, and the surface tension γ of the liquid (pure water) LQ are constant. However, as (Pa−Pb) is larger in the expression (1A), i.e., ((4×γ×cos θ)/d) is larger, the pressure Pb is controlled more easily so as to satisfy the expression (1A). Therefore, it is desirable that the diameter d of the holes 25Ha, 25Hb and the contact angle θ of the porous member 25 with respect to the liquid LQ are decreased to be as small as possible.

Next, an explanation will be made about a method for exposing the substrate P with the image of the pattern of the mask M by using the exposure apparatus EX constructed as described above.

The control unit CONT forms the liquid immersion area AR2 of the liquid LQ on the substrate P by supplying a predetermined amount of the liquid LQ onto the substrate P and recovering a predetermined amount of the liquid LQ on the substrate P by using the liquid immersion mechanism 1 provided with the liquid supply mechanism 10 and the liquid recovery mechanism 20. The liquid LQ, which is supplied from the liquid immersion mechanism 1, forms the liquid immersion area AR2 locally on a part of the substrate P including the projection area AR1, the liquid immersion area AR2 being larger than the projection area AR1 and smaller than the substrate P.

The control unit CONT recovers the liquid LQ on the substrate P by the liquid recovery mechanism 20 concurrently with the supply of the liquid LQ onto the substrate P by the liquid supply mechanism 10, while the image of the pattern of the mask M is projected onto the substrate P so that the exposure is performed via the projection optical system PL and the liquid LQ between the projection optical system PL and the substrate P, while moving the substrate stage PST for supporting the substrate P in the X axis direction (scanning direction).

The exposure apparatus EX of the embodiment of the present invention performs the projection exposure for the substrate P with the image of the pattern of the mask M while moving the mask M and the substrate P in the X axis direction (scanning direction). During the scanning exposure, a part of the image of the pattern of the mask M is projected onto the projection area AR1 via the projection optical system PL and the liquid LQ of the liquid immersion area AR2. The mask M is moved at the velocity V in the −X direction (or in the +X direction), in synchronization with which the substrate P is moved at the velocity β·v (β represents the projection magnification) in the +X direction (or in the −X direction) with respect to the projection area AR1. A plurality of shot areas are set on the substrate P. After the exposure is completed for one shot area, the next shot area is moved to the scanning start position in accordance with the stepping movement of the substrate P. The scanning exposure process is successively performed thereafter for the respective shot areas while moving the substrate P in the step-and-scan manner.

In this embodiment, the porous member 25 is inclined with respect to the surface of the substrate P. In this case, the liquid LQ is recovered through the inclined surface 2 of the porous member 25 arranged in the liquid recovery port 22. The liquid LQ is recovered via the liquid recovery port 22 including the inclined surface 2. The land surface 75 (lower surface of the bottom plate portion 71D) is formed continuously to the inclined surface 2. In this case, when the substrate P is subjected to the scanning movement at a predetermined velocity by a predetermined distance in the +X direction with respect to the liquid immersion area AR2 starting from the initial state shown in FIG. 7(a) (state in which the liquid immersion area AR2 of the liquid LQ is formed between the land surface 75 and the substrate P), a state as shown in FIG. 7(b) is given. In the predetermined state after the scanning movement as shown in FIG. 7(b), a component F1 which moves obliquely upwardly along the inclined surface 2 and a component F2 which moves in the horizontal direction are generated in the liquid LQ of the liquid immersion area AR2. In this case, the shape is maintained for an interface (gas-liquid interface) LG between the liquid LQ of the liquid immersion area AR2 and the space disposed outside thereof. Even when the substrate P is moved at a high velocity with respect to the liquid immersion area AR2, it is possible to suppress any great change of the shape of the interface LG.

The distance between the inclined surface 2 and the substrate P is larger than the distance between the land surface 75 and the substrate P. That is, the space between the inclined surface 2 and the substrate P is larger than the space between the land surface 75 and the substrate P. Therefore, when the substrate P is moved, it is possible to provide a relatively small distance L between an interface LG' formed in the initial state shown in FIG. 7(a) and the interface LG formed in the predetermined state after the scanning movement shown in FIG. 7(b). Therefore, it is possible to suppress the spread or expansion of the liquid immersion area AR2, and it is possible to decrease the size of the liquid immersion area AR2.

For example, as shown in FIG. 8(a), even when the land surface 75 is formed continuously to a lower surface 2' of the porous member 25 arranged in the liquid recovery port 22, the lower surface 2' of the porous member 25 is not inclined with respect to the substrate P, and the lower surface 2' of the porous member 25 is substantially parallel to the surface of the substrate P, in other words, even when the liquid recovery port 22 including the lower surface 2' is not inclined, then the shape of the interface LG is maintained when the substrate P is moved with respect to the liquid immersion area AR2. However, only the component F2 which moves in the horizontal direction is generated in the liquid LQ, and the component (F1) which moves upwardly is scarcely generated, because the lower surface 2' is not inclined. In this case, the interface LG is moved by approximately the same distance as the amount of movement of the substrate P. Therefore, the distance L, between the interface LG' in the initial state and the interface LG in the predetermined state after the scanning movement, has a relatively large value, and the liquid immersion area AR2 is also increased in accordance therewith. In such a circumstance, it is necessary to provide a large size of the nozzle member 70 as well in response to the large liquid immersion area AR2. Further, it is also necessary to increase the size of the substrate stage PST itself and the movement stroke of the substrate stage PST in response to the size of the liquid immersion area AR2, resulting in the entire exposure apparatus EX having a huge size. The increase in the size of the liquid immersion area AR2 is conspicuous as the scanning velocity of the substrate P with respect to the liquid immersion area AR2 is increased to be high.

On the other hand, as shown in FIG. 8(b), when the distance between the lower surface 2' and the substrate P is made larger than the distance between the land surface 75 and the substrate P by providing a difference in height between the land surface 75 and the liquid recovery port 22 (lower surface 2' of the porous member 25), in other words, when the space between the lower surface 2' and the substrate P is made larger than the space between the land surface 75 and the substrate P, then the component F1' which moves upwardly is generated in the liquid LQ. Therefore, it is possible to provide a relatively small value of the distance L, and it is possible to suppress the increase in the size of the liquid immersion area AR2. However, the difference in height is provided between the land surface 75 and the lower surface 2', and the land surface 75 is not formed continuously to the lower surface 2'. Therefore, the shape of the interface LG tends to be collapsed. If the shape of the interface LG is collapsed, there is such a high possibility that the following inconvenience may arise. That is, the gas is mixed in the liquid LQ of the liquid immersion area AR2, and any bubble is formed in the liquid LQ. For example, when the substrate P is subjected to the scanning at a high velocity in the +X direction, if the difference in height is present, then the shape of the interface LG is collapsed, the component F1' to cause the upward movement is further increased, and the film thickness of the liquid LQ is thinned in the area disposed on the most +X side of the liquid immersion area AR2. If the substrate P is subjected to the movement in the −X direction (reverse scanning) in this state, there is such a high possibility that the phenomenon of the breakage of the liquid LQ may arise. If the broken liquid (see the reference numeral LQ' in FIG. 8(b)) remains, for example, on the substrate P, an inconvenience occurs such that the adhesion trace (so-called water mark) is formed on the substrate due to the vaporization of the liquid LQ'. There is also such a high possibility that the liquid LQ may outflow to the outside of the substrate P, and the inconvenience including, for example, the rust and the electric leakage may be caused on the peripheral members and/or the equipment. The possibility of the occurrence of the inconvenience as described above is increased as the scanning velocity of the substrate P with respect to the liquid immersion area AR2 is increased to be high.

In this embodiment, the inclined surface 2 is formed continuously to the land surface 75 (lower surface of the bottom plate portion 71D), and the liquid recovery port 22 of the liquid immersion mechanism 1 (liquid recovery mechanism 20) is formed on the inclined surface 2 opposite or opposed to the surface of the substrate P. Therefore, even when the substrate P and the liquid immersion area AR2 formed on the side of the image plane of the projection optical system PL are relatively moved, it is possible to maintain the shape of the interface LG (decrease the change of the shape of the interface LG), and it is possible to maintain the desired state for the size and the shape of the liquid immersion area AR2, while suppressing the distance of movement of the interface LG between the liquid LQ of the liquid immersion area AR2 and the space disposed outside thereof. Therefore, it is possible to avoid the inconvenience which would be otherwise caused, for example, such that any bubble is formed in the liquid LQ, the liquid cannot be recovered sufficiently, and/or the liquid outflows. Further, it is possible to decrease the size of the liquid immersion area AR2. Therefore, it is possible to realize the compact size of the entire exposure apparatus EX as well.

When the substrate P is subjected to the high velocity scanning, there is such a high possibility that the liquid LQ of the liquid immersion area AR2 may outflow to the outside, and the liquid LQ of the liquid immersion area AR2 may be scattered to the surroundings. However, it is possible to suppress the leakage of the liquid LQ, because the wall portion 76 is provided at the circumferential edge of the inclined surface 2. That is, a buffer space is formed at the inside of the wall portion 76 by providing the wall portion 76 at the circumferential edge of the porous member 25. Therefore, even when the liquid LQ arrives at the inner side surface of the wall portion 76, the liquid LQ for forming the liquid immersion area AR2 is spread to the buffer space disposed at the inside of the wall portion 76 while causing the wetting. Therefore, it is possible to more reliably avoid the leakage of the liquid LQ to the outside of the wall portion 76.

Further, the portion of the land surface 75 (lower surface of the bottom plate portion 72D) is arranged under or below the end surface T1 of the projection optical system PL to surround the projection area AR1. Therefore, the small gap, which is formed between the portion of the land surface 75 (lower surface of the bottom plate portion 72D) and the surface of the substrate P, is formed in the vicinity of the projection area to surround the projection area. Therefore, the small liquid immersion area, which is necessary and sufficient to cover the projection area AR1, can be continuously retained. Therefore, it is possible to realize the compact size of the entire exposure apparatus EX while suppressing the inconvenience such as the outflow of the liquid LQ and the entrance of the gas into the liquid LQ of the liquid immersion area AR2 even when the substrate P is moved (scanned) at a high velocity. Further, the liquid supply port 12 is arranged outside the portion of the land surface 75 (lower surface of the bottom plate portion 72D). Therefore, it is possible to avoid the entrance of the gas (bubble) into the liquid LQ for forming the liquid immersion area AR2. Even when the substrate P is moved at a high velocity, it is possible to continuously fill the optical path for the exposure light beam EL with the liquid.

Second Embodiment

Figure 9:
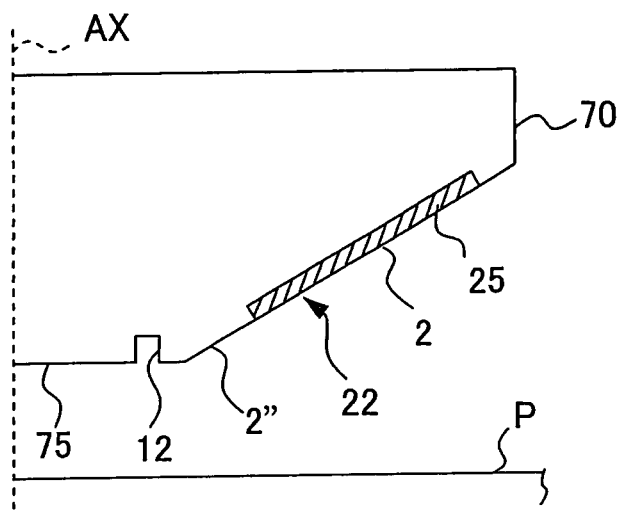
FIG. 9 schematically shows a nozzle member according to a second embodiment.

Next, a second embodiment of the present invention will be explained with reference to FIG. 9. In the following explanation, the constitutive parts, which are the same as or equivalent to those of the embodiment described above, are designated by the same reference numerals, and any explanation of which will be simplified or omitted. In the first embodiment described above, the inclined surface 2 is formed by attaching the thin plate-shaped porous member 25 obliquely with respect to the substrate P. However, as shown in FIG. 9, an inclined surface 21", for which the distance with respect to the surface of the substrate P is increased at positions separated farther from the optical axis AX of the exposure light beam EL, may be provided on the lower surface of the nozzle member 70, and the liquid recovery port 22 may be formed at a predetermined position (in a predetermined area) of a part of the inclined surface 2". The porous member 25 may be provided in the liquid recovery port 22. In this case, the inclined surface 2" of the nozzle member 70 is continued to the lower surface 2 of the porous member 25, and the inclined surface 2" is substantially flush with the lower surface 2. Also in this case, for example, when the interface LG of the liquid LQ is formed between the inclined surface 2" and the substrate P, then the shape of the interface LG can be maintained, and it is possible to avoid the inconvenience which would be otherwise caused, for example, such that the any bubble is generated in the liquid LQ of the liquid immersion area AR2. It is also possible to decrease the size of the liquid immersion area AR2.

Third Embodiment

Figure 10:
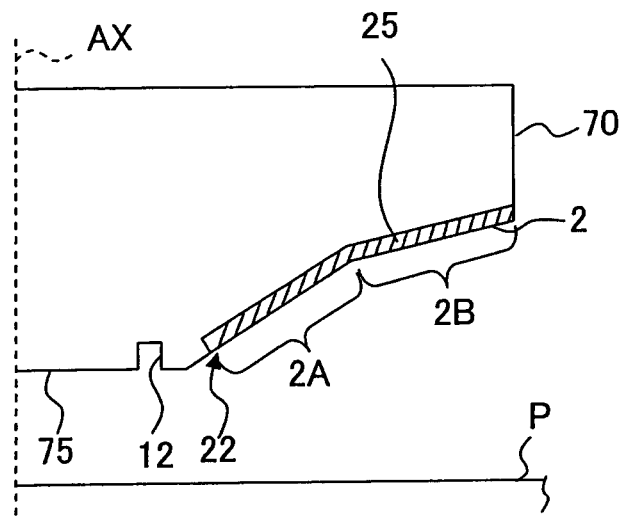
FIG. 10 schematically shows a nozzle member according to a third embodiment.

FIG. 10 shows a third embodiment of the present invention. As shown in FIG. 10, a first area 2A, which is included in the lower surface 2 of the porous member 25 and which is disposed near to the optical axis AX, may be formed so that an angle of inclination of the first area 2A with respect to the substrate P is larger than an angle of inclination of a second area 2B with respect to the substrate P, the second area 2B being disposed outside the first area 2A.

Fourth Embodiment

Figure 11:
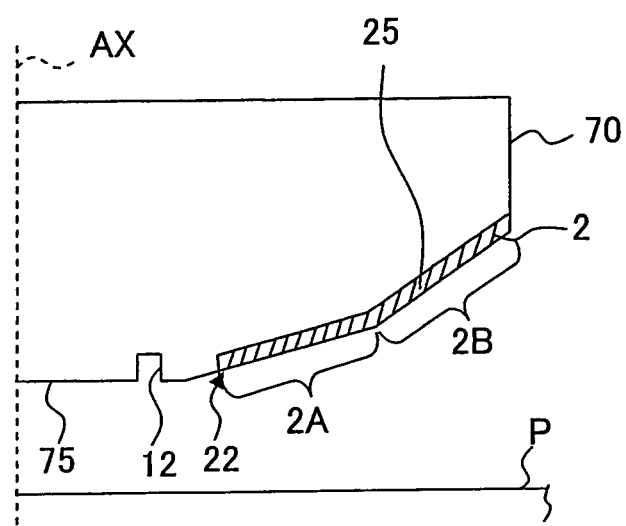
FIG. 11 schematically shows a nozzle member according to a fourth embodiment.

FIG. 11 shows a fourth embodiment of the present invention. As shown in FIG. 11, a first area 2A, which is included in the lower surface 2 of the porous member 25 and which is disposed near to the optical axis AX, may be formed so that an angle of inclination of the first area 2A with respect to the substrate P is smaller than an angle of inclination of a second area 2B with respect to the substrate P, the second area 2B being disposed outside the first area 2A. That is, it is not necessarily indispensable that the lower surface 2 of the porous member 25 is a flat surface. It is enough that the lower surface 2 of the porous member 25 is provided so that the distance with respect to the surface of the substrate P is increased at positions separated farther from the optical axis AX of the exposure light beam EL.

Fifth Embodiment

Figure 12:
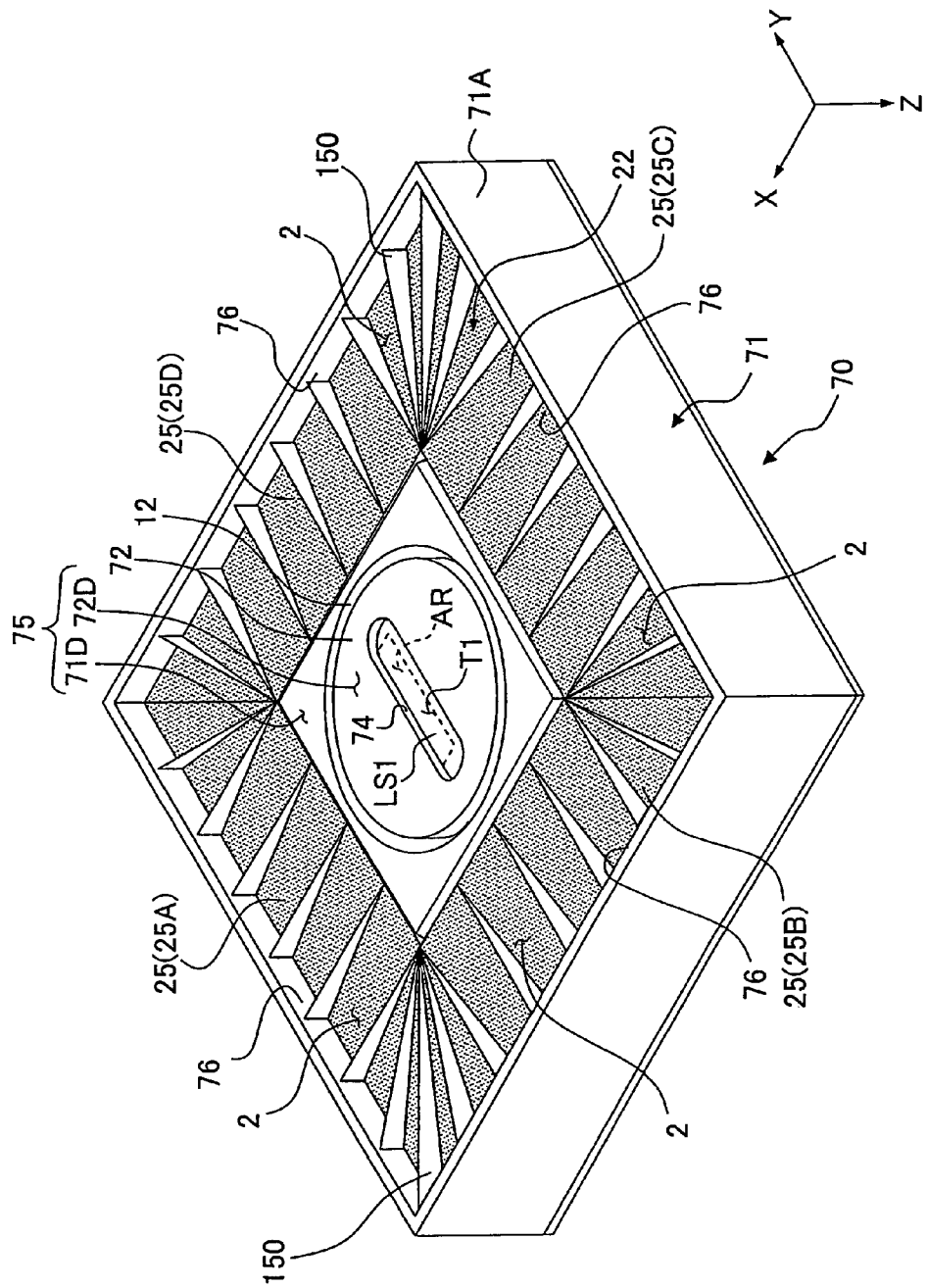
FIG. 12 shows a perspective view illustrating a nozzle member according to a fifth embodiment as viewed from the lower side.

FIG. 12 shows a fifth embodiment of the present invention. As shown in FIG. 12, a plurality of fin members 150 may be formed on the inclined surfaces (lower surfaces of the porous members 25) formed on the lower surface of the nozzle member 70. The fin member 150 is substantially triangular as viewed in a side view. With reference to the side sectional view shown in FIG. 12, the fin members 150 are arranged in the buffer space formed by the lower surface 2 of the porous members 25 at the inside of the wall portions 76. The fin members 150 are attached to the inner side surfaces 76 of the wall portions 76 radially so that the longitudinal directions thereof are directed outwardly. In this case, the plurality of fin members 150 are separated and away from one another. Space portions are formed between the respective fin members 150. When the plurality of fin members 150 are arranged as described above, it is possible to increase the liquid contact areas of the inclined surfaces (lower surfaces of the porous member 25) formed on the lower surface of the nozzle member 70. Therefore, it is possible to improve the performance to retain the liquid LQ on the lower surface of the nozzle member 70. The plurality of fin members may be provided at equal intervals, or they may be provided at unequal intervals. For example, the distance between the fin members 150 arranged on the both sides in the X axis direction with respect to the projection area AR1 may be set to be smaller than the distance between the fin members 150 arranged on the both sides in the Y axis direction with respect to the projection area AR1. It is preferable that the surface of the fin member 150 is liquid-attractive with respect to the liquid LQ. The fin member 150 may be formed by performing the "GOLDEP" treatment or the "GOLDEP WHITE" treatment to stainless steel (for example, SUS316). Alternatively, the fin member 150 may be formed of, for example, glass (silica glass).

Sixth Embodiment

Figure 13:
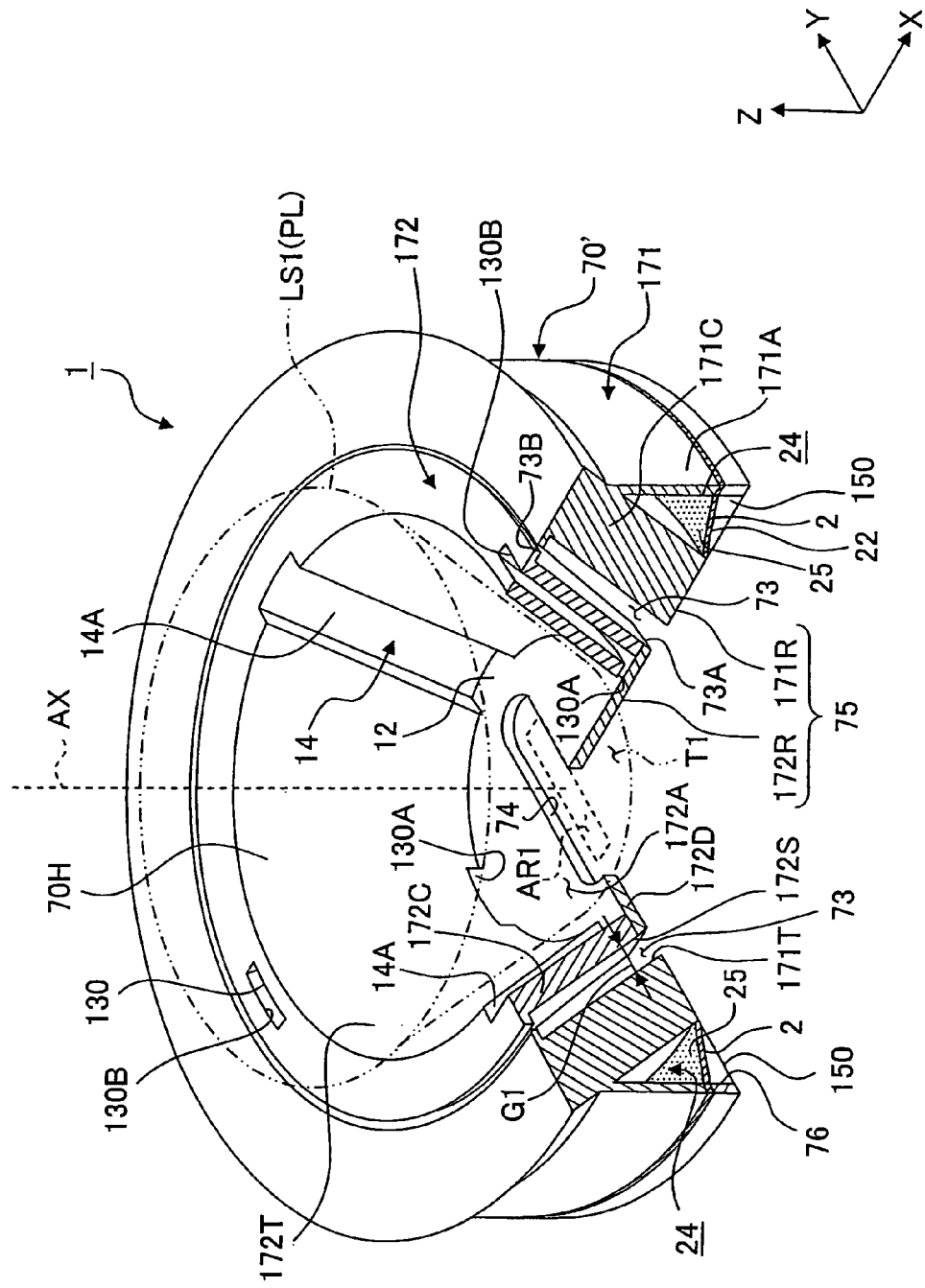
FIG. 13 shows a schematic perspective view illustrating those disposed in the vicinity of a nozzle member according to a sixth embodiment.
Figure 14:
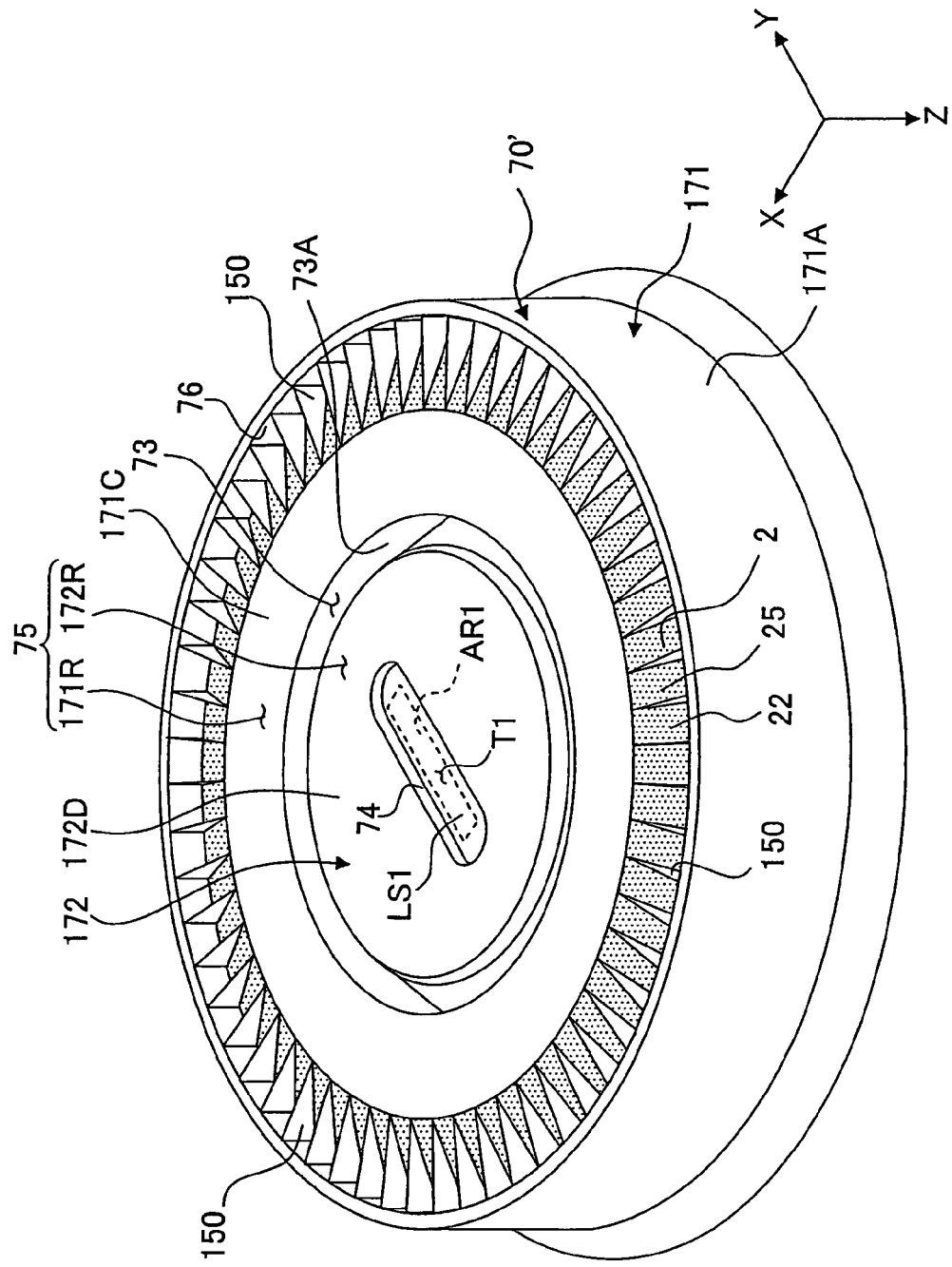
FIG. 14 shows a perspective view illustrating the nozzle member according to the sixth embodiment as viewed from the lower side.
Figure 15:
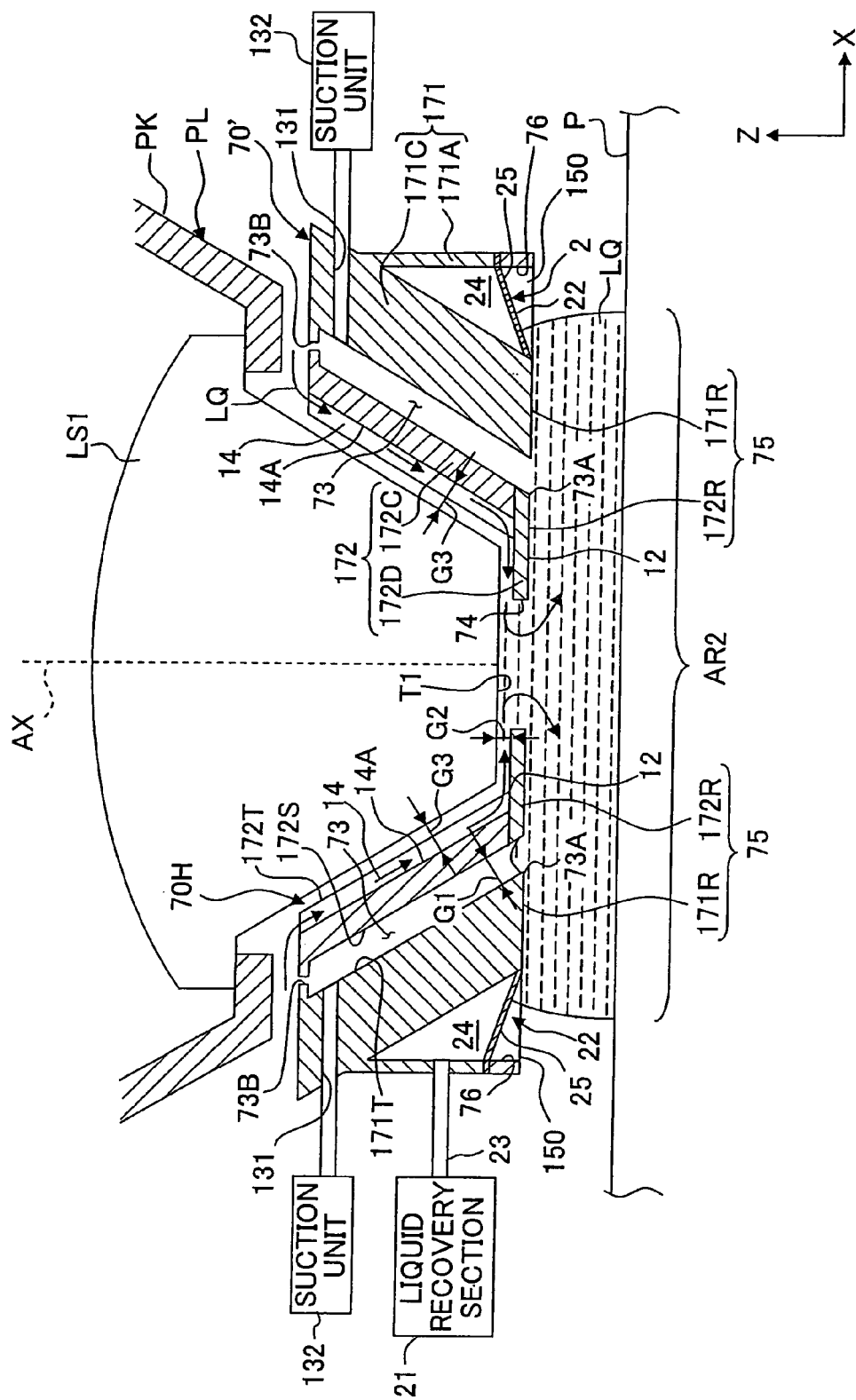
FIG. 15 shows a side sectional view illustrating those disposed in the vicinity of the nozzle member according to the sixth embodiment.
Figure 16:
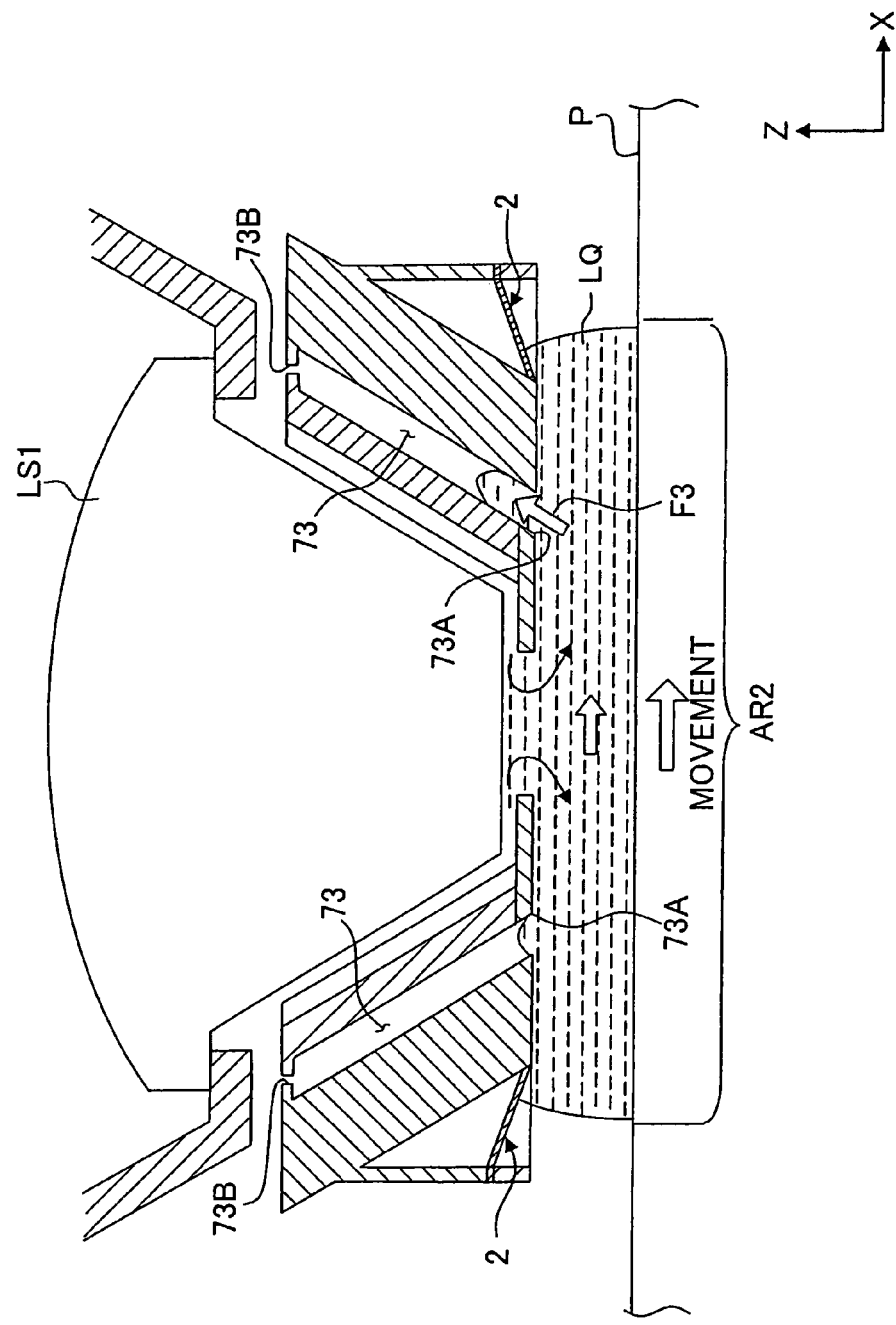
FIG. 16 illustrates the function of the nozzle member according to the sixth embodiment.

Next, a sixth embodiment of the present invention will be explained with reference to FIGS. 13, 14, 15, and 16. Mechanisms and members, which are the same as or similar to those of the respective embodiments described above, are designated by common reference numerals, and any detailed explanation of which will be omitted. FIG. 13 shows, with partial cutout, a schematic perspective view illustrating those disposed in the vicinity of a nozzle member 70'. FIG. 14 shows a perspective view illustrating the nozzle member 70' as viewed from the lower side. FIG. 15 shows a side sectional view taken in parallel to the YZ plane. FIG. 16 shows a side sectional view taken in parallel to the XZ plane.

The nozzle member 70' of this embodiment is constructed by combining a first member 171 and a second member 172. The nozzle member 70' is formed to be substantially circular as a whole as viewed in a plan view. The first member 171 has a side plate portion 171A and a thick-walled inclined plate portion 171C. The upper end of the side plate portion 171A is connected to the upper end of the inclined plate portion 171C. On the other hand, the second member 172 has an inclined plate portion 172C and a bottom plate portion 172D which is connected to the lower end of the inclined plate portion 172C. Each of the inclined plate portion 171C of the first member 171 and the inclined plate portion 172C of the second member 172 is formed to have a mortar-shaped form. The inclined plate portion 172C of the second member 172 is arranged inside the inclined plate portion 171C of the first member 171. The first member 171 and the second member 172 are supported by an unillustrated support mechanism to provide such a state that the inner side surface 171T of the inclined plate portion 171C of the first member 171 is slightly separated from the outer side surface 172S of the inclined plate portion 172C of the second member 172. A slit-shaped groove 73, which is annular as viewed in a plan view, is formed between the inner side surface 171T of the inclined plate portion 171C of the first member 171 and the outer side surface 172S of the inclined plate portion 172C of the second member 172. In this embodiment, a slit width G1 of the groove 73 is set to be, for example, about 3 mm. In this embodiment, the groove 73 is formed to have an inclination of about 45 degrees with respect to the XY plane (surface of the substrate P).

The optical element LS1 is arranged inside a hole 70H defined by the inclined plate portion 172C of the second member 172. The side surface of the optical element LS1 arranged in the hole 70H is opposed to the inner side surface 172T of the inclined plate portion 172C of the second member 172. The inner side surface 172T of the inclined plate portion 172C is liquid-repellent (water-repellent) with respect to the liquid LQ to suppress the inflow of the liquid LQ into a gap between the side surface of the projection optical system PL and the inner side surface 172T of the inclined plate portion 172C (nozzle member 70').

A lower surface 171R of the inclined plate portion 171C of the first member 171, which is opposite to the substrate P, is a flat surface which is parallel to the XY plane. The lower surface 172R of the bottom plate portion 172D of the second member 172, which is opposed or opposite to the substrate P, is also a flat surface which is parallel to the XY plane. The lower surface 171R of the inclined plate portion 171C of the first member 171 is substantially flush with the lower surface 172R of the bottom plate portion 172D of the second member 172. The land surface 75 of the nozzle member 70', which is opposite to the surface of the substrate P supported by the substrate stage PST (upper surface of the substrate stage PST) and which is disposed most closely to the surface of the substrate P (upper surface of the substrate stage PST), is formed by the lower surface 171R of the inclined plate portion 171 and the lower surface 172R of the bottom plate portion 172D. An opening 74, through which the exposure light beam EL is allowed to pass, is formed at a central portion of the bottom plate portion 172D which forms the land surface 75. That is, the land surface 75 is formed to surround the projection area AR1.

As shown in FIG. 15, a portion of the bottom plate portion 172D for forming the land surface 75 is arranged between the substrate P (substrate stage PST) and the lower surface T1 on the side of the image plane of the optical element LS1 of the projection optical system PL in relation to the Z axis direction. The bottom plate portion 172D is provided to make no contact with the lower surface T1 of the optical element LS1 and the substrate P (substrate stage PST). The upper surface of the bottom plate portion 172D is arranged so that the upper surface of the bottom plate portion 172D is opposite to the lower surface T1 of the optical element LS1 and the upper surface of the bottom plate portion 172D is substantially in parallel to the lower surface of the optical element LS1. A predetermined gap (space) G2 is formed between the end surface T1 of the projection optical system PL and the upper surface of the bottom plate portion 172D.

A space 24, which is open downwardly, is formed for the first member 171. The liquid recovery port 22 is formed at the opening of the space 24 in the same manner as in the first embodiment described above. The space 24 functions as the recovery flow passage. The other end of the recovery tube 23 is connected to a portion of the recovery flow passage (space) 24. A porous member 25, which has a plurality of holes, is arranged in the liquid recovery port 22 to cover the liquid recovery port 22. The porous member 25 has the lower surface 2 which is opposite to the substrate P supported by the substrate stage PST. The porous member 25 is provided in the liquid recovery port 22 so that the lower surface 2 is inclined with respect to the surface of the substrate P supported by the substrate stage PST (i.e., the XY plane) in the same manner as in the first embodiment described above. The inclined surface 2 of the porous member 25 is formed so that the distance with respect to the surface of the substrate P is increased at positions separated farther from the optical axis AX of the projection optical system PL (optical element LS1). As shown in FIG. 15, the porous member 25 is attached to the liquid recovery port 22 of the nozzle member 70' so that the inner edge portion of the inclined surface 2 has approximately the same height as that of the lower surface 171R (land surface 75) of the first member 171, and the inner edge portion of the inclined surface 2 is continued to the lower surface 171R (land surface 75).

As shown in FIG. 14, the liquid recovery port 22 is formed to be annular as viewed in a plan view on the lower surface of the nozzle member 70' to surround the opening 74 (projection area AR1), the groove 73, and the land surface 75. The land surface 75 is arranged between the opening 74 through which the exposure light beam EL is allowed to pass (projection area AR1) and the inclined surface 2 of the porous member 25 arranged in the liquid recovery port 22. The liquid recovery port 22 is arranged outside the land surface 75 with respect to the opening 74 (projection area AR1) to surround the land surface 75.

A plurality of fin members 150 are provided radially on the inclined surface (lower surface of the porous member 25) 2 as explained in the fifth embodiment. The fin member 150 is substantially triangular as viewed in a plan view. The fin members 150 are arranged in the buffer space formed by the lower surface 2 of the porous member 25 at the inside of the wall portion 76. In this embodiment, each of the fin members 150 has a thickness of about 0.1 mm. A large number of the fin members 150 are arranged at intervals of 2 degrees in the circumferential direction.

As shown in FIG. 13, recesses 14A are formed on the both sides respectively in the Y axis direction with respect to the projection area AR1 of the projection optical system PL on the inner side surface 172T of the inclined plate portion 172C of the second member 172. The recesses 14A are formed in the direction of inclination of the inclined plate portion 172C to form predetermined gaps G3 (see FIG. 15) with respect to the side surface of the optical element LS1. The supply flow passages 14 for supplying the liquid LQ to the image plane side of the projection optical system PL are defined by the gaps G3 formed between the recesses 14A and the optical element LS1. The upper end of the supply flow passage 14 is connected to the liquid supply section 11 via an unillustrated supply tube (supply flow passage), and the lower end is connected to the gap (space) G2 between the bottom plate portion 172D and the lower surface T1 of the projection optical system PL. The liquid supply ports 12 for supplying the liquid LQ to the gap G2 are formed at the lower ends. The liquid LQ, which is fed from the liquid supply section 11, is supplied by the liquid immersion mechanism 1 via the liquid supply ports 12 provided at the lower ends of the flow passages 14 to the space G2 between the projection optical system PL and the bottom plate portion 172D. In this embodiment, the supply flow passage 14 is formed to have an inclination of about 45 degrees with respect to the XY plane (surface of the substrate P).

Concave/convex portions may be provided, for example, on the upper surface of the bottom plate portion 172D to control the flow velocity of the liquid and the flow direction of the liquid on the upper surface of the bottom plate portion 172D. For example, in order to determine the flow direction of the liquid LQ supplied to the upper surface 172A of the bottom plate portion 172D from the liquid supply port 12, a fin-shaped member may be arranged for the liquid supply port 12, or a fin-shaped projection may be provided on the upper surface 172A of the bottom plate portion 172D. In this case, it is preferable that the flow direction of the liquid LQ and the flow rate of the liquid LQ are optimized on the basis of a result of an experiment or simulation so that the optical path space on the side of the image plane of the projection optical system PL can be continuously filled with the liquid LQ without allowing any gas portion to remain. It is preferable that the flow direction of the liquid LQ and the flow rate of the liquid LQ are optimized on the basis of a result of an experiment or simulation so that the liquid LQ does not remain, for example, on the end surface T1 of the optical element LS1 when substantially all of the liquid LQ is recovered from the space on the side of the image plane of the projection optical system PL to form the non-liquid immersion state. Alternatively, it is preferable that the flow direction of the liquid LQ and the flow rate of the liquid LQ are optimized on the basis of a result of an experiment or simulation so that the liquid, which contains any substance eluted from the substrate P (for example, any photosensitive resin), does not stay.

Further, slit-shaped through-holes 130, which penetrate in the direction of inclination through the inclined plate portion 172C of the second member 172, are formed on the both sides respectively of the second member 172 in the X axis direction with respect to the projection area AR1. Openings, which are formed at the lower ends 130A of the through-holes 130, are connected to the gap (space) G2 between the bottom plate portion 172D and the lower surface T1 of the projection optical system PL. The upper ends 130B are open to the atmospheric air. The liquid can be fed along the upper surface 172A of the bottom plate portion 172D, i.e., in the directions parallel to the substrate from the openings disposed at the lower ends 130A.

The groove 73, which is formed between the first member 171 and the second member 172, is arranged between the inclined surface 2 of the liquid recovery port 22 and the projection area AR1 onto which the exposure light beam EL is radiated. The groove 73 is formed to surround the opening 74 (projection area AR1). Further, the groove 73 is formed to surround the lower surface 172R for constituting a portion of the land surface 75 as well. In other words, the groove 73 is arranged outside the lower surface 172R for constituting the portion of the land surface 75. The groove 73 has the opening 73A which is arranged opposite to the upper surface of the substrate stage PST (substrate P supported by the substrate stage PST). That is, the groove 73 is open so that the groove 73 is directed downwardly. The opening 73A is provided in the vicinity of the image plane of the projection optical system PL. The groove 73 is communicated therein with the gas around the image plane of the projection optical system PL via the opening 73A.

The groove 73 has another opening 73B to be open to the atmospheric air, other than the opening 73A which is opposite to the substrate P (substrate stage PST). In this embodiment, the groove 73 has the opening 73B which is disposed at the upper end and which is provided to be open to the atmospheric air. The opening 73B is formed to be annular as viewed in a plan view along the upper end of the groove 73. However, the opening 73B may be formed at only a portion of the upper end of the groove 73. The position of the communication passage for making the communication between the inside and the outside of the groove 73 is not limited to the upper end of the groove 73. The flow passage may be provided at any position. For example, a flow passage, which makes the communication between the outside of the groove 73 and an intermediate position (predetermined position) in the Z axis direction in the groove 73, may be formed at a portion of the first member 171, and the groove 73 may be open to the atmospheric air via the flow passage.

As described above, the groove 73B is formed, which has the opening 73A opposite to the substrate P (substrate stage PST) and the opening 73B to be open to the atmospheric air. Therefore, a part of the liquid LQ, which is disposed between the nozzle member 70' and the substrate P (substrate stage PST), can enter into and exist out of the interior of the groove 73. Therefore, even when the size (diameter) of the nozzle member 70' is small, it is possible to suppress the outflow of the liquid LQ to the outside of the liquid recovery port 22.

As shown in FIG. 15, communication passages 131, which make the communication between the inside and the outside of the grooves 73, are formed at portions of the first member 171. A suction unit 132, which includes a vacuum system, is connected to the communication passage 131. The communication passages 131 and the suction unit 132 are used to recover the liquid LQ via the grooves 73 when the liquid LQ between the nozzle member 70' and the substrate P (substrate stage PST), i.e., the liquid LQ for forming the liquid immersion area AR2 is completely recovered.

Next, an explanation will be made about the operation of the liquid immersion mechanism 1 provided with the nozzle member 70' constructed as described above. In order to supply the liquid LQ onto the substrate P, the control unit CONT feeds the liquid LQ from the liquid supply section 11 by driving the liquid supply section 11. The liquid LQ, which is fed from the liquid supply section 11, flows through the supply tube, and then the liquid LQ flows into the upper ends of the supply flow passages 14 of the nozzle member 70'. The liquid LQ, which is allowed flow into the upper ends of the supply flow passages 14, is allowed flow downwardly in the direction of inclination of the inclined plate portion 172C. Then, the liquid LQ is supplied from the liquid supply ports 12 to the space G2 between the bottom plate portion 172D and the end surface T1 of the projection optical system PL. In this case, any gas portion, which has been present in the space G2 before supplying the liquid LQ to the space G2, is discharged to the outside via the through-holes 130 and/or the opening 74. Therefore, it is possible to avoid the occurrence of the inconvenience which would be otherwise caused such that the gas stays or remains in the space G2 upon the start of the supply of the liquid LQ to the space G2. It is possible to avoid the inconvenience which would be otherwise caused such that the gas portion (bubble) is generated in the liquid LQ.

The space G2 is filled with liquid LQ supplied to the space G2. After that, the liquid LQ is allowed to flow into the space between the land surface 75 and the substrate P (substrate stage PST) via the opening 74, which is an open aperture in that opening 74 allows radiation to be transmitted through it and it allows liquid to flow through it. In this case, the liquid recovery mechanism 20 recovers the liquid LQ on the substrate P in a predetermined amount per unit time. Therefore, the liquid immersion area AR2, which has a desired size, is formed on the substrate P by the liquid LQ allowed to flow into the space between the land surface 75 and the substrate P (substrate stage PST) via the opening 74.

In this embodiment, the opening 74, through which the exposure light beam EL is allowed to pass, has a small size, and the size of the land surface 75 is relatively large. Therefore, the liquid LQ can be retained satisfactorily between the substrate P (substrate stage PST) and the nozzle member 70'.

The communication passage 131, which is connected to the groove 73, is closed and the driving of the suction unit 132 is stopped during the period in which the liquid immersion area AR2 is formed, for example, during the period in which the substrate P is subjected to the liquid immersion exposure. Therefore, even when the substrate P (substrate stage PST) is moved with respect to the liquid immersion area AR2 formed to cover the projection area AR1, a part of the liquid LQ of the liquid immersion area AR2 can enter into and exist out of the groove 73 which is open to the atmospheric air. It is possible to avoid the occurrence of the inconvenience which would be otherwise caused, for example, such that the liquid immersion area AR2 is expanded, and the liquid LQ of the liquid immersion area AR2 outflows. That is, for example, as shown in FIG. 16, when the substrate P is moved in the +X direction, the liquid LQ of the liquid immersion area AR2 also attempts to move in the +X direction in accordance with the movement of the substrate P. In this case, the following possibility may arise due to the movement of the liquid LQ in the +X direction. That is, the liquid immersion area AR2 may be expanded in the +X direction, and the liquid LQ of the liquid immersion area AR2 may outflow to the outside of the liquid recovery port 22. However, a part of the liquid LQ moved in the +X direction enters the groove 73 disposed on the +X side, and the part of the liquid LQ is spread in the groove 73 (see the arrow F3 shown in FIG. 16). Therefore, it is possible to suppress, for example, the expansion of the liquid immersion area AR2 and the outflow of the liquid LQ.

When all of the liquid LQ between the nozzle member 70' and the substrate P (substrate stage PST) is recovered, for example, when the liquid immersion exposure is completed for the substrate P, then the control unit CONT performs the following operation. That is, the control unit CONT stops the liquid supply operation by the liquid supply mechanism 10 so as to perform the liquid recovery operation via the liquid recovery port 22 by the liquid recovery mechanism 20. Further, the control unit CONT opens the communication passage 131, which is connected to the groove 73, and drives the suction unit 132 so that the internal space of the groove 73 is allowed to have the negative pressure to concurrently perform the liquid recovery operation via the opening 73A of the groove 73 as well. Accordingly, the liquid LQ, which is between the nozzle member 70' and the substrate P (substrate stage PST), can be reliably recovered in a short period of time by using the opening 73A disposed most closely to the substrate P (substrate stage PST) as well, as described above. In this case, the opening 73B, which is provided to be open to the atmospheric air, is smaller in size than the opening 73A which functions as the recovery port for the liquid LQ. Therefore, the liquid LQ can be recovered while allowing the interior of the groove 73 to have the sufficient negative pressure.

When the liquid LQ is recovered via the groove 73, there is such a possibility that the gas present in the groove 73 may flow into the communication passage 131 together with the liquid LQ, and any vibration may be generated on the nozzle member 70'. However, no problem arises, because the recovery of the liquid LQ, which is performed via the groove 73, is executed when the operation such as the exposure operation for the substrate P, which requires the accuracy, is not performed.

In this embodiment, the recesses 14A (two in total) for forming the supply flow passages 14 are provided one by one on the both sides, respectively, in the Y axis direction with respect to the projection area AR1. However, the recesses 14A may be provided at a plurality of arbitrary positions to surround the projection area AR1, of the projection optical system PL, onto which the exposure light beam EL is radiated. The bank 15 (buffer flow passage portion 14H) as explained in the first embodiment may be also provided at a position in the vicinity of the upper end of the recess 14A.

Seventh Embodiment

Figure 17:
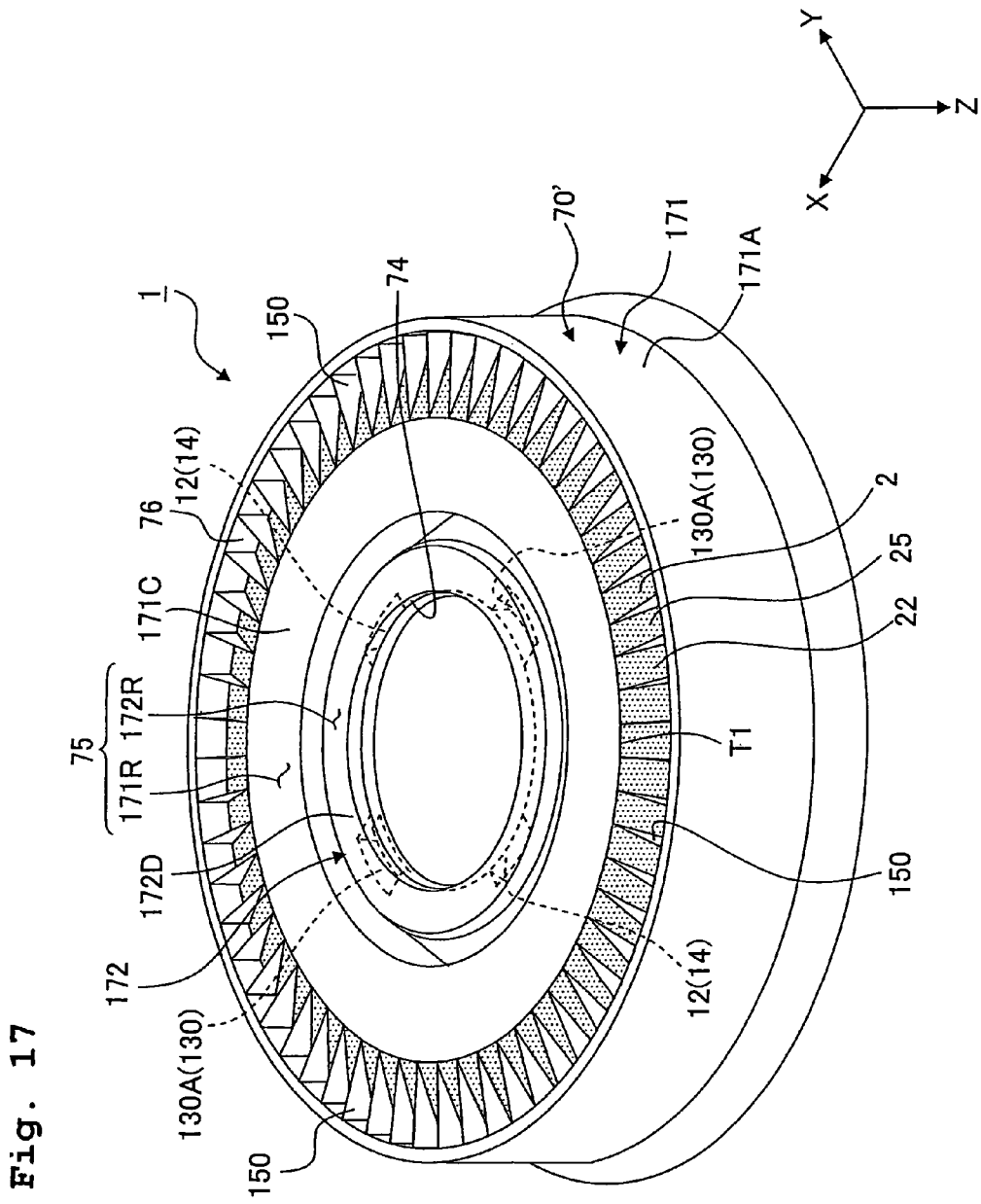
FIG. 17 shows a perspective view illustrating a nozzle member according to a seventh embodiment as viewed from the lower side.
Figure 18:
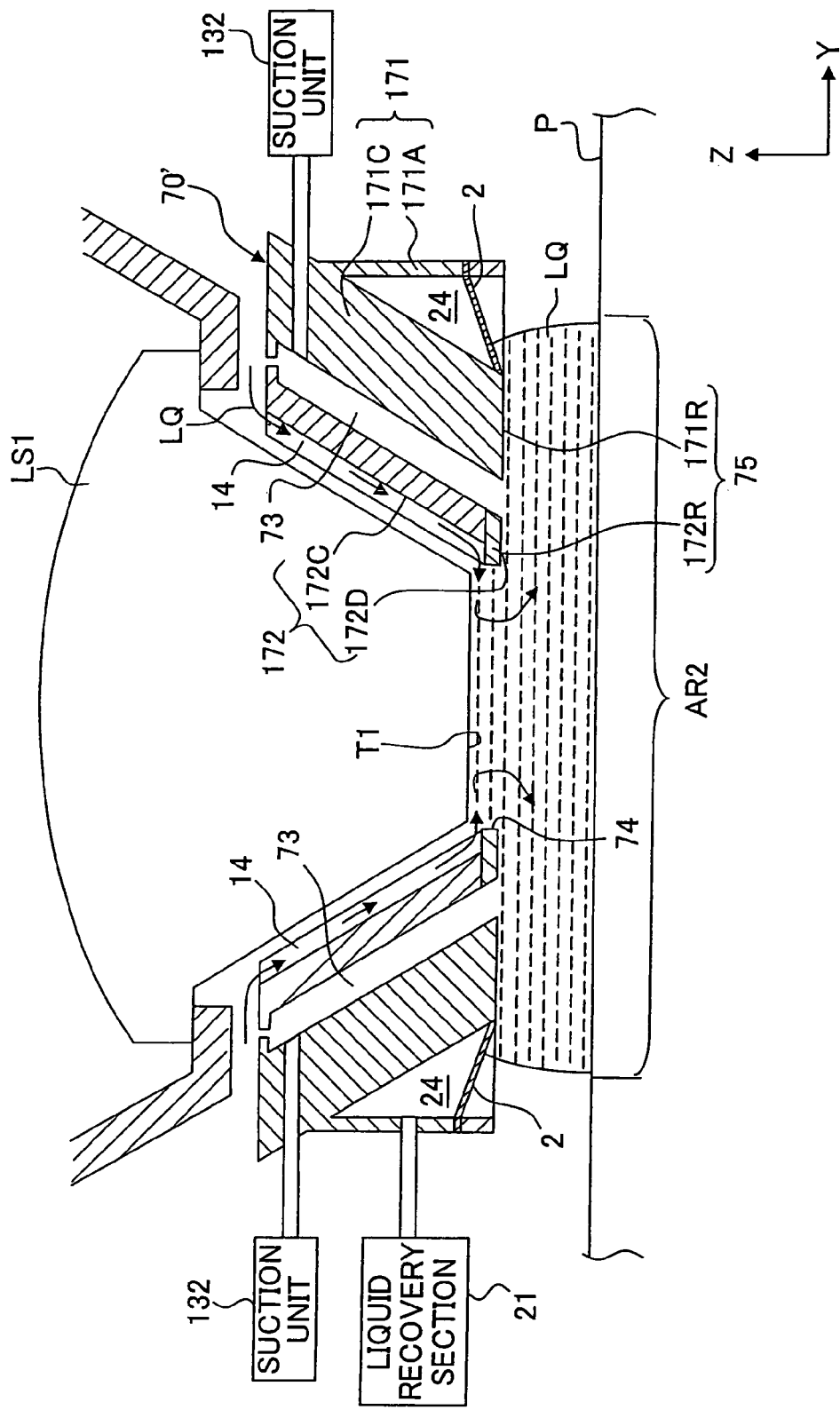
FIG. 18 shows a side sectional view illustrating those disposed in the vicinity of the nozzle member according to the seventh embodiment.

Next, a seventh embodiment of the present invention will be explained with reference to FIGS. 17 and 18. Mechanisms and members, which are the same as or similar to those of the respective embodiments described above, are designated by common reference numerals, and any detailed explanation of which will be omitted. FIG. 17 shows a nozzle member 70' as viewed from the lower side, and FIG. 18 shows a side sectional view. With reference to FIGS. 17 and 18, the seventh embodiment is different from the sixth embodiment described above in that a bottom plate portion 172D of the second member 72 has a small size, and the bottom plate portion 172D is scarcely arranged between the substrate P (substrate stage PST) and the lower surface T1 of the projection optical system PL. That is, an opening 74, which is formed through the bottom plate portion 172D, is formed to have a substantially circular shape which has approximately the same size as that of the lower surface T1 of the projection optical system PL (optical element LS1) and which is sufficiently larger than the projection area AR1. Almost all of the lower surface T1 of the optical element LS1 is exposed to be opposite to the substrate P (substrate stage PST). The liquid LQ, which is fed from the liquid supply section 11, is supplied to the space between the substrate P (substrate stage PST) and the lower surface T1 of the projection optical system PL via the supply flow passages 14 formed between the recesses 14A and the side surface of the optical element LS1. In this embodiment, although the areal size of the land surface 75 is small, the space is scarcely formed between the bottom plate portion 172 and the optical element LS1 of the projection optical system PL, and the portion, at which the gas tends to stay or remain, is decreased as compared with the sixth embodiment. Therefore, it is possible to more reliably avoid the inconvenience which would be otherwise caused such that the gas portion (bubble) is generated in the liquid LQ for forming the liquid immersion area AR2 when the supply of the liquid LQ is started.

In the sixth embodiment and the seventh embodiment described above, the nozzle member 70' is constructed by combining the first member 171 and the second member 172 in order to simplify the explanation. However, in practice, the nozzle member 70' is constructed by further combining several other members. It is a matter of course that the nozzle member 70' may be constructed of one member.

In the sixth embodiment and the seventh embodiment described above, the gas present in the space G2 is discharged by using the through-holes 130 upon the start of the supply of the liquid LQ. However, the through-holes 130 may be connected to the suction unit (vacuum system), and the gas present in the space G2 may be forcibly discharged upon the start of the supply of the liquid LQ.

In the sixth embodiment and the seventh embodiment described above, the opening 74 of the bottom plate portion 172D is not limited to the shapes shown in FIGS. 14 and 17. The shape of the opening 74 of the bottom plate portion 172D can be determined so that the gas portion does not remain, and the optical path space on the side of the image plane of the projection optical system PL can be continuously filled with the liquid LQ even when the substrate P (substrate stage PST) is moved.

In the sixth embodiment and the seventh embodiment described above, when all of the liquid LQ, which is between the nozzle member 70' and the substrate P (substrate stage PST) (in the optical path space on the side of the image plane of the projection optical system PL), is recovered, any gas may be blown from the liquid supply port 12 in addition to the liquid recovery operation using the liquid recovery port 22 and the opening 73A. The gas, which is blown from the liquid supply port 12, is blown to the lower surface T1 of the optical element LS1 disposed at the end portion of the projection optical system PL. Therefore, it is possible to remove the liquid LQ adhering (remaining) on the lower surface T1 of the optical element LS1. The gas, which is blown from the liquid supply port 12, flows along the lower surface T. The liquid (liquid droplet) LQ, which is adhered to an area of the lower surface T1 of the optical element LS1 through which the exposure light beam EL passes, i.e., an area of the lower surface T1 of the optical element LS1 corresponding to the projection area AR1, can be moved (retracted) to the outside of the area. Accordingly, the liquid LQ, which has been adhered to the area of the lower surface T1 of the optical element LS1 through which the exposure light beam EL passes, is removed. The liquid LQ may be removed by evaporating or vaporizing (drying) the liquid LQ adhered to the lower surface T1 of the optical element LS1 by the gas allowed to blow thereto. A clean gas, which is obtained by the aid of a filter unit (not shown) including a chemical filter and/or a particle-removing filter, is allowed to blow from the liquid supply port 12. The gas to be used is the gas, for example, air (dry air) which is approximately the same as the gas in the chamber in which the exposure apparatus EX is accommodated. The nitrogen gas (dry nitrogen) may be used as the gas allowed to be blown. When all of the liquid LQ is recovered, then a vacuum system or the like may be connected to the through-holes 130 which are provided to discharge the gas existing in the space G2 to the outside, and the liquid LQ may be sucked and recovered from the openings which are formed at the lower ends of the through-holes 130. Alternatively, a gas supply system may be connected to the through-holes 130 which are provided to discharge the gas existing in the space G2 to the outside, and the gas may be blown through the through-holes 130.

In the sixth and seventh embodiments, the liquid supply ports 12 may be arranged on the both sides, respectively, in the X axis direction with respect to the projection area AR1 respectively, and the liquid LQ may be supplied from the both sides in the scanning direction respectively. In this case, the lower ends 130A of the through-holes 130 are provided at positions different from those of the liquid supply ports 12, for example, on the both sides in the Y axis direction with respect to the projection area AR1.

In the sixth and seventh embodiments, the supply flow passages 14 are formed by the gaps G3 between the recesses 14A of the inclined plate portion 172C and the side surface of the optical element LS1, and the lower ends of the supply flow passages 14 function as the liquid supply ports 12. However, the upper ends 130B of the through-holes 130 may be connected to the liquid supply section 11, the through-holes 130 may be allowed to function as supply flow passages, and the lower ends 130A of the through-holes 130 may be allowed to function as liquid supply ports. When the upper ends 130B of the through-holes 130 are connected to the liquid supply section 11 to supply the liquid LQ via the through-holes 130, then the liquid supply section 11 is not connected to the gaps G3 between the recesses 14A of the inclined plate portion 172C and the side surface of the optical element LS1 (gaps G3 do not function as the supply flow passages), and the upper ends of the gaps G3 are open to the atmospheric air. The gas, which exists in the space G2, is discharged to the outside via the gaps G3 before the liquid LQ is supplied to the space G2 from the through-holes 130. Even when the liquid LQ is supplied via the through-holes 130, it is possible to avoid the occurrence of the inconvenience which would be otherwise caused such that the gas stays or remains in the space G2 upon the start of the supply of the liquid LQ to the space G2. It is possible to avoid the inconvenience which would be otherwise caused such that the gas portion (bubble) is generated in the liquid LQ. Also in this case, the upper ends of the gaps G3 may be connected to the suction unit (vacuum system), and the gas present in the space G2 may be forcibly discharged upon the start of the supply of the liquid LQ.

When the liquid LQ is supplied via the through-holes 130, then the lower ends 130A of the through-holes 130, which function as the liquid supply ports, may be arranged on the both sides, respectively, in the Y axis direction with respect to the projection area AR1, and the liquid LQ may be supplied from the both sides respectively in the non-scanning direction.

Eighth Embodiment

Figure 19:
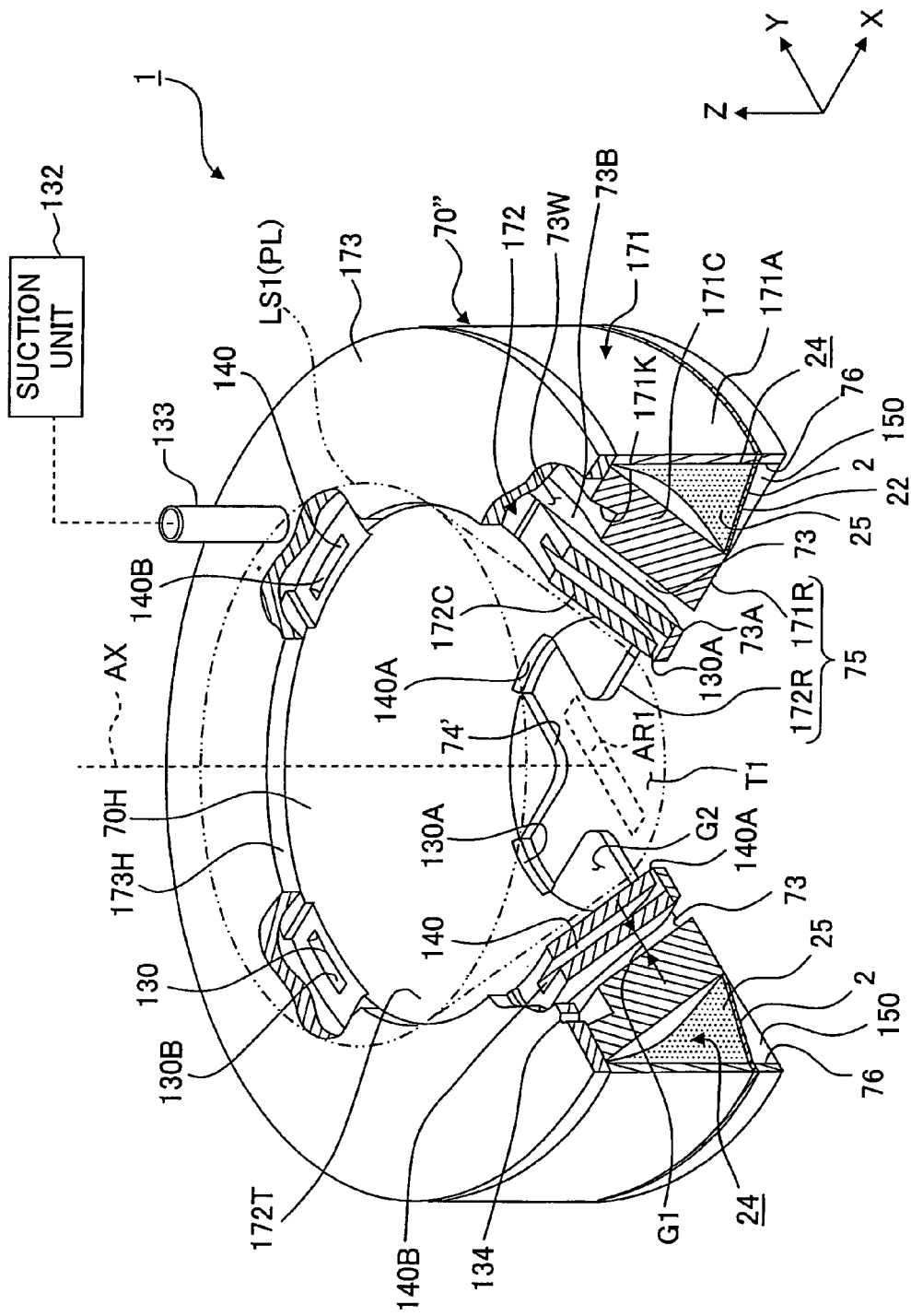
FIG. 19 shows a schematic perspective view illustrating those disposed in the vicinity of a nozzle member according to an eighth embodiment.
Figure 20:
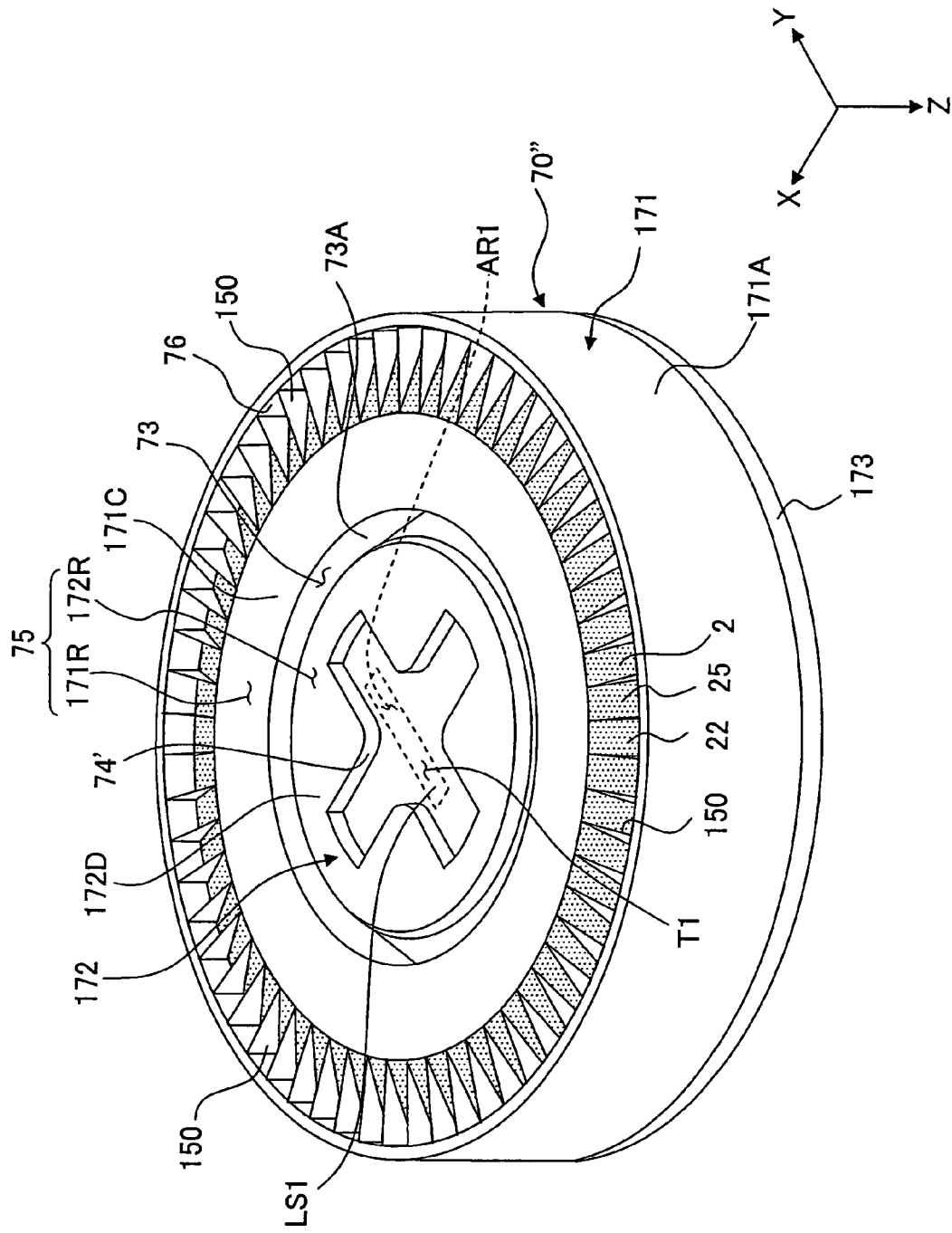
FIG. 20 shows a perspective view illustrating the nozzle member according to the eighth embodiment as viewed from the lower side.
Figure 21:
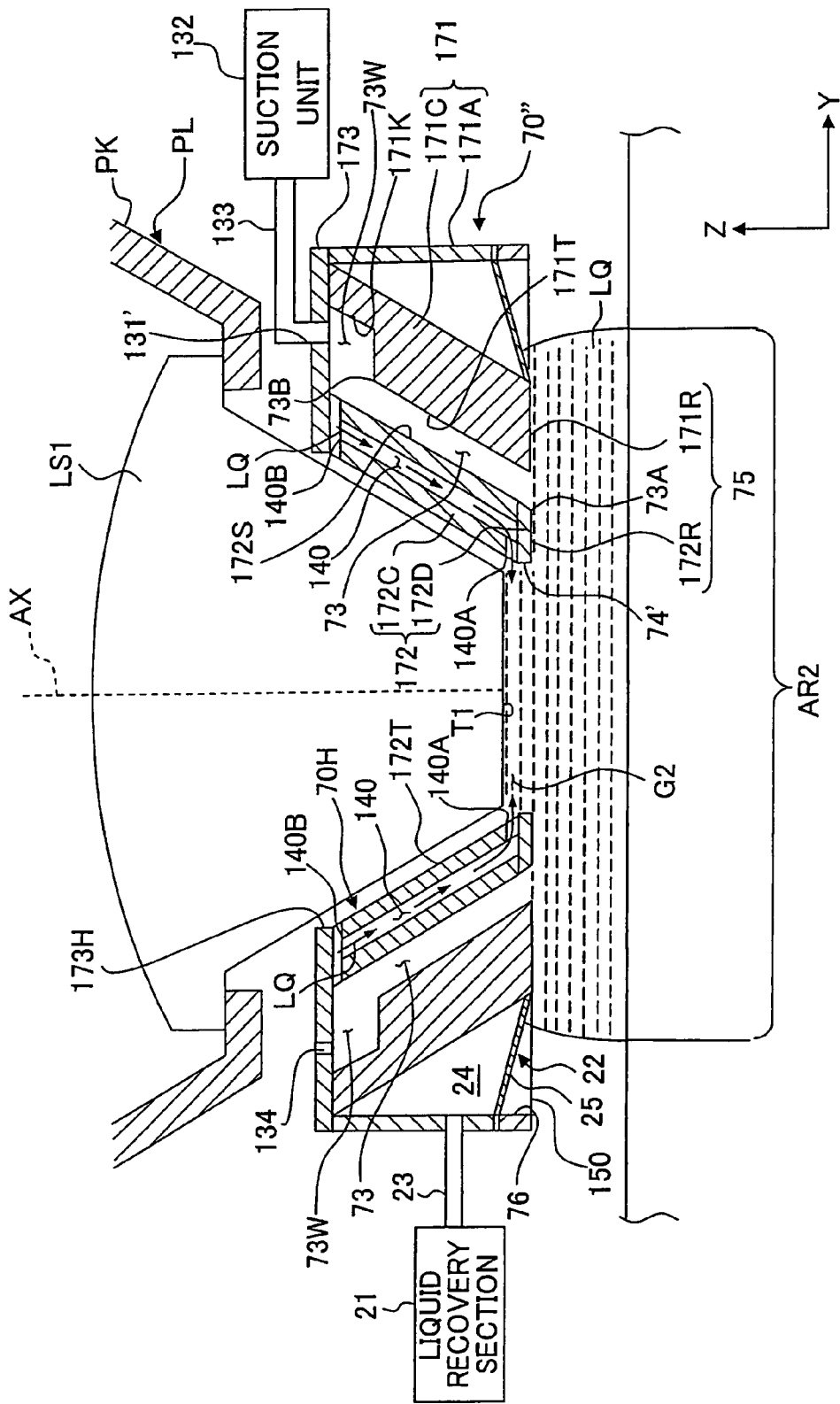
FIG. 21 shows a side sectional view illustrating those disposed in the vicinity of the nozzle member according to the eighth embodiment.
Figure 22:
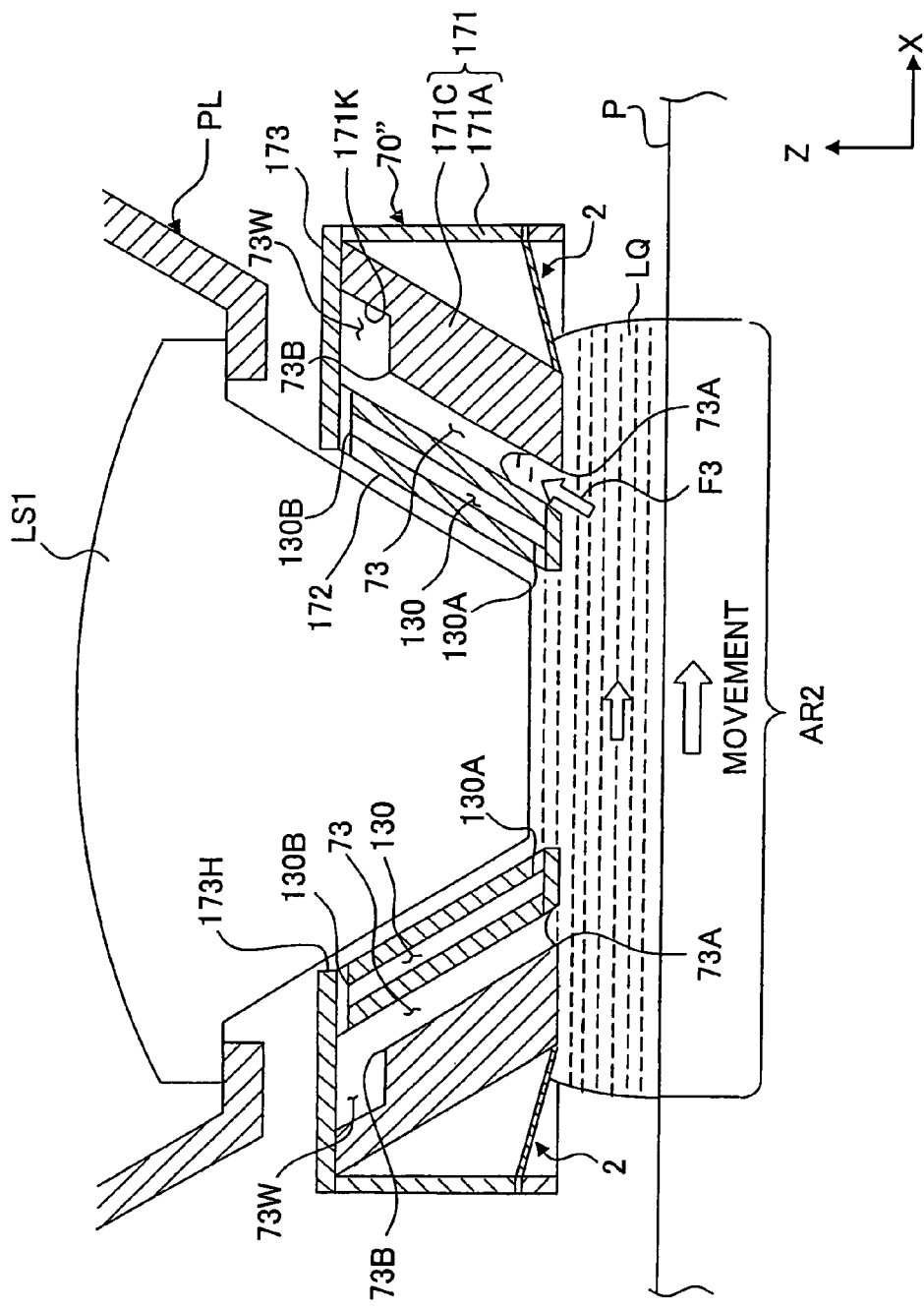
FIG. 22 shows a side sectional view illustrating those disposed in the vicinity of the nozzle member according to the eighth embodiment.

Next, an eighth embodiment of the present invention will be explained with reference to FIGS. 19, 20, 21, and 22. FIG. 19 shows, with partial cutout, a schematic perspective view illustrating those disposed in the vicinity of a nozzle member 70". FIG. 20 shows a perspective view illustrating the nozzle member 70" as viewed from the lower side. FIG. 21 shows a side sectional view taken in parallel to the YZ plane. FIG. 22 shows a side sectional view taken in parallel to the XZ plane. In the following description, constitutive parts, which are the same as or equivalent to those of the embodiments described above, are designated by the same reference numerals, and any explanation of which will be simplified or omitted.

The nozzle member 70" is constructed by combining a first member 171, a second member 172, and a third member 173. The nozzle member 70" is formed to be substantially circular as viewed in a plan view as a whole. The first member 171 has a side plate portion 171A and a thick-walled inclined plate portion 171C. The second member 172 has an inclined plate portion 172C and a bottom plate portion 172D connected to the lower end of the inclined plate portion 172C. The third member 173 is connected to the upper ends of the first member 171 and the second member 172. A hole 173H, in which the optical element LS1 is to be arranged, is formed at a central portion of the third member 173. The optical element LS1 is arranged inside the hole 70H which is defined by the hole 173H of the third member 173 and the inclined plate portion 172C of the second member 172. The side surface of the optical element LS1 arranged inside the hole 70H is opposite to the inner side surface 172T of the inclined plate portion 172C of the second member 172. A slit-shaped groove 73, which is annular as viewed in a plan view, is provided between the inner side surface 171T of the inclined plate portion 171C of the first member 171 and the outer side surface 172S of the inclined plate portion 172C of the second member 172. The groove 73 is formed to have an inclination of about 45 degrees with respect to the XY plane (surface of the substrate P).

A land surface 75 of the nozzle member 70", which is opposite to the surface of the substrate P supported by the substrate stage PST (upper surface of the substrate stage PST) and which is disposed most closely to the surface of the substrate P (upper surface of the substrate stage PST), is formed by the lower surface 171R of the inclined plate portion 171C of the first member 171 and the lower surface 172R of the bottom plate portion 172D of the second member 172. The land surface 75 is formed to surround the projection area AR1.

A portion of the bottom plate portion 172D for forming the land surface 75 is arranged between the substrate P (substrate stage PST) and the lower surface T1 on the side of the image plane of the optical element LS1 of the projection optical system PL in relation to the Z axis direction. The bottom plate portion 172D is provided to make no contact with the lower surface T1 of the optical element LS1 and the substrate P (substrate stage PST). The upper surface of the bottom plate portion 172D is arranged so that the upper surface of the bottom plate portion 172D is opposite to the lower surface T1 of the optical element LS1, and the upper surface of the bottom plate portion 172D is substantially in parallel to the lower surface of the optical element. A predetermined gap (space) G2 is formed between the end surface T1 of the projection optical system PL and the upper surface of the bottom plate portion 172D.

A space 24, which functions as the recovery flow passage, is formed for the first member 171. The liquid recovery port 22 is formed at the opening of the space 24. A liquid recovery port 22 is formed to be annular as viewed in a plan view to surround the opening 74 (projection area AR1), the groove 73, and the land surface 75. The other end of the recovery tube 23 is connected to a portion of the recovery flow passage (space) 24. A porous member 25, which has an inclined surface 2 opposite to the substrate P supported by the substrate stage PST, is arranged in the liquid recovery port 22.

The porous member 25 is attached to the liquid recovery port 22 so that the inner edge portion of the inclined surface 2 has approximately the same height as that of the lower surface 171R (land surface 75) of the first member 171, and the inner edge portion of the inclined surface 2 is continued to the lower surface 171R (land surface 75). A plurality of fin members 150 are provided radially on the inclined surface 2.

Slit-shaped through-holes 140, which penetrate in the inclination direction through the inclined plate portion 172C of the second member 172, are formed on the both sides, respectively, in the Y axis direction of the second member 172 with respect to the projection area AR1. The upper end 140B of the through-hole 140 is connected to the liquid supply section 11 via an unillustrated supply tube (supply flow passage), and the lower end 140A is connected to the gap (space) G2 between the bottom plate portion 172D and the lower surface T1 of the projection optical system PL. That is, the through-holes 140 function as the supply flow passages. The openings, which are formed at the lower ends 140A of the through-holes 140, function as the liquid supply ports for supplying the liquid LQ to the gap G2. The liquid supply ports 140A are provided on the both sides in the Y axis direction respectively while interposing the projection area AR1 onto which the exposure light beam EL is radiated. The liquid supply ports 140A are provided at the predetermined positions (first positions), respectively, disposed on the both sides with the optical path space for the exposure light beam EL intervening therebetween, and at the outside of the optical path space for the exposure light beam EL.

The liquid immersion mechanism 1 supplies the liquid LQ, fed from the liquid supply section 11, via the supply flow passages (through-holes) 140 from the liquid supply ports (lower ends) 140A to the internal space including the gap (space) G2 between the projection optical system PL and the bottom plate portion 172D. The supply flow passage 140 is formed to have an inclination of about 45 degrees with respect to the XY plane (surface of the substrate P). In order to determine the flow direction of the liquid LQ supplied to the upper surface of the bottom plate portion 172D from the liquid supply ports 140A, a fin-shaped member may be arranged for the liquid supply port 140A, or a fin-shaped projection may be provided on the upper surface of the bottom plate portion 172D.

Slit-shaped through-holes 130, which penetrate in the inclination direction through the inclined plate portion 172C of the second member 172, are formed on the both sides, respectively, in the X axis direction of the second member 172 with respect to the projection area AR1. A gap is formed between the third member 173 and a predetermined area of the upper surface of the second member 172 in which the upper end 130B of the through-hole 130 is formed. The upper end 130B of the through-hole 130 is open to the atmospheric air. The lower end 130A of the through-hole 130 is connected to the gap (space) G2 between the bottom plate portion 172D and the lower surface T1 of the projection optical system PL. Therefore, the gas present in the gap G2 can be discharged (exhausted) to the external space via the upper ends 130B of the through-holes 130. That is, the openings, which are formed at the lower ends 130A of the through-holes 130, function as the gas discharge ports for discharging the gas present in the gap G2. The through-holes 130 function as the discharge flow passages. The gas discharge ports (lower ends) 130A are connected to the gas present in the gap (space) G2, i.e., the gas around the image plane of the projection optical system PL. The gas discharge ports 130A are provided on the both sides, respectively, in the X axis direction while interposing the projection area AR1 onto which the exposure light beam EL is radiated. The gas discharge ports 130A are provided at the predetermined positions (second positions), respectively, which are disposed on the both sides with the optical path space for the exposure light beam EL intervening therebetween, at the outside of the optical path space for the exposure light beam EL.

As described above, the liquid supply ports 140A are provided at the predetermined positions (first positions) disposed outside the optical path space for the exposure light beam EL. The bottom plate portion 172D functions also as a guide member for guiding the flows of the liquid LQ supplied from the liquid supply ports 140A. The bottom plate portion (guide member) 172D is arranged to prevent the gas from staying or remaining in the liquid LQ in the optical path space for the exposure light beam EL. That is, the bottom plate portion 172D is arranged so that the liquid LQ, which is supplied from the liquid supply ports 140A provided at the first positions disposed outside the optical path space for the exposure light beam EL, is allowed to flow, via the optical path space for the exposure light beam EL, toward the second positions which are different from the first positions disposed outside the optical path space. The bottom plate portion 172D has the land surface (flat portion) 75 which is arranged opposite to the substrate P. The bottom plate portion 172D also functions to stably fill the optical path for the exposure light beam EL with the liquid LQ in the same manner as in the embodiment described above.

Figure 23:
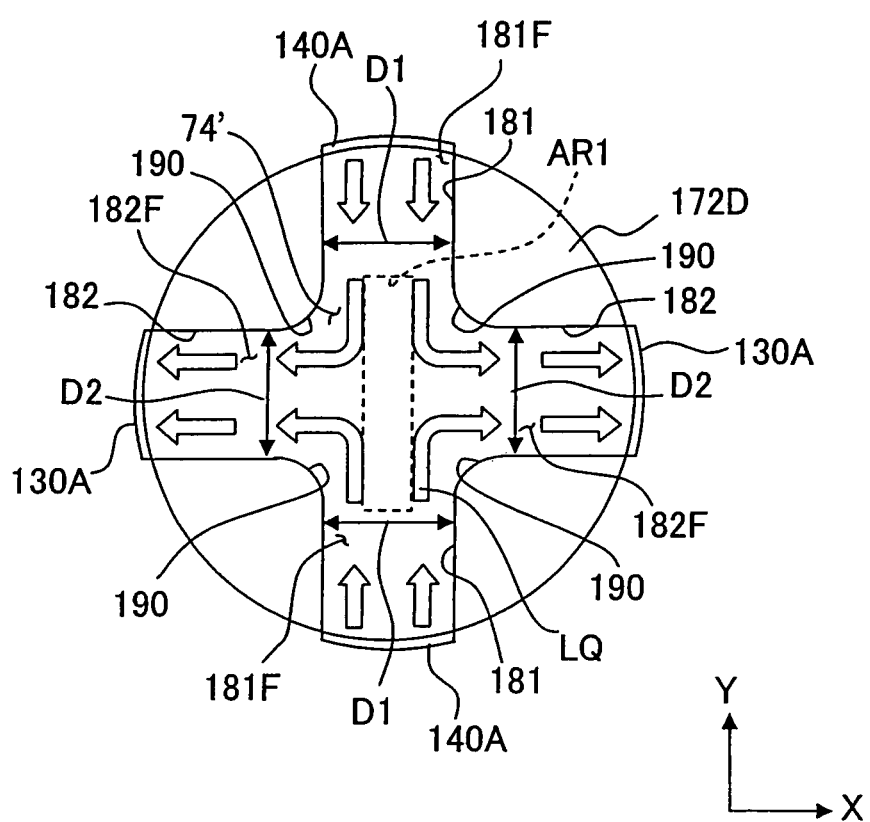
FIG. 23 shows a guide member according to the eighth embodiment.

FIG. 23 shows a plan view illustrating the bottom plate portion (guide member) 172D. In this embodiment, the gas discharge ports 130A are provided at the second positions disposed outside the optical path space for the exposure light beam EL. The bottom plate portion 172D is arranged so that the liquid LQ, which is supplied from the liquid supply ports 140A, is allowed to flow toward the second positions at which the gas discharge ports 130A are provided. The guide member 172D makes the liquid LQ to flow so that any vortex flow is not formed in the optical path space for the exposure light beam EL. That is, the bottom plate portion 172D has an opening 74' which is formed so that the liquid LQ, which is supplied from the first positions at which the liquid supply ports 140A are arranged, is allowed to flow toward the second positions at which the gas discharge ports 130A are provided. The formation of any vortex flow is avoided in the optical path space for the exposure light beam EL.

The bottom plate portion 172D includes first guide portions 181 which form the flows directed from the first positions at which the liquid supply ports 140A are provided toward the optical path space for the exposure light beam EL (projection area AR1), and second guide portions 182 which form the flows directed from the optical path space for the exposure light beam EL toward the second positions at which the gas discharge ports 130A are provided. That is, flow passages 181F, which make the liquid LQ to flow from the liquid supply ports 140A toward the optical path space for the exposure light beam EL, are formed by the first guide portions 181. Further, flow passages 182F, which make the liquid LQ to flow from the optical path space for the exposure light beam EL toward the second positions (gas discharge ports 130A), are formed by the second guide portions 182.

The flow passages 181F formed by the first guide portions 181 intersect the flow passages 182F formed by the second guide portions 182. The flow passages 181F formed by the first guide portions 181 allow the liquid LQ to flow substantially in the Y axis direction. The flow passages 182F formed by the second guide portions 182 make the liquid LQ to flow substantially in the X axis direction. The opening 74', which has a substantially cross-shaped form as viewed in a plan view, is formed by the first guide portions 181 and the second guide portions 182. The opening 74' is arranged on the side of the image plane of the projection optical system PL. The opening 74' is provided so that the exposure light beam EL passes through a substantially central portion of the opening 74' formed to have the substantially cross-shaped form. That is, the optical path space for the exposure light beam EL is set at the portion of intersection between the flow passages 181F formed by the first guide portions 181 and the flow passages 182F formed by the second guide portions 182.

In this embodiment, the flow passages 181F formed by the first guide portions 181 are substantially perpendicular to the flow passages 182F formed by the second guide portions 182. A width D1 of the flow passages 181F formed by the first guide portions 181 is approximately the same as a width D2 of the flow passages 182F formed by the second guide portions 182. In this embodiment, connecting portions 190 between the first guide portions 181 and the second guide portions 182 are formed to be curved (circular arc-shaped).

The liquid supply ports 140A supply the liquid LQ to the internal space including the gap (space) G2 between the bottom plate portion 172D and the lower surface T1 of the projection optical system PL. The liquid LQ, which is supplied to the gap G2 from the liquid supply ports 140A, is allowed to flow toward the optical path space for the exposure light-beam EL while being guided by the first guide portions 181. The liquid LQ passes through the optical path space for the exposure light beam EL, and then the liquid LQ is allowed to flow toward the outside of the optical path space for the exposure light beam EL while being guided by the second guide portions 182. That is, the flow passages for the liquid LQ are bent at the position of intersection between the first guide portions 181 and the second guide portions 182 or in the vicinity thereof. In another viewpoint, the flow passages for the liquid LQ are bent in the optical path space or in the vicinity thereof. The liquid immersion mechanism 1 suppresses the formation of the vortex flow in the optical path space for the exposure light beam EL by allowing the liquid LQ to flow while being guided by the first and second guide portions 181, 182 of the bottom plate portion 172D. Accordingly, even when the gas (bubble) is present in the optical path space for the exposure light beam EL, then the gas (bubble) is discharged to the second positions disposed outside the optical path space for the exposure light beam EL, and the gas (babble) is prevent from remaining in the optical path space for the exposure light beam EL.

As shown in FIGS. 19 and 21, for example, the groove 73, which is disposed between the first member 171 and the second member 172, is formed to surround the opening 74' including the optical path space for the exposure light beam EL. Further, the groove 73 is formed to surround the lower surface 172R for constructing a part of the land surface 75 as well. An opening 73A, which is arranged opposite to the substrate P (upper surface of the substrate stage PST), is formed at the lower end of the groove 73. The opening 73A is formed to be substantially annular as viewed in a plan view. On the other hand, an opening 73B, which is substantially annular as viewed in a plan view, is also formed at the upper end of the groove 73. A cutout 171K is formed at a portion of the upper end of the inclined plate portion 171C of the first member 171, the portion being opposite to the second member 172. A wide width portion is defined at the upper end of the groove 73 by the cutout 171K. A space 73W is defined between the wide width portion and the third member 173. The opening 73B, which is disposed at the upper end of the groove 73, is arranged inside the space 73W. The space 73W is connected via the groove 73 to the opening 73A which is provided at the lower end of the groove 73 (in the vicinity of the image plane of the projection optical system PL). That is, the space 73W is communicated with the gas around the image plane of the projection optical system PL via the groove 73 (opening 73A).

As shown in FIG. 21, a communication passage 131', which is connected to the space 73W, is formed at a portion of the third member 173. The communication passage 131' is connected via a piping 133 to, a suction unit 132 including a vacuum system. The communication passage 131' and the suction unit 132 are used to recover the liquid LQ via the groove 73 when the liquid LQ, which is between the nozzle member 70" and the substrate P (substrate stage PST), is completely recovered.

A hole 134, which makes the communication between the inside and the outside of the space 73W, is formed at a position of the third member 173, the position being distinct or different from the communication passage 131'. The diameter (size) of the hole 134 is smaller than the diameter (size) of the communication passage 131' and sufficiently smaller than the opening 73A. In this embodiment, the diameter of the hole 134 is about 1 mm. The space 73W is open to the atmospheric air by the hole 134. Accordingly, the gas (space G2), which is around the image plane of the projection optical system PL, is also open to the atmospheric air via the opening 73A, the groove 73, and the space 73W. Accordingly, a part of the liquid LQ between the nozzle member 70" and the substrate P (substrate stage PST) can enter and exist the inside of the groove 73. Therefore, even when the size (diameter) of the nozzle member 70" is small, it is possible to suppress the outflow of the liquid LQ to the outside of the liquid recovery port 22.

Next, an explanation will be made about the operation of the liquid immersion mechanism 1 having the nozzle member 70" constructed as described above. In order to supply the liquid LQ onto the substrate P, the control unit CONT drives the liquid supply section 11 to feed the liquid LQ from the liquid supply section 11. The liquid LQ, which is fed from the liquid supply section 11, is allowed to flow through the supply tube, and then the liquid LQ flows into the upper ends 140B of the supply flow passages 140 of the nozzle member 70". The liquid LQ, which flows into the upper ends 140B of the supply flow passages 140, is allowed to flow through the supply flow passages 140. Then, the liquid LQ is supplied from the liquid supply ports 140A to the space G2 between the bottom plate portion 172D and the end surface T1 of the projection optical system PL. The gas portion, which has been present in the space G2 before the liquid LQ is supplied to the space G2, is discharged to the outside via the through-holes 130 and the opening 74'. Therefore, it is possible to avoid the occurrence of the inconvenience which would be otherwise caused such that the gas stays or remains in the space G2 upon the start of the supply of the liquid LQ to the space G2. It is possible to avoid the occurrence of the inconvenience which would be otherwise caused such that the gas portion (bubble) is generated in the liquid LQ. The liquid LQ, which is fed from the liquid supply section 11, flows through the inside of the grooves (supply flow passages) 140. Therefore, the liquid LQ is supplied to the space G2 without exerting any force, for example, on the side surface of the optical element LS1. Further, the liquid LQ makes no contact with the side surface of the optical element LS1. Therefore, for example, even when the side surface of the optical element LS1 is coated with a predetermined functional material, any influence, which would be otherwise exerted on the functional material, is suppressed.

The space G2 is filled with liquid LQ which is supplied to the space G2. After that, the liquid LQ is allowed to flow via the opening 74' into the space between the land surface 75 and the substrate P (substrate stage PST). In this case, the liquid recovery mechanism 20 recovers the liquid LQ on the substrate P in a predetermined amount per unit time. Therefore, the liquid immersion area AR2 having a desired size is formed on the substrate P by the liquid LQ allowed to flow via the opening 74' into the space between the land surface 75 and the substrate P (substrate stage PST).

The liquid LQ, which is supplied from the liquid supply ports 140A to the space G2, is allowed to flow toward the optical path space for the exposure light beam EL (projection area AR1) while being guided by the first guide portions 181. After that, the liquid LQ is allowed to flow to the outside of the optical path space for the exposure light beam EL while being guided by the second guide portions 182. Therefore, even if any gas portion (bubble) is generated in the liquid LQ, the bubble can be discharge to the outside of the optical path space for the exposure light beam EL by the flow of the liquid LQ. The bottom plate portion 172D allows the liquid LQ to flow so that any vortex flow is not formed in the optical path space for the exposure light beam EL. Therefore, it is possible to prevent the bubble from staying or remaining in the optical path space for the exposure light beam EL. The bottom plate portion 172D allows the liquid LQ to flow toward the gas discharge ports 130A. Therefore, any gas portion (bubble), which is present in the liquid LQ, is smoothly discharged to the outside via the gas discharge ports 130A. Even if any gas portion (bubble) is present in the liquid LQ in the space between the land surface 75 and the substrate P (substrate stage PST), the liquid LQ, which is in the space between the land surface 75 and the substrate P (substrate stage PST), is recovered together with the gas portion (bubble) via the recovery port 22.

The communication passage 131', which is connected to the groove 73, is closed, and the driving of the suction unit 132 is stopped during the period in which the liquid immersion area AR2 is formed, for example, during the period in which the substrate P is subjected to the liquid immersion exposure. Therefore, even when the substrate P (substrate stage PST) is moved with respect to the liquid immersion area AR2 formed to cover the projection area AR1, a part of the liquid LQ of the liquid immersion area AR2 enters and exits the groove 73 which is open to the atmospheric air via the hole 134 (see the arrow F3 shown in FIG. 22). Therefore, it is possible to avoid the occurrence of the inconvenience which would be otherwise caused, for example, such that the liquid immersion area AR2 is expanded and the liquid LQ of the liquid immersion area AR2 outflows.

When all of the liquid LQ between the nozzle member 70" and the substrate P (substrate stage PST) is recovered, for example, when the liquid immersion exposure is completed for the substrate P, then the control unit CONT performs the following operation. That is, the control unit CONT performs the liquid recovery operation via the liquid recovery port 22 by the liquid recovery mechanism 20, and opens the communication passage 131', which is connected to the groove 73, and the control unit CONT drives the suction unit 132 so that the internal space of the groove 73 is allowed to have the negative pressure, while concurrently performing the liquid recovery operation via the opening 73A of the groove 73. The liquid LQ, which is between the nozzle member 70" and the substrate P (substrate stage PST), can be reliably recovered in a shorter period of time by also using the opening 73A disposed most closely to the substrate P (substrate stage PST) as well, as described above. In this case, the hole 134, which is provided to be open to the atmospheric air, is smaller in size than the opening 73A which functions as the recovery port for the liquid LQ. Therefore, the liquid LQ can be recovered while allowing the interior of the groove 73 to have the sufficient negative pressure. When all of the liquid LQ, which is between the nozzle member 70" and the substrate P (substrate stage PST), is recovered, the gas may be blown from the liquid supply ports 140 in addition to the liquid recovery operation using the liquid recovery port 22 and the opening 73A.

The communication passage 131', which is connected to the groove 73, may be opened, and the suction unit 132 may be driven as well, to such an extent that the state (for example, the shape) of the liquid immersion area AR2 can be maintained during the period in which the liquid immersion area AR2 is formed, for example, during the period in which the substrate P is subjected to the liquid immersion exposure. Accordingly, the bubble present in the liquid LQ can be recovered via the groove 73.

Figure 24:
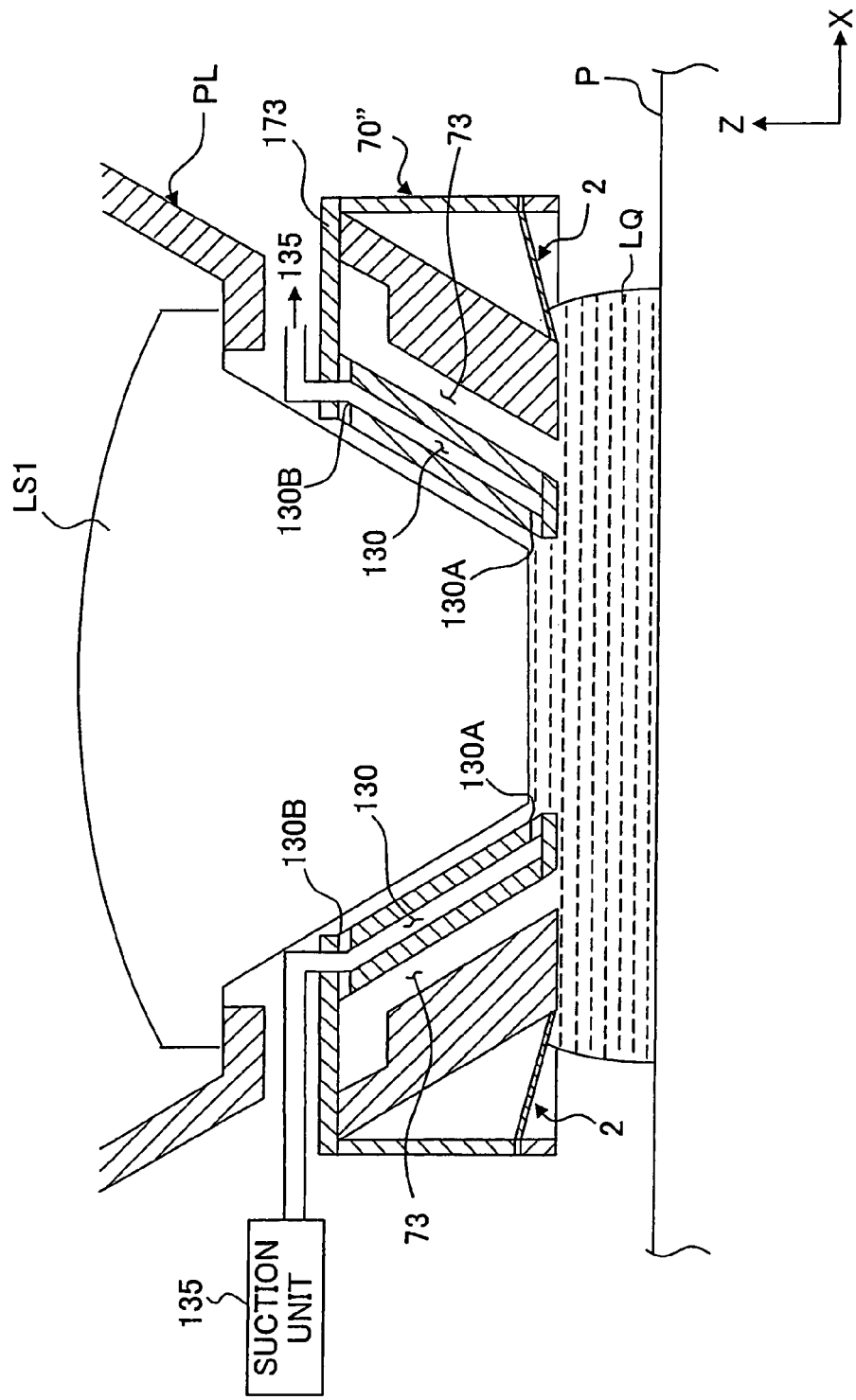
FIG. 24 shows a side sectional view illustrating those disposed in the vicinity of the nozzle member according to the eighth embodiment.

As shown in FIG. 24, the upper ends 130B of the grooves 130 may be connected to the suction unit (suction system) 135, and the gas discharge ports 130A may be connected to the suction unit 135 via the grooves 130. For example, the suction unit 135 may be driven to provide the negative pressure at the inside of the grooves 130 upon the start of the supply of the liquid LQ for forming the liquid immersion area AR2, and the gas present in the space G2 may be forcibly discharged. In this way, it is also possible to avoid the occurrence of the inconvenience which would be otherwise caused such that the gas stays or remains in the space G2. It is possible to avoid the inconvenience which would be otherwise caused such that any gas portion (bubble) is generated or formed in the liquid LQ. The substrate P may be subjected to the liquid immersion exposure while driving the suction unit 135. The driving of the suction unit 135 may be stopped during the liquid immersion exposure for the substrate P.

The nozzle member 70" is constructed of the three members, i.e., the first, second, and third members 171, 172, 173. However, the nozzle member 70" may be constructed of one member. Alternatively, the nozzle member 70" may be constructed of a plurality of members other than the three members.

Ninth Embodiment

Figure 25:
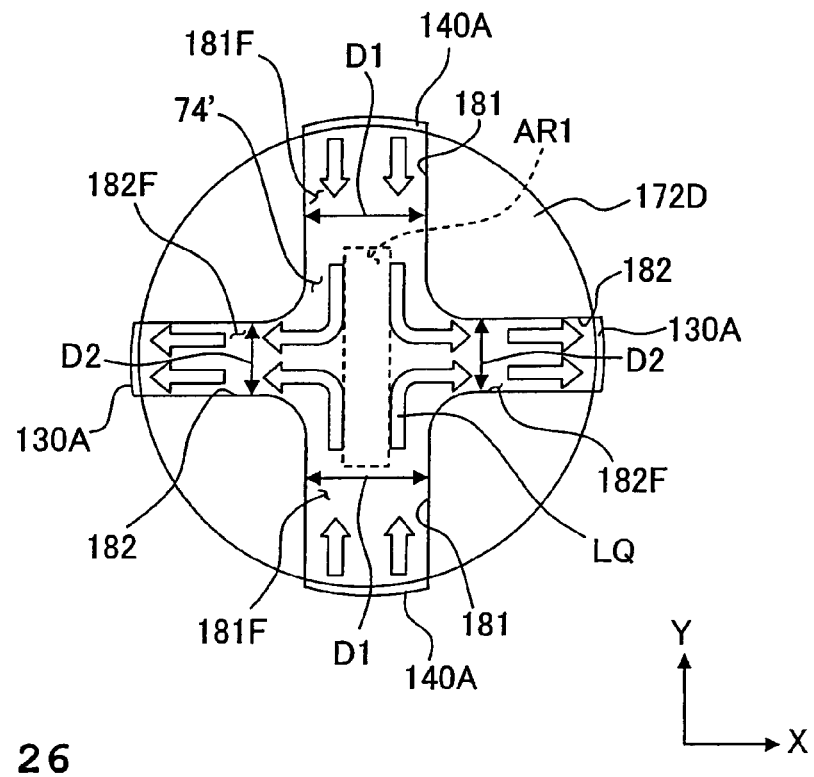
FIG. 25 shows a plan view illustrating a guide member according to a ninth embodiment.

FIG. 25 shows a ninth embodiment. The feature of this embodiment is that the width D2 of the flow passages 182F formed by the second guide portions 182 is smaller than the width D1 of the flow passages 181F formed by the first guide portions 181. Accordingly, it is possible to increase the flow rate of the liquid LQ allowed to flow through the flow passages 182F formed by the second guide portions 182 as compared with the flow rate of the liquid LQ allowed to flow through the flow passages 181F formed by the first guide portions 181. Therefore, the gas (bubble), which is present in the optical path space for the exposure light beam EL, can be discharged quickly and smoothly to the outside of the optical path space for the exposure light beam EL by the flow of the liquid LQ allowed to have a high velocity.

Tenth Embodiment

Figure 26:
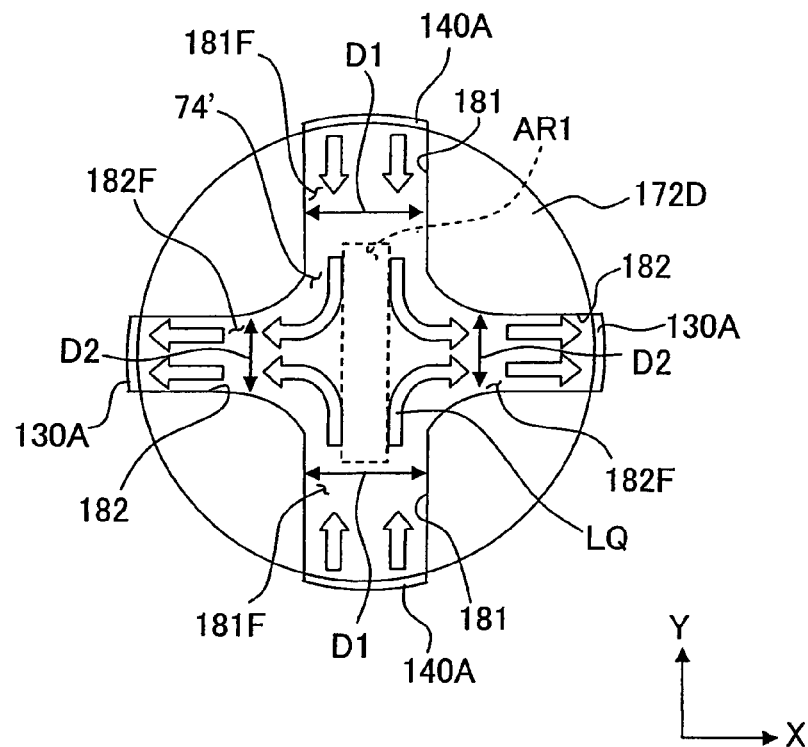
FIG. 26 shows a plan view illustrating a guide member according to a tenth embodiment.

FIG. 26 shows a tenth embodiment. The feature of this embodiment is that the width D2 of the flow passages 182F formed by the second guide portions 182 is formed and progressively narrowed from the optical path space for the exposure light beam EL (upstream side of the projection area AR1 or the second guide portion 182) toward the second positions at which the gas discharge ports 130A are provided (downstream side of the second guide portion 182). Even in the case of the arrangement as described above, it is possible to increase the flow rate of the liquid LQ allowed to flow through the flow passages 182F formed by the second guide portions 182 as compared with the flow rate of the liquid LQ allowed to flow through the flow passages 181F formed by the first guide portions 181. The gas (bubble) can be discharged quickly and smoothly to the outside of the optical path space for the exposure light beam EL.

Eleventh Embodiment

Figure 27:
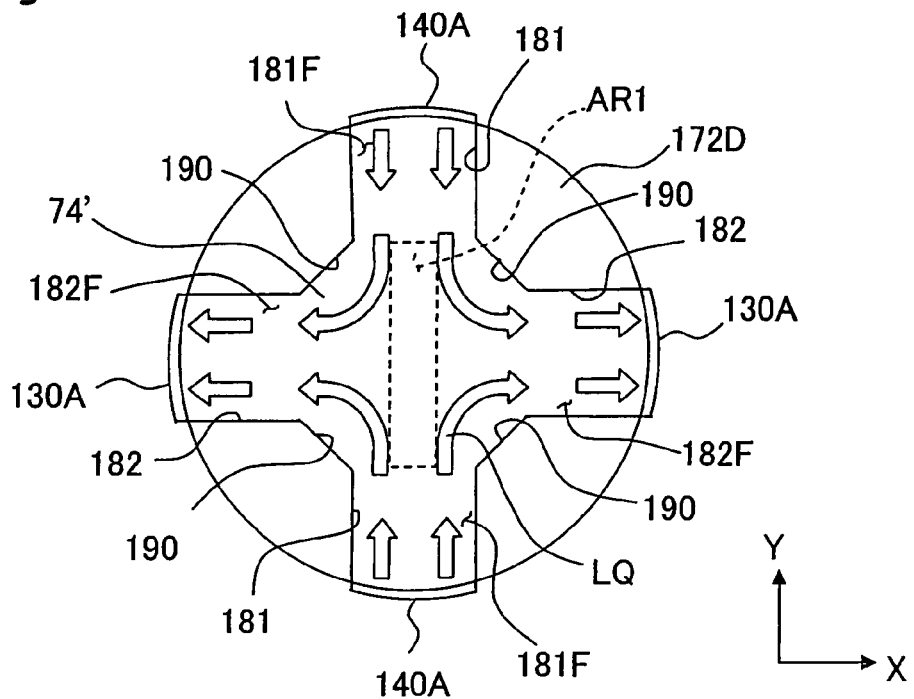
FIG. 27 shows a plan view illustrating a guide member according to an eleventh embodiment.

FIG. 27 shows an eleventh embodiment. The feature of this embodiment is that connecting portions 190 between the first guide portions 181 and the second guide portions 182 are formed to be linear, and corners are formed between the first guide portions 181 and the second guide portions 182. Even in the case of the arrangement as described above, it is possible to suppress the formation of the vortex flow, and it is possible to prevent the gas (bubble) from staying or remaining in the liquid LQ in the optical path space for the exposure light beam EL. The gas (bubble) can be discharged to the outside of the optical path space for the exposure light beam EL.

Twelfth Embodiment

Figure 28:
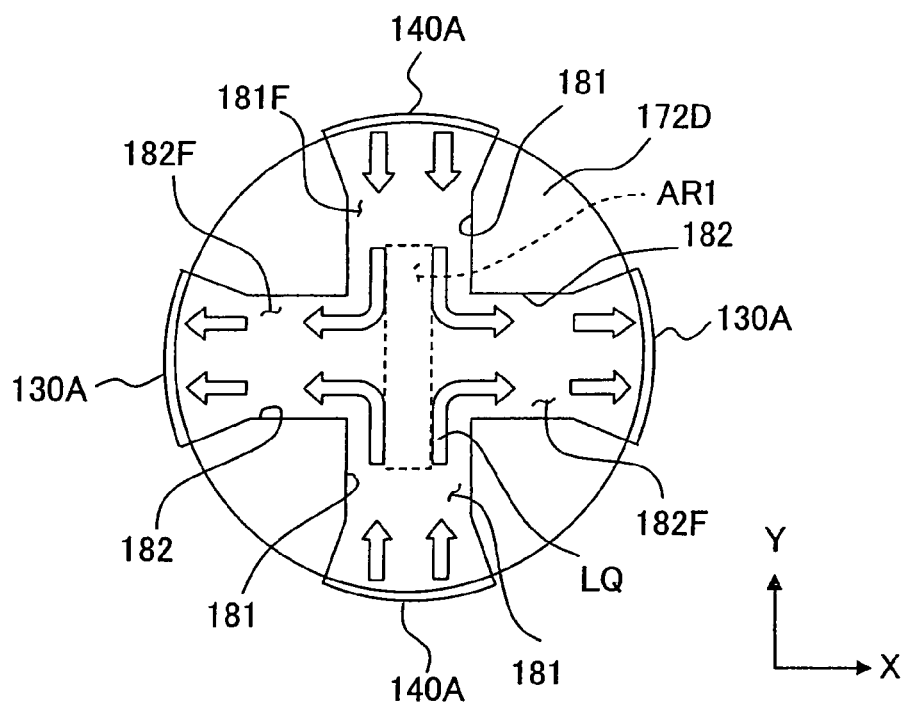
FIG. 28 shows a plan view illustrating a guide member according to a twelfth embodiment.

FIG. 28 shows a twelfth embodiment. The feature of this embodiment is that predetermined areas (flow passage widths thereof) of the flow passages 181F formed by the first guide portions 181, which are disposed in the vicinity of the liquid supply ports 140A, are formed to be progressively narrowed from the liquid supply ports 140A toward the optical path space for the exposure light beam EL (projection area AR1) (progressively narrowed from the upstream to the downstream), and predetermined areas (flow passage widths thereof) of the flow passages 182F formed by the second guide portions 182, which are disposed in the vicinity of the gas discharge ports 130A, are formed to be progressively expanded or widened from the optical path space for the exposure light beam EL (projection area AR1) toward the gas discharge ports 130A (progressively expanded or widened from the upstream to the downstream). In this embodiment, the first guide portions 181 intersect the second guide portions 182 substantially perpendicularly. Even in the case of the arrangement as described above, it is possible to suppress the formation of the vortex flow, and it is possible to prevent the gas (bubble) from staying or remaining in the liquid LQ in the optical path space for the exposure light beam EL. The gas (bubble) can be discharged to the outside of the optical path space for the exposure light beam EL.

Thirteenth Embodiment

Figure 29:
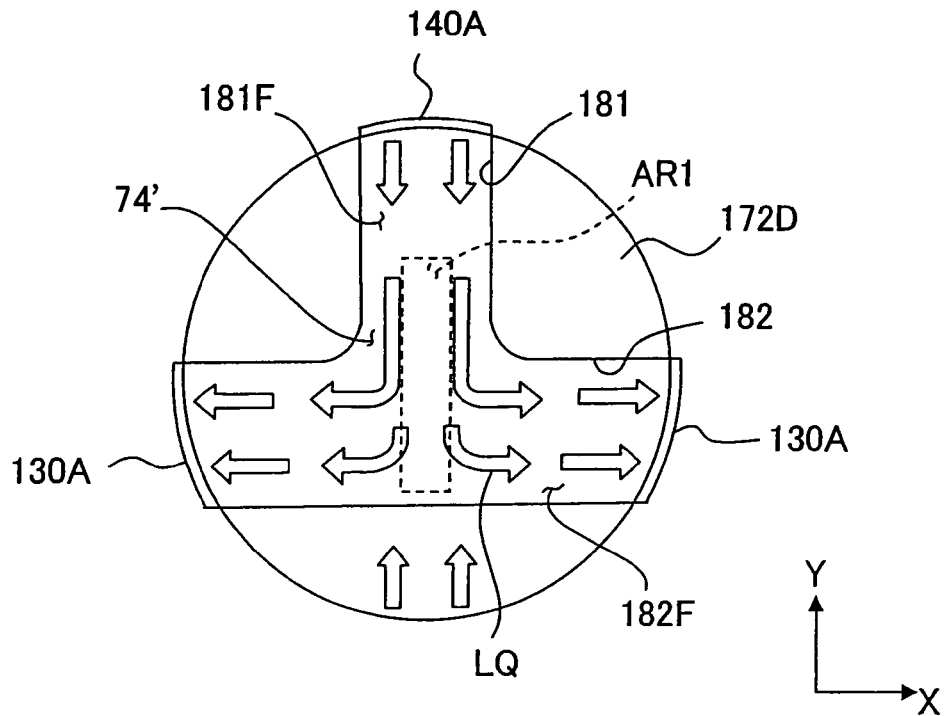
FIG. 29 shows a plan view illustrating a guide member according to a thirteenth embodiment.

FIG. 29 shows a thirteenth embodiment. The feature of this embodiment is that only one liquid supply port 140A is provided. The flow passage 181F formed by the first guide portion 181 is substantially perpendicular to the flow passages 182F formed by the second guide portions 182. The opening 74' is formed to be substantially T-shaped as viewed in a plan view. Even in the case of the arrangement as described above, it is possible to suppress the formation of the vortex flow, and it is possible to prevent the gas (bubble) from staying or remaining in the liquid LQ in the optical path space for the exposure light beam EL. The gas (bubble) can be discharged to the outside of the optical path space for the exposure light beam EL.

Fourteenth Embodiment

Figure 30:
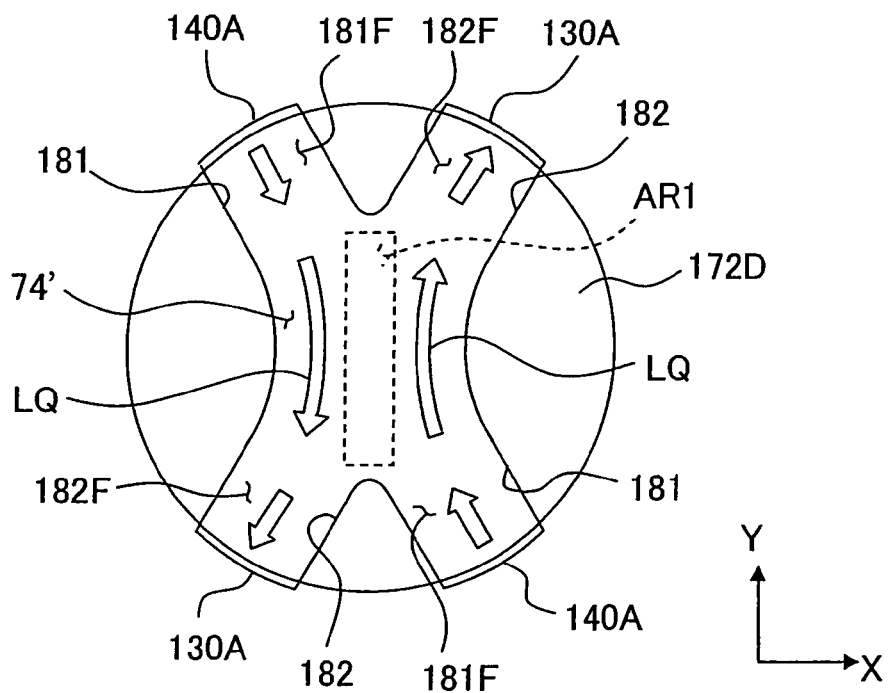
FIG. 30 shows a plan view illustrating a guide member according to a fourteenth embodiment.

FIG. 30 shows a fourteenth embodiment. The feature of this embodiment is that the flow passages 181F formed by the first guide portions 181 are not perpendicular to the flow passages 182F formed by the second guide portions 182, and they make the intersection at a predetermined angle other than 90 degrees. The liquid supply ports 140A (first positions) are provided at positions deviated in the θZ direction from the positions aligned with the projection area AR1 in relation to the Y axis direction, in the areas disposed outside the optical path space for the exposure light beam EL (projection area AR1). The gas discharge ports 130A (second positions) are also provided at positions deviated in the Oz direction from the positions aligned with the projection area AR1 in relation to the X axis direction. Even in the case of the arrangement as described above, it is possible to suppress the formation of the vortex flow, and it is possible to prevent the gas (bubble) from staying in the liquid LQ in the optical path space for the exposure light beam EL. The gas (bubble) can be discharged to the outside of the optical path space for the exposure light beam EL.

Fifteenth Embodiment

Figure 31:
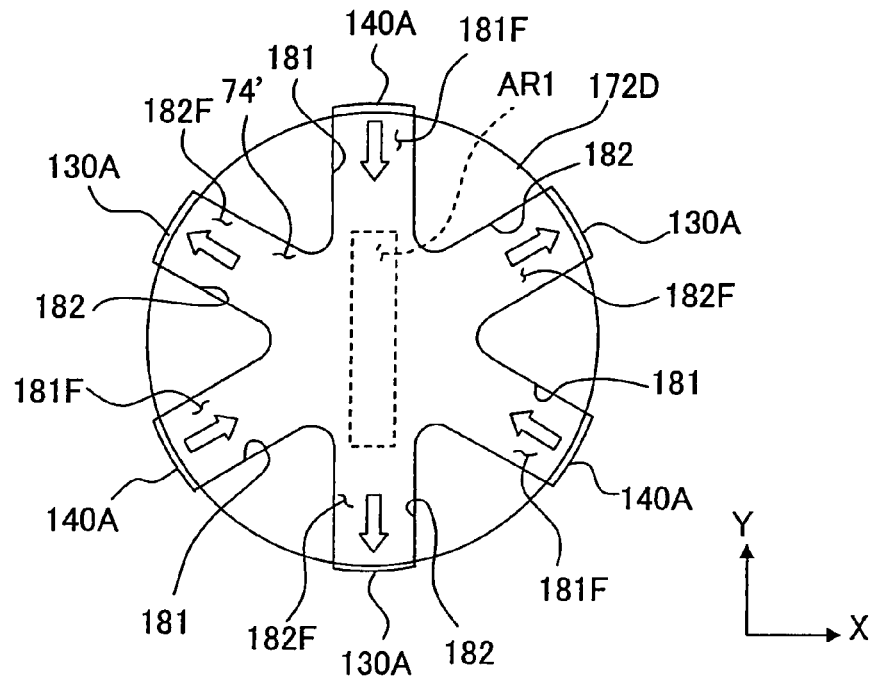
FIG. 31 shows a plan view illustrating a guide member according to a fifteenth embodiment.

FIG. 31 shows a fifteenth embodiment. The feature of this embodiment is that the liquid supply ports 140A and the gas discharge ports 130A are provided at three predetermined positions, respectively, in the areas disposed outside the optical path space for the exposure light beam EL. In this case, the liquid supply ports 140A and the gas discharge ports 130A are alternately arranged at substantially equal intervals to surround the optical axis AX of the projection optical system PL in the area disposed outside the optical path space for the exposure light beam EL (projection area AR1). The plurality of flow passages 181F formed by the first guide portions 181 intersect the plurality of flow passages 182F formed by the second guide portions 182 at predetermined angles, respectively. Even in the case of the arrangement as described above, it is possible to suppress the formation of the vortex flow, and it is possible to prevent the gas (bubble) from staying or remaining in the liquid LQ in the optical path space for the exposure light beam EL. The gas (bubble) can be discharged to the outside of the optical path space for the exposure light beam EL.

Sixteenth Embodiment

Figure 32:
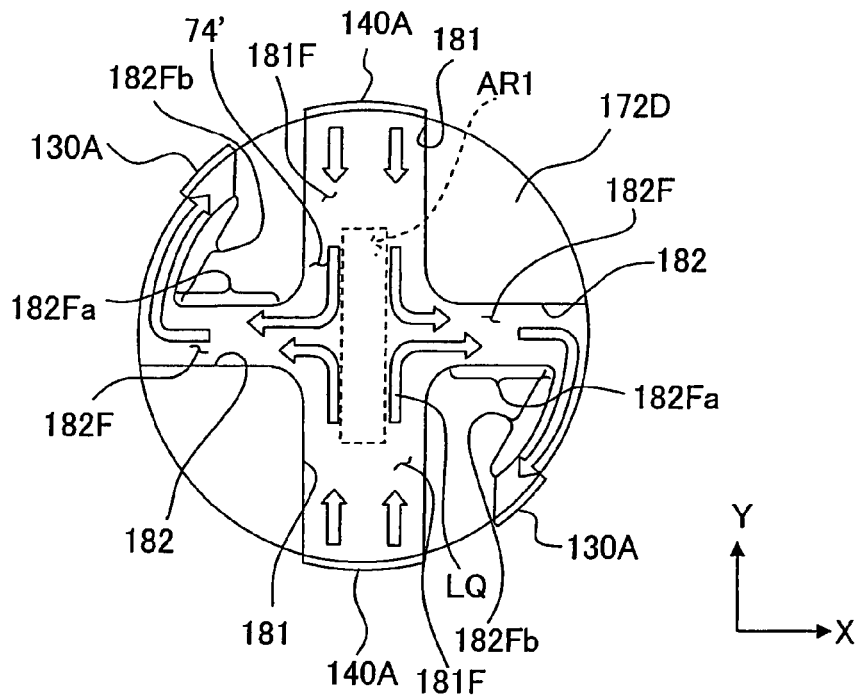
FIG. 32 shows a plan view illustrating a guide member according to a sixteenth embodiment.

FIG. 32 shows a sixteenth embodiment. The feature of this embodiment is that the liquid supply ports 140A (first positions) are provided at positions aligned with the projection area AR1 in relation to the Y axis direction in the areas disposed outside the optical path space for the exposure light beam EL (projection area AR1), and the gas discharge ports 130A (second positions) are provided at positions deviated in the θZ direction from the positions aligned with the projection area AR1 in relation to the X axis direction. In this embodiment, the gas discharge ports 130A are provided at the positions deviated by approximately 45 degrees in the θZ direction from the positions aligned with the projection area AR1 in relation to the X axis direction in the areas disposed outside the optical path space for the exposure light beam EL (projection area AR1). The bottom plate portion (guide member) 172D has the first guide portions 181 which form the flows directed from the liquid supply ports 140A toward the optical path space for the exposure light beam EL, and the second guide portions 182 which form the flows directed from the optical path space for the exposure light beam EL toward the gas discharge ports 130A. The flow passages 181F, which are formed by the first guide portions 181, allow the liquid LQ to flow substantially in the Y axis direction. On the other hand, the flow passages 182F, which are formed by the second guide portions 182, have first areas 182Fa which are perpendicular to the flow passages 181F and which allow the liquid LQ to flow substantially in the X axis direction and second areas 182Fb which allow the liquid LQ, allowed to flow through the first areas 182Fa, to flow toward the gas discharge ports 130A. The opening 74', which is substantially cross-shaped as viewed in a plan view, is formed by the flow passages 181F and the first areas 182Fa of the flow passages 182F. According to the arrangement as described above, even when the positions for providing the liquid supply ports 140A and the gas discharge ports 130A are restricted, then it is possible to suppress the formation of the vortex flow, and it is possible to prevent the gas (bubble) from staying in the liquid LQ in the optical path space for the exposure light beam EL. The gas (bubble) can be discharged to the outside of the optical path space for the exposure light beam EL.

For example, the numbers and the arrangement of the liquid supply ports 140A and the gas discharge ports 130A and the shapes of the flow passages 181F, 182F corresponding to the liquid supply ports 140A and the gas discharge ports 130A can be arbitrarily set provided that the formation of the vortex flow can be suppressed, and the gas (bubble) can be discharged to the outside of the optical path space for the exposure light beam EL. For example, a plurality of, i.e., four or more of the liquid supply ports 140A and the gas discharge ports 130A may be provided. The numbers of the liquid supply ports 140A and the gas discharge ports 130A may be different from each other. The liquid supply ports 140A and the gas discharge ports 130A may be arranged at unequal intervals. For example, it is preferable that the numbers and the arrangement of the liquid supply ports 140A and the gas discharge ports 130A and the shapes of the flow passages 181F, 182F corresponding to the liquid supply ports 140A and the gas discharge ports 130A are optimized on the basis of a result of an experiment or simulation so that the formation of the vortex flow can be suppressed, and the gas (bubble) can be discharged to the outside of the optical path space for the exposure light beam EL.

In the eighth to sixteenth embodiments described above, the liquid immersion mechanism 1 makes the liquid LQ, supplied from the liquid supply ports 140A provided at the first positions, to flow toward the gas discharge ports 130A provided at the second positions by the bottom plate portion (guide member) 172D. However, it is also allowable that the gas discharge ports 130A are absent at the second positions. Even when the gas discharge ports 130A are absent, the gas portion (bubble), which exists in the optical path space for the exposure light beam EL, can be discharged to the outside of the optical path space for the exposure light beam EL by the flow of the liquid LQ. It is possible to prevent the gas from staying in the liquid LQ in the optical path space for the exposure light beam EL. On the other hand, when the gas discharge ports 130A are provided at the second positions, it is possible to smoothly discharge the gas from the optical path space for the exposure light beam EL.

In the eighth to sixteenth embodiments described above, the liquid immersion mechanism 1 supplies the liquid LQ in the Y axis direction to the projection area AR1. However, for example, the liquid supply ports 140A may be provided on the both sides, respectively, in the X axis direction with respect to the projection area AR1, and the liquid LQ may be supplied in the X axis direction to the projection area AR1.

In the first to sixteenth embodiments described above, the inclined surface (lower surface of the porous member), which is formed on the lower surface of the nozzle member 70, may be a curved surface. The wall portion 76 may be provided at the circumferential edge of the lower surface 2 of the porous member 25 in the second to fourth embodiments explained with reference to FIGS. 9 to 11.

In the first to sixteenth embodiments described above, the porous member 25 is arranged in the liquid recovery port 22. However, the porous member 25 may be omitted. Even in such an arrangement, for example, when an inclined surface, in which the distance with respect to the surface of the substrate P is increased at positions separated farther from the optical axis AX of the exposure light beam EL, is provided on the lower surface of the nozzle member 70, and the liquid recovery port is provided at a predetermined position of the inclined surface, then the shape of the interface LG can be maintained, and it is possible to avoid the inconvenience which would be otherwise caused, for example, such that the bubble is generated in the liquid LQ of the liquid immersion area AR2. Further, the size of the liquid immersion area AR2 can be decreased as well. In the first to sixteenth embodiments described above, the liquid recovery port is provided on the inclined surface (lower surface of the porous member) disposed on the lower surface of the nozzle member 70. However, it is also allowable that the inclined surface is not formed on the lower surface of the nozzle member 70, and the liquid recovery port is provided on the surface which is substantially parallel to (flush with) the land surface 75, provided that the liquid immersion area AR2 of the liquid LQ can be maintained in the desired state. That is, the liquid recovery port may be provided on the surface substantially parallel to (for example, flush with) the land surface 75, provided that the liquid LQ can be recovered without causing any leakage even when the movement velocity of the substrate P is increased, for example, when the contact angle of the liquid LQ with respect to the substrate P is large, and/or when the ability to recover the liquid LQ from the liquid recovery port 22 is high.

In the first to sixteenth embodiments described above, the wall portion 76 is provided at the circumferential edge of the inclined surface (lower surface of the porous member) formed on the lower surface of the nozzle member 70. However, when the leakage of the liquid LQ can be suppressed, it is also possible to omit the wall portion 76. In the first to sixteenth embodiments described above, the groove 73 having the opening 73A opposed to the substrate P is provided for the nozzle member. However, the groove 73 may be omitted. In this case, all of the liquid LQ on the side of the image plane of the projection optical system PL may be recovered by using the liquid recovery port 22 in order to provide the non-liquid immersion state for the space on the side of the image plane of the projection optical system PL. In this case, when the opening, which is connected to the space G2 between the optical element LS1 and the upper surface of the bottom plate portion 72D, is formed as in the sixth to sixteenth embodiments, the liquid LQ may be recovered from the opening concurrently with the liquid recovery operation to be performed with the liquid recovery port 22.

In the first to sixth embodiments described above, the nozzle member 70 has the land surface (flat portion) 75 such that a portion thereof is formed between the projection optical system PL and the substrate P, and the inclined surface (lower surface of the porous member 25) is formed at the outside thereof. However, a portion of the land surface may be arranged outside (around) the end surface T1 of the projection optical system PL with respect to the optical axis of the projection optical system PL, instead of arranging the portion of the land surface under the projection optical system PL. In this case, the land surface 75 may be substantially flush with the end surface T1 of the projection optical system PL, or the position of the land surface 75 in the Z axis direction may be separated in the +Z direction or in the −Z direction with respect to the end surface T1 of the projection optical system PL.

In the first to fifth embodiments described above, the liquid supply port 12 is formed to have the annular slit-shaped form to surround the projection area AR1. However, a plurality of supply ports, which are separated and away from each other, may be provided. In this case, the positions of the supply ports are not specifically limited. However, the supply ports may be provided one by one on the both sides of the projection area AR1 (both sides in the X axis direction or both sides in the Y axis direction). Alternatively, the supply ports may be provided one by one (four in total) on the both sides in the X axis direction and the Y axis direction of the projection area AR1. Only one supply port may be provided at a position separated in a predetermined direction from the projection area AR1, provided that the desired liquid immersion area AR2 can be formed. When the liquid LQ is supplied from a plurality of supply ports, then the amounts of the liquid LQ to be supplied from the respective supply ports may be made adjustable, and the liquid LQ may be supplied from the respective supply ports in different amounts.

In the first to sixteenth embodiments described above, the optical element LS1 of the projection optical system PL is a lens element having the refracting power. However, a plane parallel plate having no refracting power may be used as the optical element LS1.

In the first to sixteenth embodiments described above, the optical path space, which is disposed on the side of the image plane (lower surface side) of the optical element LS1 of the projection optical system PL, is filled with the liquid LQ. However, it is also possible to adopt an arrangement in which the both optical path spaces disposed on the upper surface side and the lower surface side, respectively, of the optical element LS1 of the projection optical system PL are filled with the liquid, as disclosed in International Publication No. 2004/019128.

As described above, pure water is used as the liquid LQ in the embodiment of the present invention. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL. When the purity of pure water supplied from the factory or the like is low, it is also allowable that the exposure apparatus is provided with an ultra pure water-producing unit.

It is approved that the refractive index n of pure water (water) with respect to the exposure light beam EL having a wavelength of about 193 nm is approximately 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

When the liquid immersion method is used as described above, the numerical aperture NA of the projection optical system is 0.9 to 1.3 in some cases. When the numerical aperture NA of the projection optical system is large as described above, it is desirable to use the polarized illumination, because the image formation performance is deteriorated due to the polarization effect in some cases with the random polarized light which has been hitherto used as the exposure light beam. In this case, it is appropriate that the linear polarized illumination, which is adjusted to the longitudinal direction of the line pattern of the line-and-space pattern of the mask (reticle), is effected so that the diffracted light of the S-polarized light component (TE-polarized light component), i.e., the component in the polarization direction along with the longitudinal direction of the line pattern is dominantly allowed to outgo from the pattern of the mask (reticle). When the space between the projection optical system PL and the resist coated on the surface of the substrate P is filled with the liquid, the diffracted light of the S-polarized light component (TE-polarized light component), which contributes to the improvement in the contrast, has the high transmittance on the resist surface, as compared with the case in which the space between the projection optical system PL and the resist coated on the surface of the substrate P is filled with the air (gas). Therefore, it is possible to obtain the high image formation performance even when the numerical aperture NA of the projection optical system exceeds 1.0. Further, it is more effective to appropriately combine, for example, the phase shift mask and the oblique incidence illumination method (especially the dipole illumination method) adjusted to the longitudinal direction of the line pattern as disclosed in Japanese Patent Application Laid-open No. 6-188169. In particular, the combination of the linear polarized illumination method and the dipole illumination method is effective when the periodic direction of the line-and-space pattern is restricted to one predetermined direction and when the hole pattern is clustered in one predetermined direction. For example, when a phase shift mask of the half tone type having a transmittance of 6% (pattern having a half pitch of about 45 nm) is illuminated by using the linear polarized illumination method and the dipole illumination method in combination, the depth of focus (DOF) can be increased by about 150 nm as compared with the use of the random polarized light provided that the illumination σ, which is prescribed by the circumscribed circle of the two light fluxes for forming the dipole on the pupil plane of the illumination system, is 0.95, the radius of each of the light fluxes at the pupil plane is 0.125σ, and the numerical aperture of the projection optical system PL is NA=1.2.

For example, when the ArF excimer laser is used as the exposure light beam, and the substrate P is exposed with a fine line-and-space pattern (for example, line-and-space of about 25 to 50 nm) by using the projection optical system PL having a reduction magnification of about ¼, then the mask M functions as a polarizing plate due to the Wave guide effect depending on the structure of the mask M (for example, the pattern fineness and the thickness of chromium), and the diffracted light of the S-polarized light component (TE-polarized light component) is radiated from the mask M in an amount larger than that of the diffracted light of the P-polarized light component (TM-polarized light component) which lowers the contrast. In this case, it is desirable to use the linear polarized illumination as described above. However, even when the mask M is illuminated with the random polarized light, it is possible to obtain the high resolution performance even when the numerical aperture NA of the projection optical system PL is large, for example, 0.9 to 1.3.

When the substrate P is exposed with an extremely fine line-and-space pattern on the mask M, there is such a possibility that the P-polarized light component (TM-polarized light component) is larger than the S-polarized light component (TE-polarized light component) due to the Wire Grid effect. However, for example, when the ArF excimer laser is used as the exposure light beam, and the substrate P is exposed with a line-and-space pattern larger than 25 nm by using the projection optical system PL having a reduction magnification of about ¼, then the diffracted light of the S-polarized light component (TE-polarized light component) is radiated from the mask M in an amount larger than that of the diffracted light of the P-polarized light component (TM-polarized light component). Therefore, it is possible to obtain the high resolution performance even when the numerical aperture NA of the projection optical system PL is large, for example, 0.9 to 1.3.

Further, it is also effective to use the combination of the oblique incidence illumination method and the polarized illumination method in which the linear polarization is effected in the tangential (circumferential) direction of the circle having the center of the optical axis as disclosed in Japanese Patent Application Laid-open No. 6-53120, without being limited to only the linear polarized illumination (S-polarized illumination) adjusted to the longitudinal direction of the line pattern of the mask (reticle). In particular, when the pattern of the mask (reticle) includes not only the line pattern extending in one predetermined direction, but the pattern also includes the line patterns extending in a plurality of different directions in a mixed manner (line-and-space patterns having different periodic directions are present in a mixed manner), then it is possible to obtain the high image formation performance even when the numerical aperture NA of the projection optical system is large, by using, in combination, the zonal illumination method and the polarized illumination method in which the light is linearly polarized in the tangential direction of the circle having the center of the optical axis, as disclosed in Japanese Patent Application Laid-open No. 6-53120 as well. For example, when a phase shift mask of the half tone type having a transmittance of 6% (pattern having a half pitch of about 63 nm) is illuminated by using, in combination, the zonal illumination method (zonal ratio: 3/4) and the polarized illumination method in which the light is linearly polarized in the tangential direction of the circle having the center of the optical axis, the depth of focus (DOF) can be increased by about 250 nm as compared with the use of the random polarized light provided that the illumination σ is 0.95 and the numerical aperture of the projection optical system PL is NA=1.00. In the case of a pattern having a half pitch of about 55 nm and a numerical aperture of the projection optical system NA=1.2, the depth of focus can be increased by about 100 nm.

In the embodiment of the present invention, the optical element LS1 is attached to the end portion of the projection optical system PL. Such a lens makes it possible to adjust the optical characteristics of the projection optical system PL, for example, the aberration (for example, spherical aberration and comatic aberration). The optical element, which is attached to the end portion of the projection optical system PL, may be an optical plate which is usable to adjust the optical characteristics of the projection optical system PL.

Alternatively, the optical element may be a plane parallel plate or parallel flat plate through which the exposure light beam EL is transmissive.

When the pressure, which is generated by the flow of the liquid LQ, is large between the substrate P and the optical element disposed at the end portion of the projection optical system PL, it is also allowable that the optical element is tightly fixed so that the optical element is not moved by the pressure, instead of allowing the optical element to be exchangeable.

In the embodiment of the present invention, the space between the projection optical system PL and the surface of the substrate P is filled with the liquid LQ. However, for example, it is also allowable that the space is filled with the liquid LQ in such a state that a cover glass formed of a parallel flat plate is attached to the surface of the substrate P.

In the case of the projection optical system PL concerning each of the embodiments explained with reference to FIGS. 1 to 32, the optical path space, which is on the side of the image plane of the optical element arranged at the end portion, is filled with the liquid. However, it is also possible to adopt such a projection optical system that the optical path space, which is on the side of the mask M in relation to the optical element LS1, is also filled with the liquid, as disclosed in International Publication No. 2004/019128.

The liquid LQ is water in the embodiment of the present invention. However, the liquid LQ may be any liquid other than water. For example, when the light source of the exposure light beam EL is the $F_2$ laser, the $F_2$ laser beam is not transmitted through water. Therefore, those preferably usable as the liquid LQ may include, for example, fluorine-based fluids such as fluorine-based oil and perfluoropolyether (PFPE) through which the $F_2$ laser beam is transmissive. In this case, the portion, which makes contact with the liquid LQ, is subjected to a liquid-attracting treatment by forming, for example, a thin film with a substance having a molecular structure containing fluorine having small polarity. Alternatively, other than the above, it is also possible to use, as the liquid LQ, those (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid LQ to be used. It is also possible to use various fluids having desired refractive indexes including, for example, supercritical fluids and gases having high refractive indexes, in place of pure water as the liquid LQ.

In the explanation with reference to FIGS. 1, 4, 15, 16, 18, 21, 22, and 24, the space between the substrate P and the lower surface T1 of the optical element LS1 is filled with the liquid LQ in the state in which the substrate P is opposed to the lower surface T1 of the optical element LS1. However, it goes without saying that any space between the projection optical system PL and another member can be filled with the liquid as well, when the projection optical system PL is opposite to the another member (for example, the upper surface 91 of the substrate stage).

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic silica glass, silicon wafer) for the mask or the reticle to be used for the exposure apparatus. In the embodiment described above, the light-transmissive type mask (reticle) is used, in which the predetermined light-shielding pattern (or phase pattern or dimming or light-reducing pattern) is formed on the light-transmissive substrate. However, in place of such a reticle, as disclosed, for example, in U.S. Pat. No. 6,778,257, it is also allowable to use an electronic mask on which a transmissive pattern, a reflective pattern, or a light-emitting pattern is formed on the basis of the electronic data of the pattern to be subjected to the exposure. The present invention is also applicable to the exposure apparatus (lithography system) in which a line-and-space pattern is formed on a wafer W by forming interference fringes on the wafer W as disclosed in International Publication No. 2001/035168.

As for the exposure apparatus EX, the present invention is also applicable to the scanning type exposure apparatus (scanning stepper) based on the step-and-scan system for performing the scanning exposure with the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P.

As for the exposure apparatus EX, the present invention is also applicable to the exposure apparatus based on the system in which the full field exposure is performed on the substrate P by using a projection optical system (for example, the dioptric type projection optical system having a reduction magnification of ⅛ and including no catoptric element) with a reduction image of a first pattern in a state in which the first pattern and the substrate P are allowed to substantially stand still. In this case, the present invention is also applicable to the full field exposure apparatus based on the stitch system in which the full field exposure is further performed thereafter on the substrate P by partially overlaying a reduction image of a second pattern with respect to the first pattern by using the projection optical system in a state in which the second pattern and the substrate P are allowed to substantially stand still. As for the exposure apparatus based on the stitch system, the present invention is also applicable to the exposure apparatus based on the step-and-stitch system in which at least two patterns are partially overlaid and transferred on the substrate P, and the substrate P is successively moved.

The present invention is also applicable to the twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

The present invention is also applicable to the exposure apparatus including a substrate stage which holds the substrate P and a measuring stage which is provided with various photoelectric sensors and reference members formed with reference marks, as disclosed in Japanese Patent Application Laid-open No. 11-135400.

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this case, any one of the magnet unit and the armature unit may be connected to the stage PST, MST, and the other of the magnet unit and the armature unit may be provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handing the reaction force is described in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handing the reaction force is described in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 33:
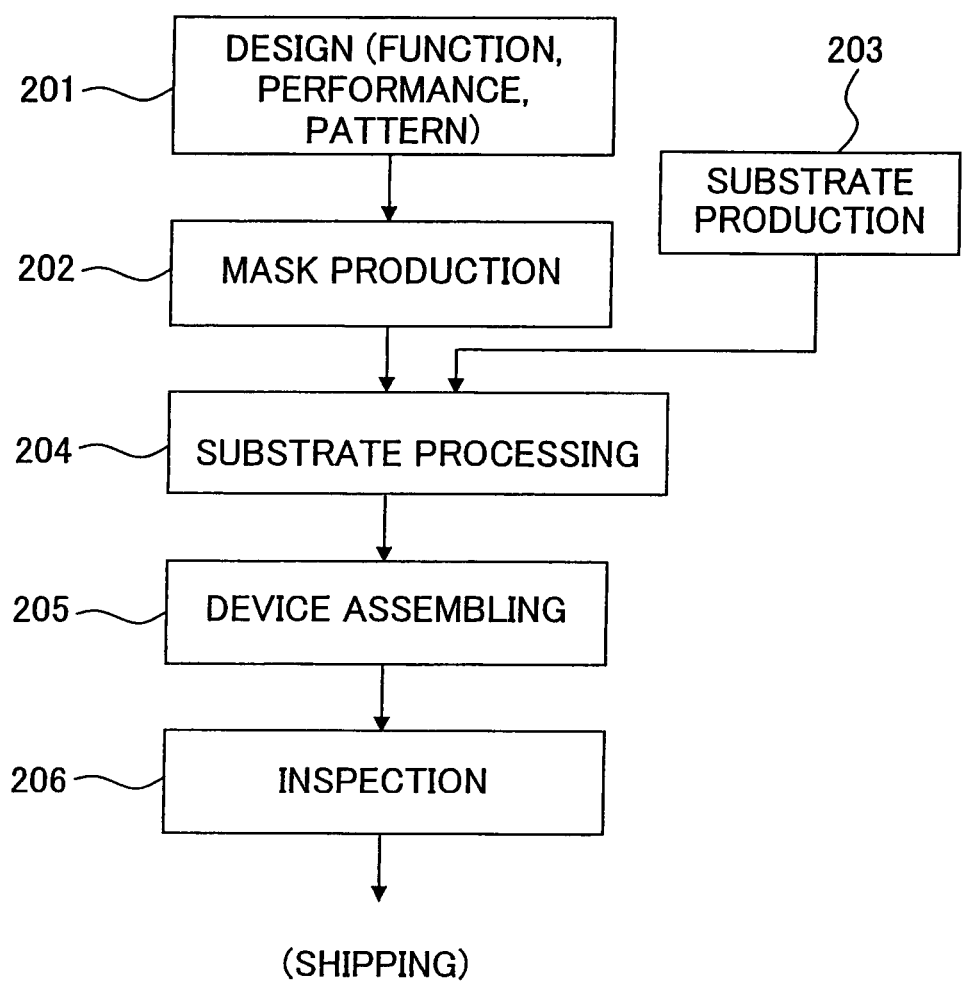
FIG. 33 shows a flow chart illustrating exemplary steps of producing a semiconductor device.

As shown in FIG. 33, a microdevice such as a semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

Industrial Applicability

According to the present invention, the liquid immersion area of the liquid can be maintained in the desired state even when the scanning velocity is increased to be high. Therefore, the exposure process can be performed satisfactorily and efficiently.

The invention claimed is:

1. A lithographic projection apparatus arranged to project a pattern from a patterning device onto a substrate through a liquid confined to a space, the space being smaller in plan than the substrate, the apparatus comprising:
   a projection system having an optical element, the optical element having a lower surface via which a patterned radiation beam is projected, the lower surface extending in a direction substantially perpendicular to an optical axis of the projection system, and the optical element having an outer surface extending upwardly from the lower surface;
   a liquid confinement member configured to confine the liquid within the space under the projection system, the liquid confinement member surrounding an end portion of the projection system and a gap being formed between the outer surface of the optical element and the liquid confinement member;
   a first support member configured to support the liquid confinement member;
   a second support member configured to support the projection system; and
   an anti-vibration system arranged between the first support member and the second support member, the anti-vibration system preventing vibrations from being transmitted from one of the first support member and the second support member to the other of the first support member and the second support member;
   wherein the liquid confinement member includes:
   a plate portion substantially parallel to the substrate to divide the space into two parts, the plate portion having an open aperture to allow transmission of the pattern onto the substrate, the substrate being moved below the plate portion; and
   a liquid extraction port which extracts liquid from a part of the space adjacent the substrate, the liquid extraction port being arranged to surround the open aperture and being configured to extract the liquid on the substrate from above the substrate positioned opposite to the liquid extraction port.

2. The apparatus according to claim 1,
wherein the liquid confinement member has a liquid supply port which supplies liquid to a part of the space adjacent the projection system, the liquid supply port being configured to supply the liquid onto the substrate from above the substrate positioned opposite to the liquid supply port.

3. The apparatus according to claim 1, wherein an edge of the aperture in the plate portion is beveled.

4. The apparatus according to claim 1, wherein:
the liquid confinement member has a liquid supply port,
the two parts includes a first portion between the projection system and the liquid confinement member and a second portion between the liquid confinement member and the substrate; and
the liquid supply port supplies the liquid to the second portion.

5. A lithographic apparatus, comprising:
a substrate table on which a substrate is held;
a projection system having an optical element, the optical element having a lower surface via which a patterned radiation beam is projected, the optical element having an outer surface extending upwardly from the lower surface, the optical element having a flange portion above the lower surface and the optical element being supported by a holding device using the flange portion;
a liquid confinement member configured to confine liquid within a space under the projection system;
a first support member configured to support the liquid confinement member;
a second support member configured to support the projection system; and
an anti-vibration system arranged between the first support member and the second support member, the anti-vibration system preventing vibrations from being transmitted from one of the first support member and the second support member to the other of the first support member and the second support member,
wherein the liquid confinement member includes:
a plate portion substantially parallel to the substrate to divide the space into two parts, the plate portion having an open aperture to allow transmission of the pattern onto the substrate, the plate portion being disposed below the lower surface of the optical element of the projection system;
a liquid supply port which supplies liquid to a part of the space adjacent the projection system; and
a liquid extraction port which extracts liquid from a part of the space, the liquid extraction port being arranged to surround the open aperture and being configured to extract the liquid on the substrate from above the substrate positioned opposite to the liquid extraction port.

6. The apparatus according to claim 5, wherein an edge of the aperture is beveled.

7. The apparatus according to claim 5, wherein the space is smaller in plan than the substrate.

8. The apparatus according to claim 5, wherein the liquid supply port supplies liquid to a part of the space between the liquid confinement member and the substrate.

9. The apparatus according to claim 5, wherein
the two parts includes a first portion between the projection system and the liquid confinement member and a second portion between the liquid confinement member and the substrate; and
the liquid supply port supplies the liquid to the first portion.

10. The apparatus according to claim 5, wherein
the lower surface of the optical element extends in a direction substantially perpendicular to an optical axis of the projection system.

11. A device manufacturing method, comprising:
supplying a liquid to a space between a liquid confinement member and a projection system, the projection system including an optical element having a lower surface and an outer surface extending upwardly from the lower surface, the liquid confinement member surrounding an end portion of the projection system and a gap being formed between the outer surface of the optical element and the liquid confinement member, and the space being smaller in plan than a substrate and divided into two parts by a plate portion substantially parallel to the substrate, the plate portion having an open aperture;
extracting the liquid from a part of the space adjacent the substrate through a liquid extraction port of the liquid confinement member, the liquid extraction port being arranged to surround the open aperture and being configured to extract the liquid on the substrate from above the substrate positioned opposite to the liquid extraction port; and
projecting a patterned beam of radiation from a projection system via the lower surface of the optical element through the liquid and through the open aperture onto the substrate which is positioned below the plate portion. while preventing vibrations from being transmitted between a first support member configured to support the liquid confinement member and a second support member configured to support the projection system using an anti-vibration system.

12. The method according to claim 11, wherein the liquid is supplied to a part of the space between the plate portion and the substrate through the open aperture of the plate portion.

13. The method according to claim 11, wherein the liquid is supplied from a supply port to a part of the space between the liquid confinement member and the substrate which is positioned opposite to the supply port.

* * * * *